United States Patent [19]

Schwartz et al.

[11] Patent Number: 5,717,394
[45] Date of Patent: Feb. 10, 1998

[54] METHOD AND APPARATUS FOR ENCODING AND DECODING DATA

[75] Inventors: Edward L. Schwartz, Sunnyvale; Michael J. Gormish, Los Altos, both of Calif.; James D. Allen, Chainat, Thailand; Martin Boliek, San Francisco, Calif.

[73] Assignees: Ricoh Company Ltd., Tokyo, Japan; Ricoh Corporation, Menlo Park, Calif.

[21] Appl. No.: 768,237

[22] Filed: Dec. 17, 1996

Related U.S. Application Data

[63] Continuation of Ser. No. 316,116, Sep. 30, 1994, abandoned, which is a continuation-in-part of Ser. No. 172,646, Dec. 23, 1993, Pat. No. 5,583,500, which is a continuation-in-part of Ser. No. 16,035, Feb. 10, 1993, Pat. No. 5,381,145.

[51] Int. Cl.$^6$ ................................................ H03M 7/30
[52] U.S. Cl. ......................................... 341/51; 341/107
[58] Field of Search ................................. 341/51, 63, 65, 341/67, 60, 107

[56] References Cited

U.S. PATENT DOCUMENTS

| | | | |
|---|---|---|---|
| 4,325,085 | 4/1982 | Gooch | 358/261 |
| 4,494,108 | 1/1985 | Langdon, Jr. et al. | 341/51 |
| 4,929,946 | 5/1990 | O'Brien et al. | 341/87 |
| 4,973,961 | 11/1990 | Chamzas et al. | 341/51 |
| 5,014,134 | 5/1991 | Lawton et al. | 358/261.3 |
| 5,097,261 | 3/1992 | Langdon, Jr. et al. | 341/51 |
| 5,109,226 | 4/1992 | Mac Lean, Jr. et al. | 341/95 |
| 5,138,315 | 8/1992 | Le Queau et al. | 341/67 |
| 5,225,832 | 7/1993 | Wang et al. | 341/67 |
| 5,272,478 | 12/1993 | Allen | 341/107 |
| 5,276,525 | 1/1994 | Gharavi | 358/261.1 |
| 5,302,949 | 4/1994 | Yoshinari et al. | 341/67 |
| 5,313,203 | 5/1994 | Suu et al. | 341/50 |
| 5,319,457 | 6/1994 | Nakahashi et al. | 348/387 |
| 5,357,250 | 10/1994 | Healey et al. | 341/107 |

FOREIGN PATENT DOCUMENTS

| | | |
|---|---|---|
| 2269070 | 1/1994 | United Kingdom. |
| 2269289 | 2/1994 | United Kingdom. |
| 2285374 | 7/1995 | United Kingdom. |

OTHER PUBLICATIONS

Horng-Dar Lin, and David G. Messerschmitt "Designing a High-Throughput VLC Decoder Part II-Parallel Decoding Methods", IEEE Transactions on Circuits and Systems for Video Technology, vol. 2, No. 2, Jun. 1992, pp. 197-206.

A.N. Netravali, F.W. Mounts and K.A. Walsh, "Adaptation of Ordering Techniques for Facsimile Pictures with No Single Element Runs", The Bell System Technical Journal, vol. 58, No. 4, Apr. 1979, pp. 857-865.

H. Meyr, Hans G. Rosdolsky and Thomas S. Huang, "Optimum Run Length Codes", IEEE Transactions on Communications, vol. COM-22, No. 6, Jun. 1974, pp. 826-835.

G. G. Langdon, Jr., "An Adaptive Run-Length Coding Algorithm", IBM Technical Disclosure Bulletin, vol. 26 No. 7B, Dec. 1983, pp. 3783-3785.

(List continued on next page.)

*Primary Examiner*—Howard L. Williams
*Attorney, Agent, or Firm*—Blakely, Sokoloff, Taylor & Zafman

[57] ABSTRACT

A method and apparatus for decompressing and compressing data is described. The present invention provides an encoder for use in a compression system having a decoder for decoding information generated by the encoder. The encoder of the present invention includes a coder for producing codeword information in response to data. The encoder also includes a reorder unit that generates a coded data stream in response to the codeword information from the coder. The reorder unit comprises a run count reorder unit for arranging codewords into a decoding order and a bit pack unit to combine variable length codewords into fixed length interleaved words and to output the fixed length interleaved words in an order required by the decoder.

120 Claims, 25 Drawing Sheets

OTHER PUBLICATIONS

Glen G. Langdon, Jr. and Jorma Rissanen, "A Simple General Source Code", IEEE Transactions on Information Theory, vol. IT-28, No. 5, Sep. 1982, pp. 800–803.

Jack Venbrux, Pen–Shu Yeh and Muye N. Liu, "A VLSI Chip Set for High–Speed Lossless Data Compression", IEEE Transactions on Circuits and Systems for Video Technology, vol. 2, No. 4, Dec. 1992, pp. 381–391.

Ryoichi Ohnishi, Yutaka Ueno and Fumitaka Ono, "Efficient Coding for Binary Information Sources", Mar. 3, 1977, pp. 1–20.

Fumitaka Ono, Shigenori Kino, Masayuki Yoshida, and Tomohiro Kimura, "Bi–Level Image Coding with Melcode Comparison of Block Type Code and Arithmetic Type Code", Nov. 1989 IEEE I Global Telecommunications Conference, pp. 255–260.

Keith Williams, "International Search Report", Sep. 30, 1996, 5 pages total.

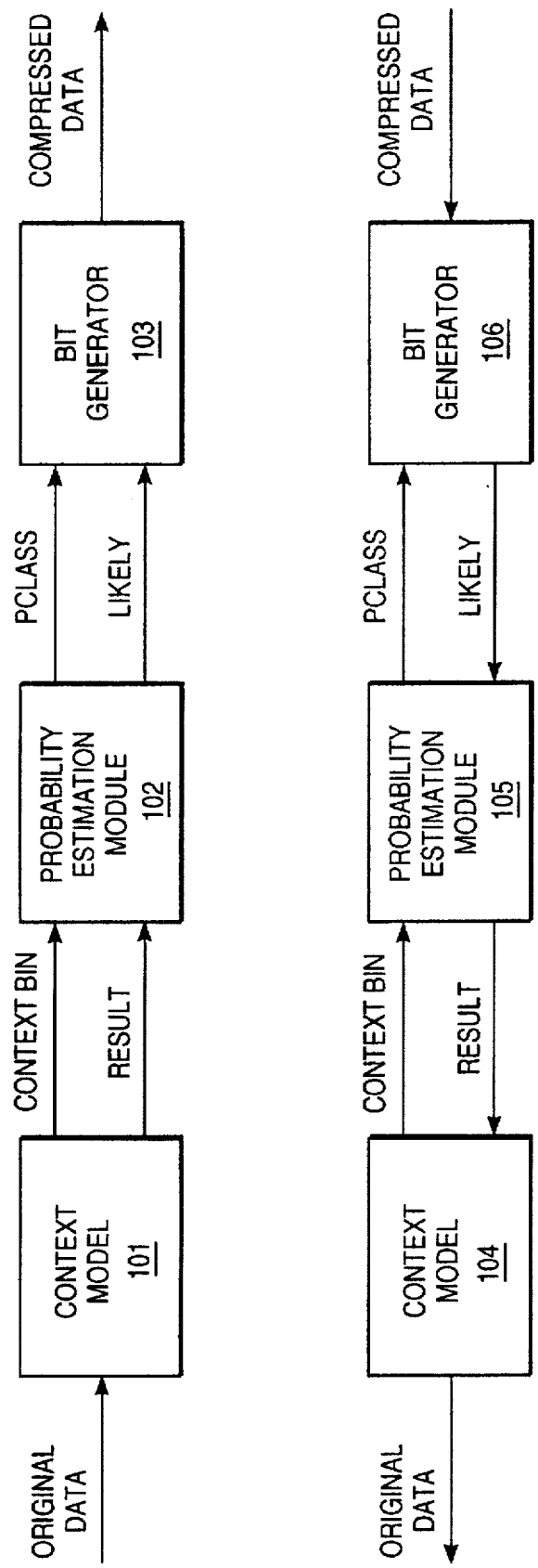
FIG_1

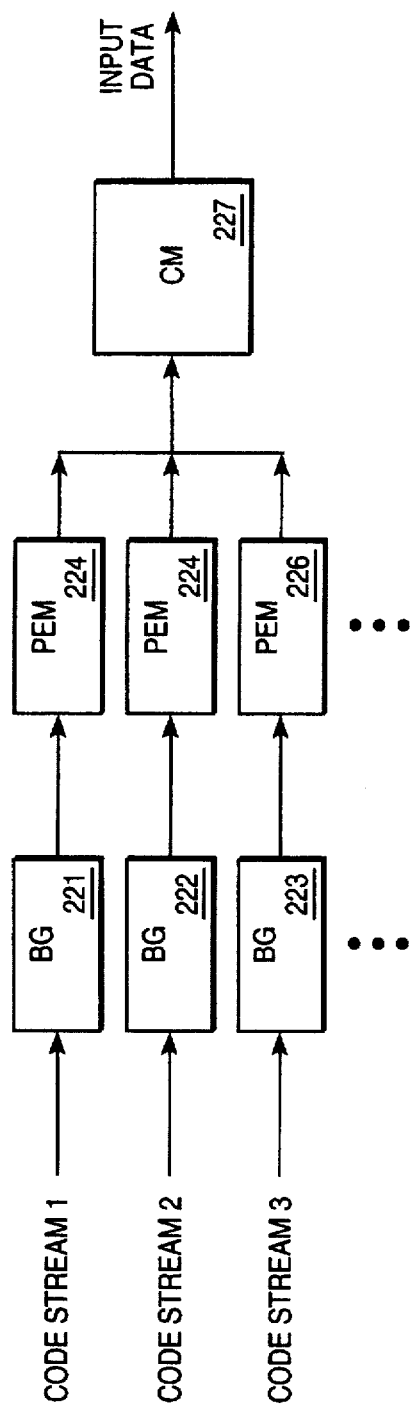
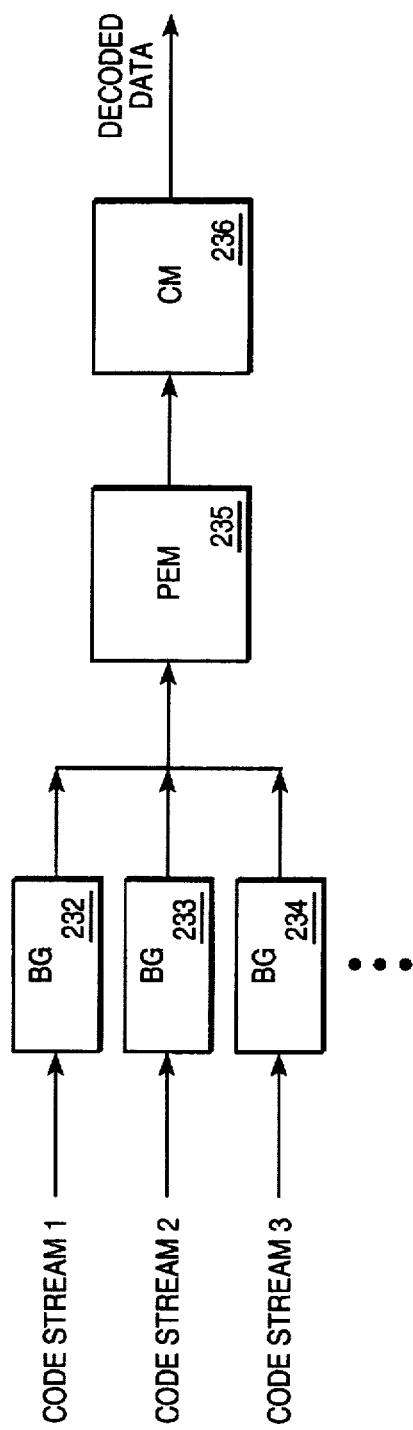

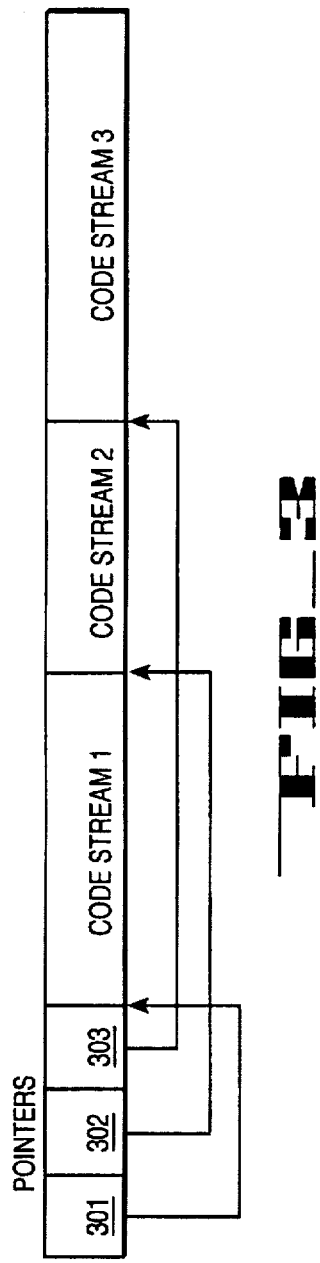
FIG_3
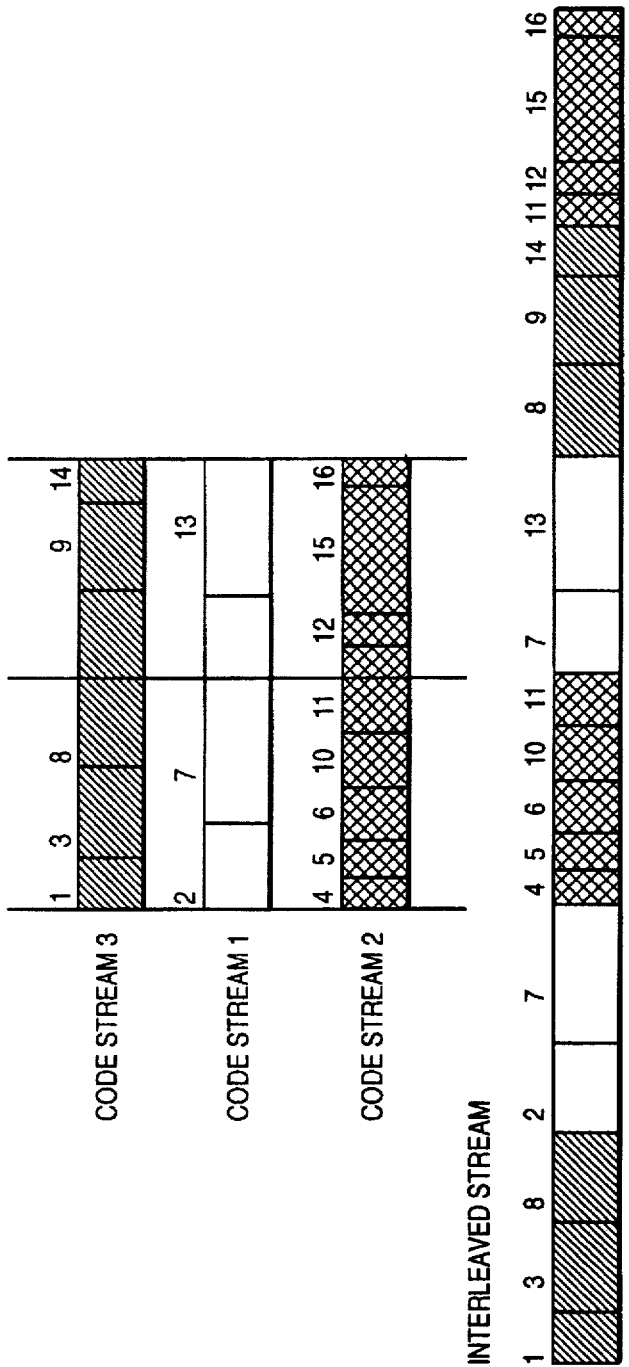
FIG_4

| STATE | CODE |
|---|---|
| −35 | R2(12) |
| −34 | R3(11) |
| −33 | R2(11) |
| −32 | R3(10) |
| −31 | R2(10) |
| −30 | R3(9) |
| −29 | R2(9) |
| −28 | R3(8) |
| −27 | R2(8) |
| −26 | R3(7) |
| −25 | R2(7) |
| −24 | R3(6) |
| −23 | R2(6) |
| −22 | R3(5) |
| −21 | R2(5) |
| −20 | R3(4) |
| −19 | R2(4) |
| −18 | R3(3) |
| −17 | R2(3) |
| −16 | R3(2) |
| −15 | R2(2) |
| −14 | R3(1) |
| −13 | R3(1) |
| −12 | R3(1) |

| STATE | CODE |
|---|---|
| −11 | R2(1) |
| −10 | R2(1) |
| −9 | R2(1) |
| −8 | R2(1) |
| −7 | R2(1) |
| −6 | R2(1) |
| −5 | R2(0) |
| −4 | R2(0) |
| −3 | R2(0) |
| −2 | R2(0) |
| −1 | R2(0) |
| −0 | R2(0) |
| 0 | R2(0) |
| 1 | R2(0) |
| 2 | R2(0) |
| 3 | R2(0) |
| 4 | R2(0) |
| 5 | R2(0) |
| 6 | R2(1) |
| 7 | R2(1) |
| 8 | R2(1) |
| 9 | R2(1) |
| 10 | R2(1) |
| 11 | R2(1) |

| STATE | CODE |
|---|---|
| 12 | R3(1) |
| 13 | R2(1) |
| 14 | R3(1) |
| 15 | R2(2) |
| 16 | R3(2) |
| 17 | R2(3) |
| 18 | R3(3) |
| 19 | R2(4) |
| 20 | R3(4) |
| 21 | R2(5) |
| 22 | R3(5) |
| 23 | R2(6) |
| 24 | R3(6) |
| 25 | R2(7) |
| 26 | R3(7) |
| 27 | R2(8) |
| 28 | R3(8) |
| 29 | R2(9) |
| 30 | R3(9) |
| 31 | R2(10) |
| 32 | R3(10) |
| 33 | R2(11) |
| 34 | R3(11) |
| 35 | R2(12) |

FIG_5

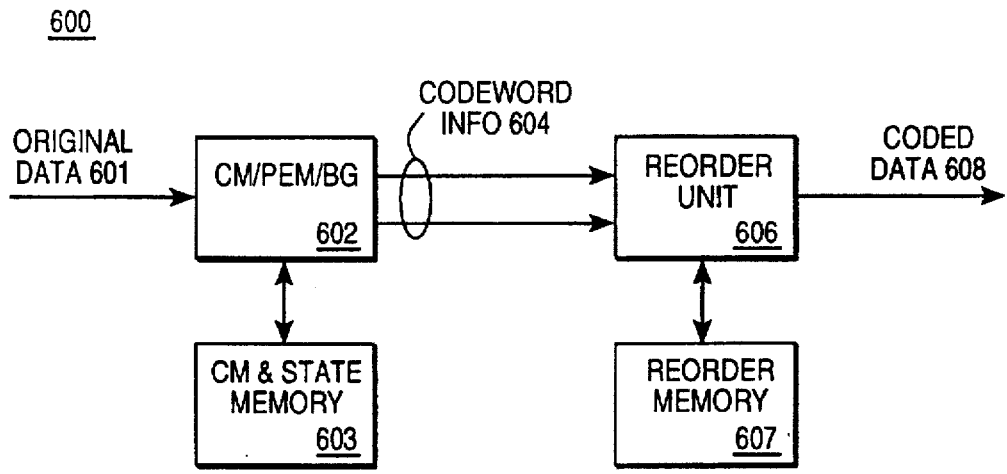
FIG_6
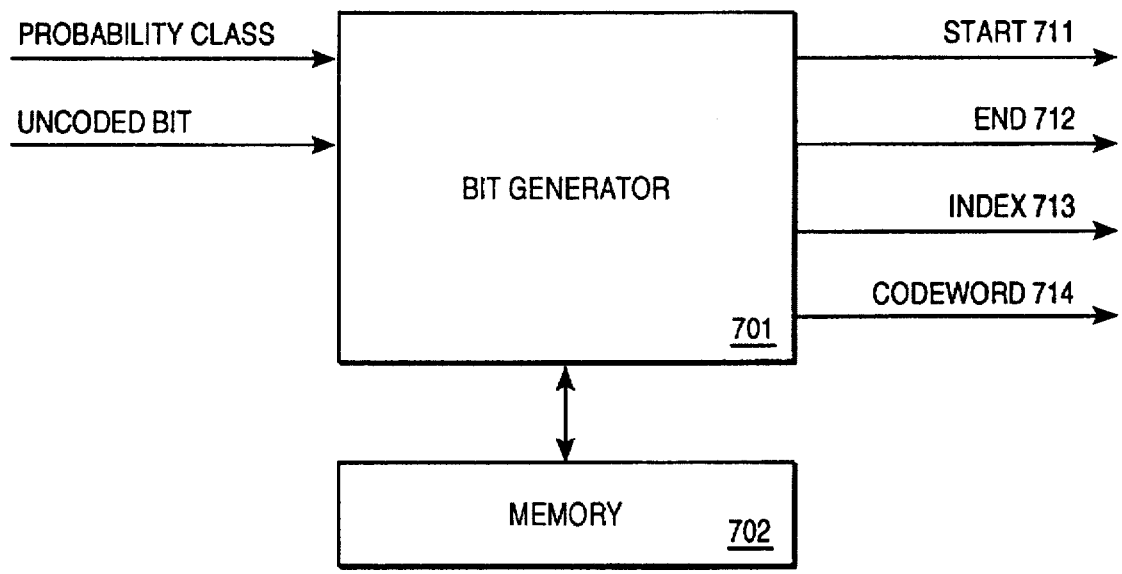
FIG_7

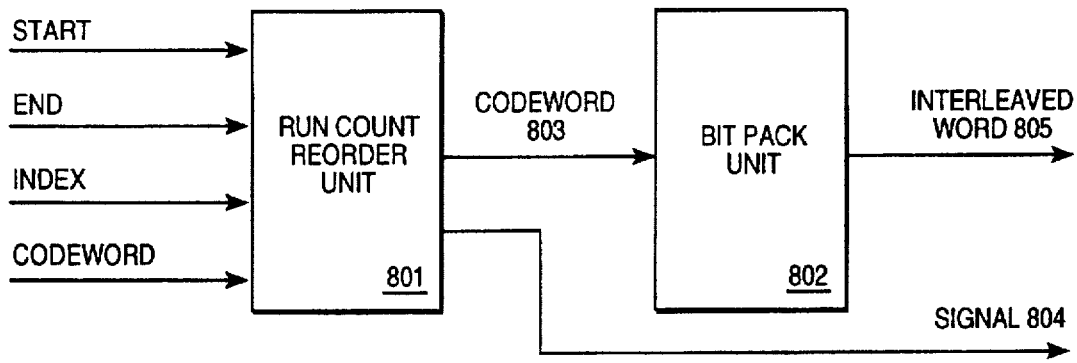
FIG_8
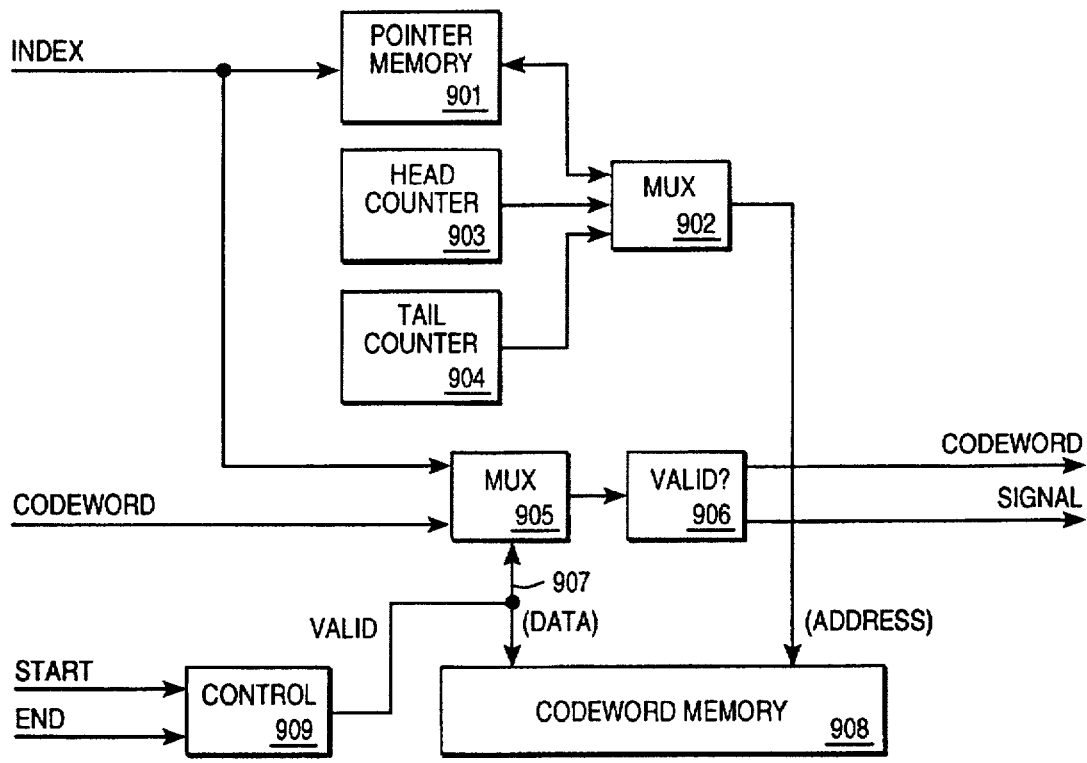
FIG_9

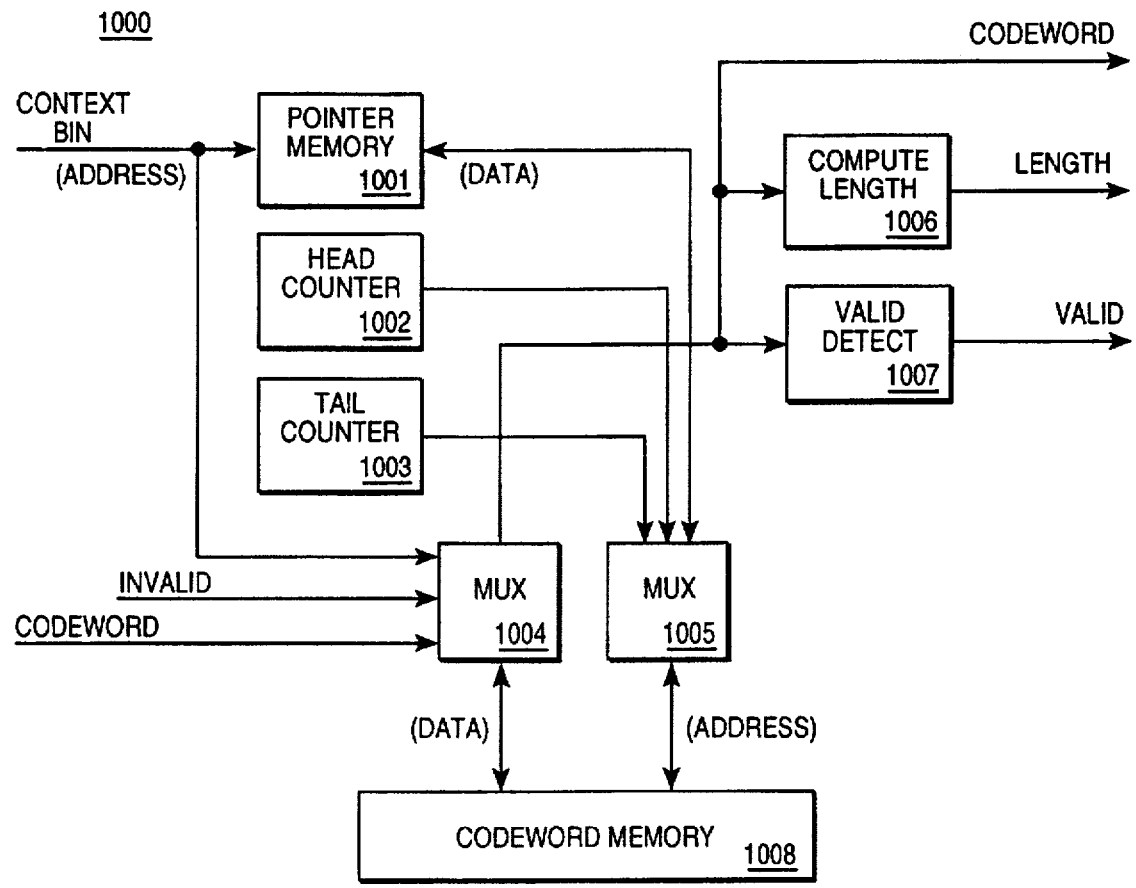
FIG_10
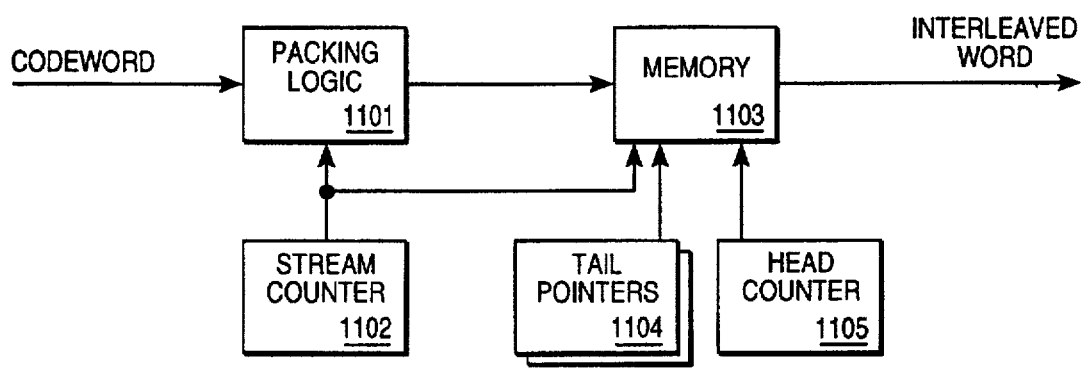
FIG_11

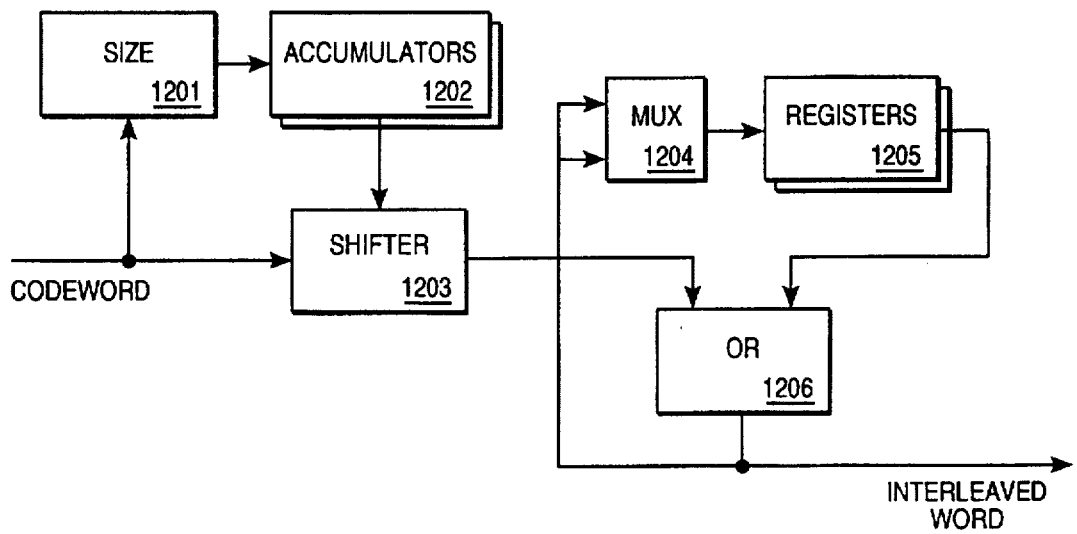
FIG_12
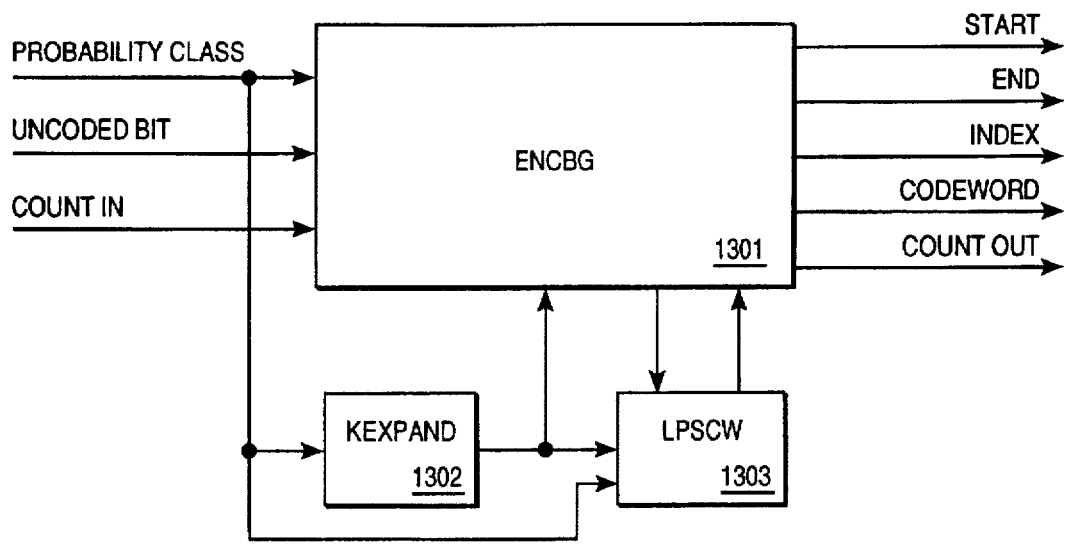
FIG_13

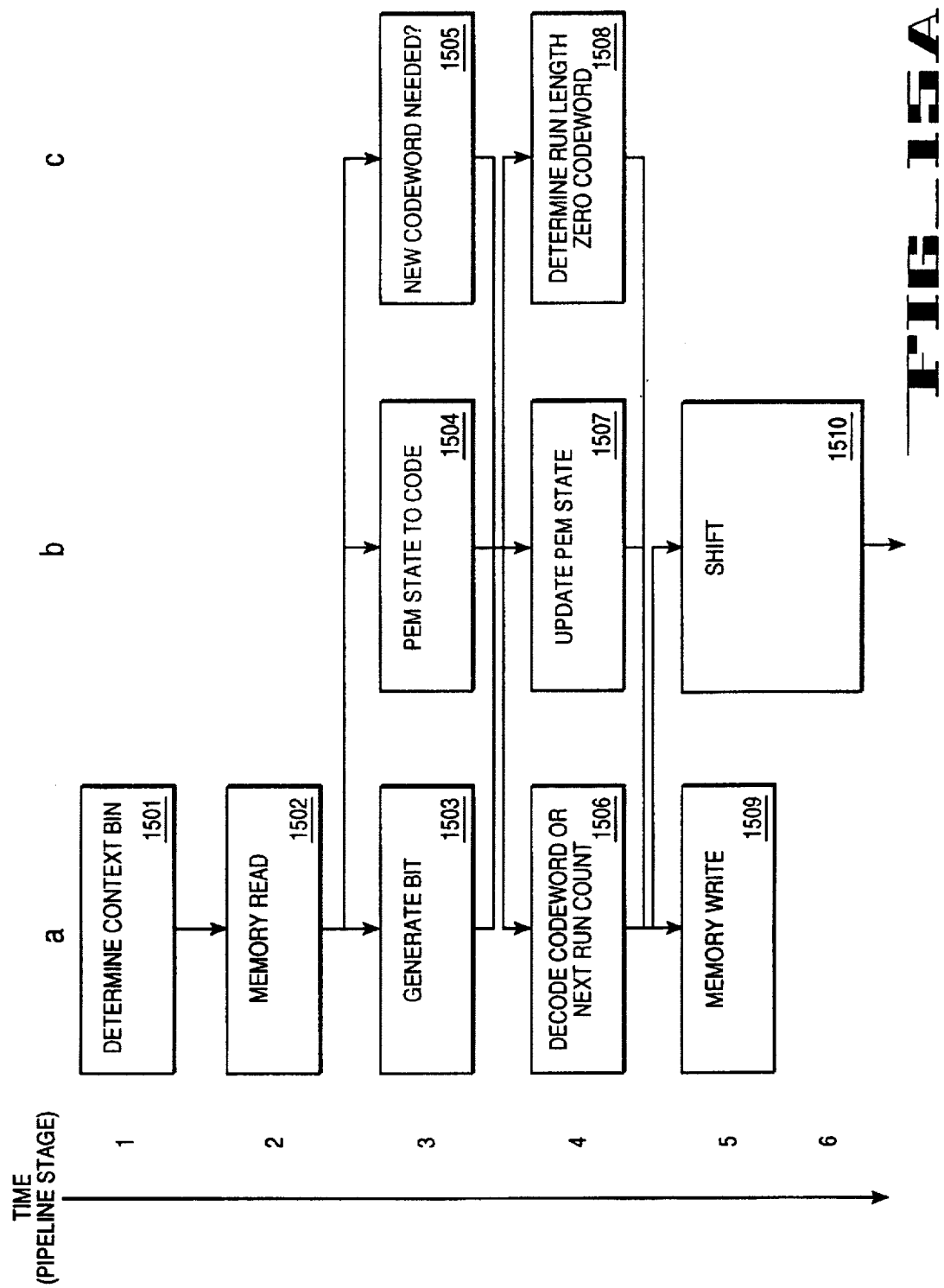
FIG_15A

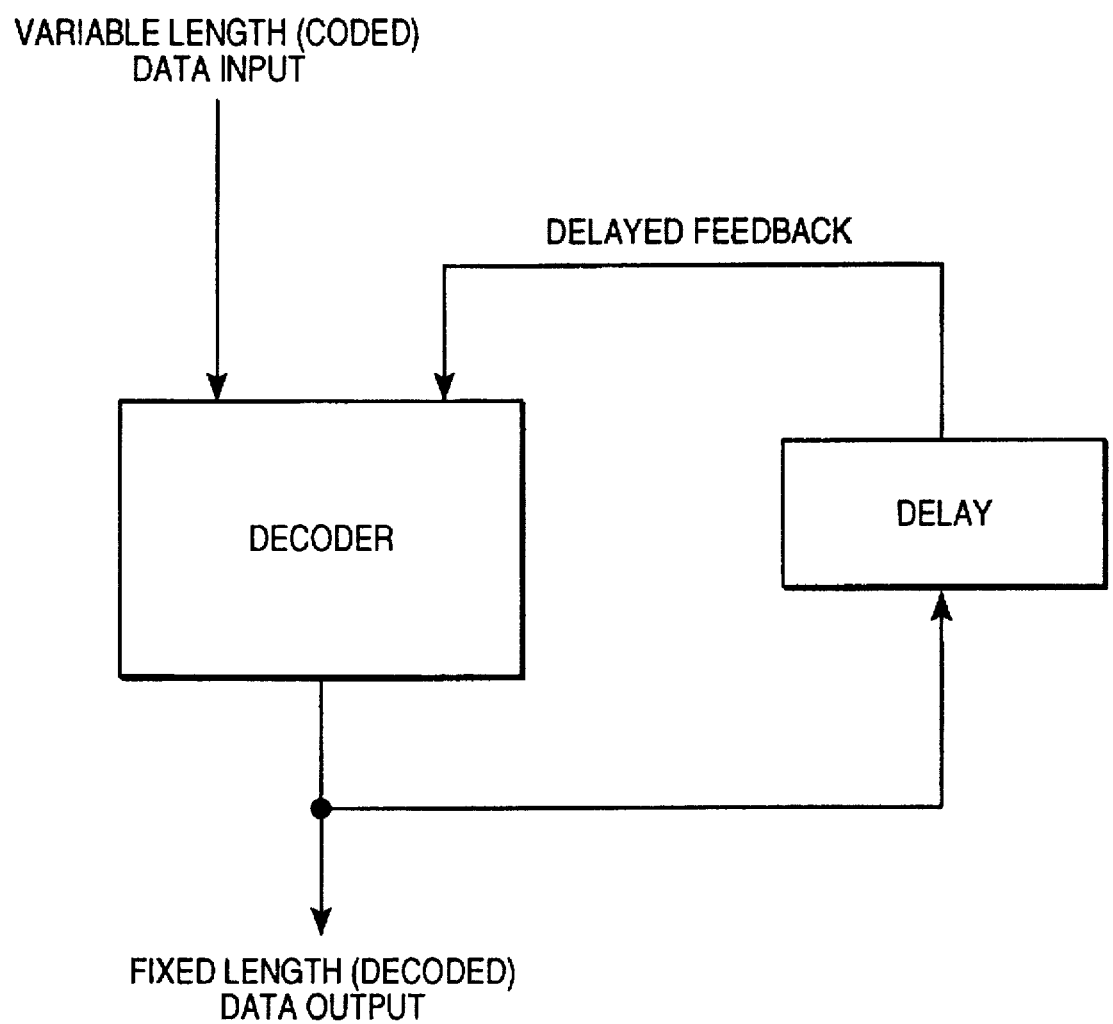
FIG_15B

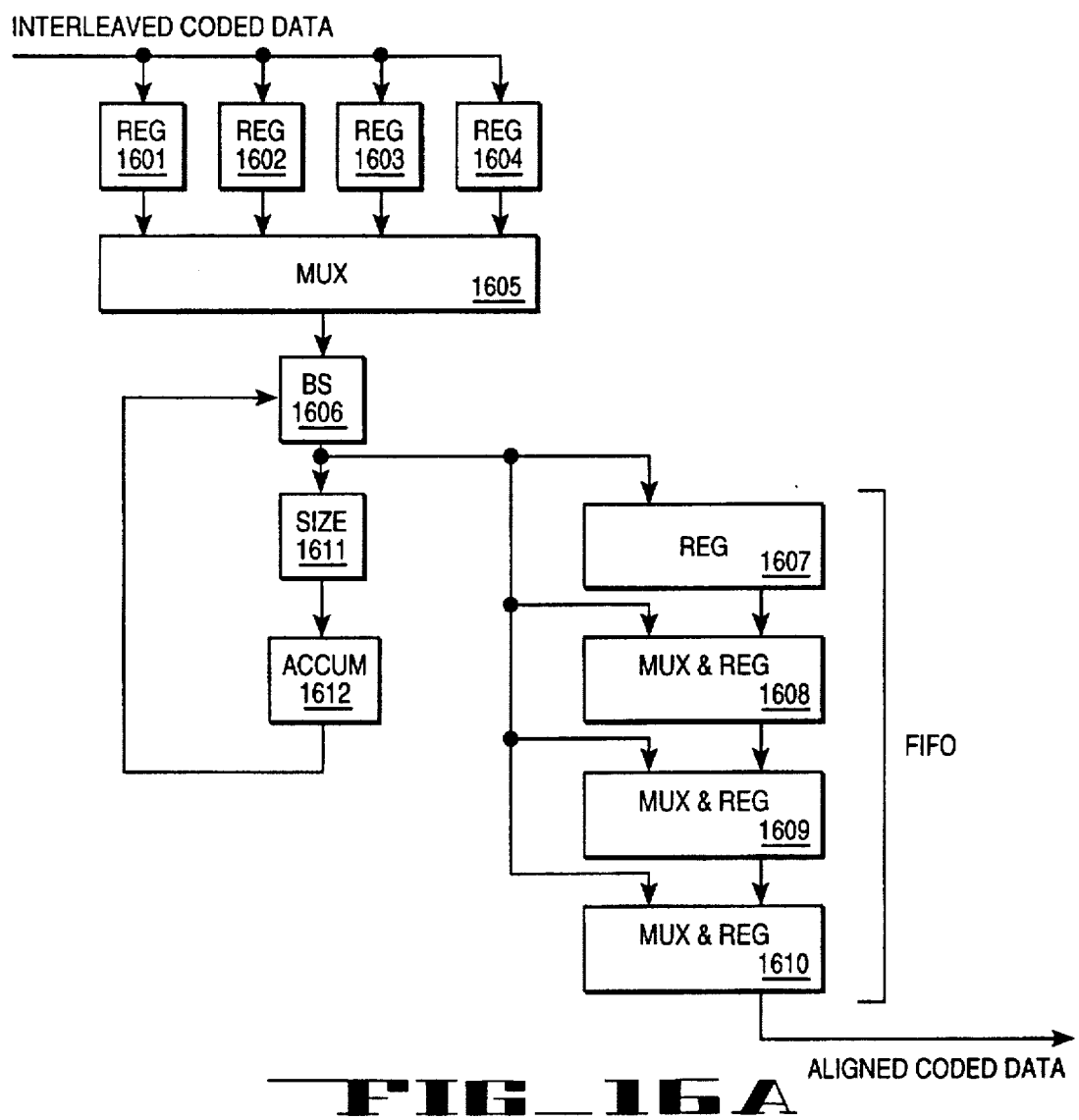
FIG_16A
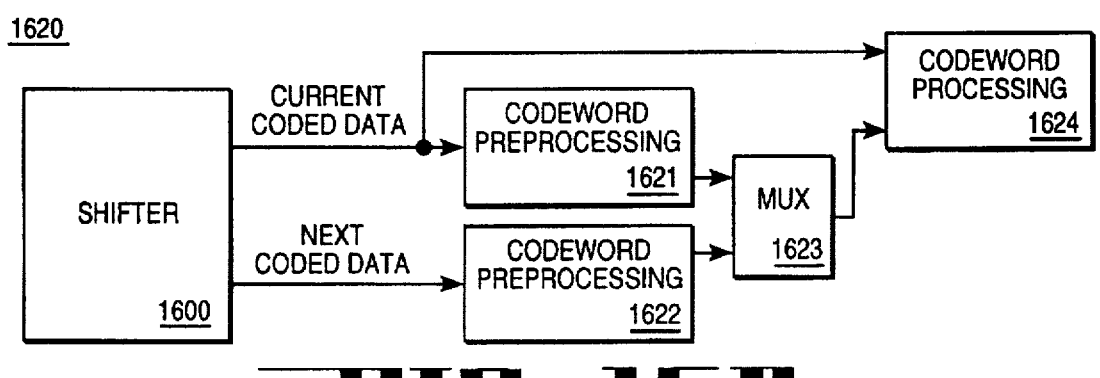
FIG_16B

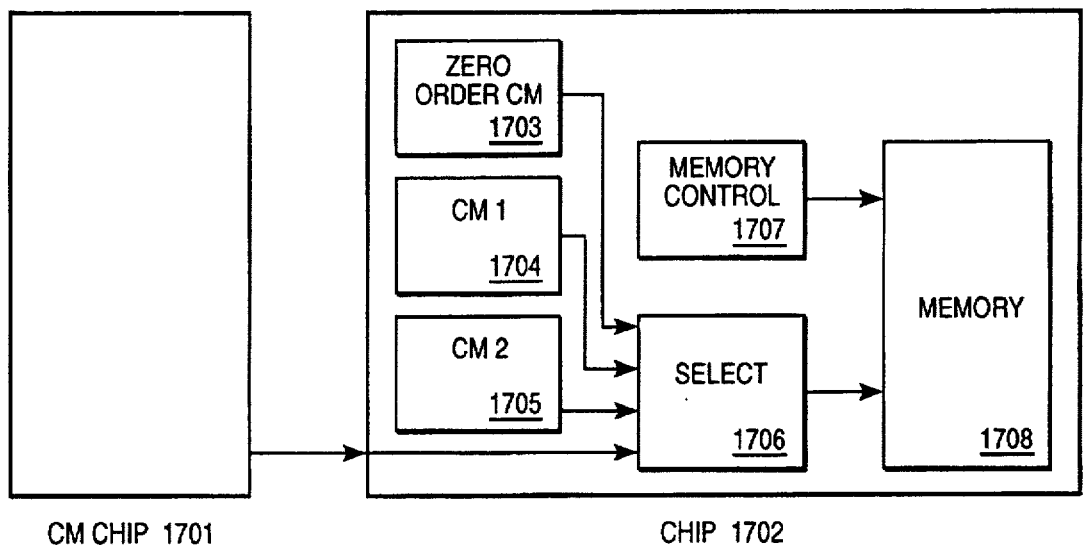
FIG_17
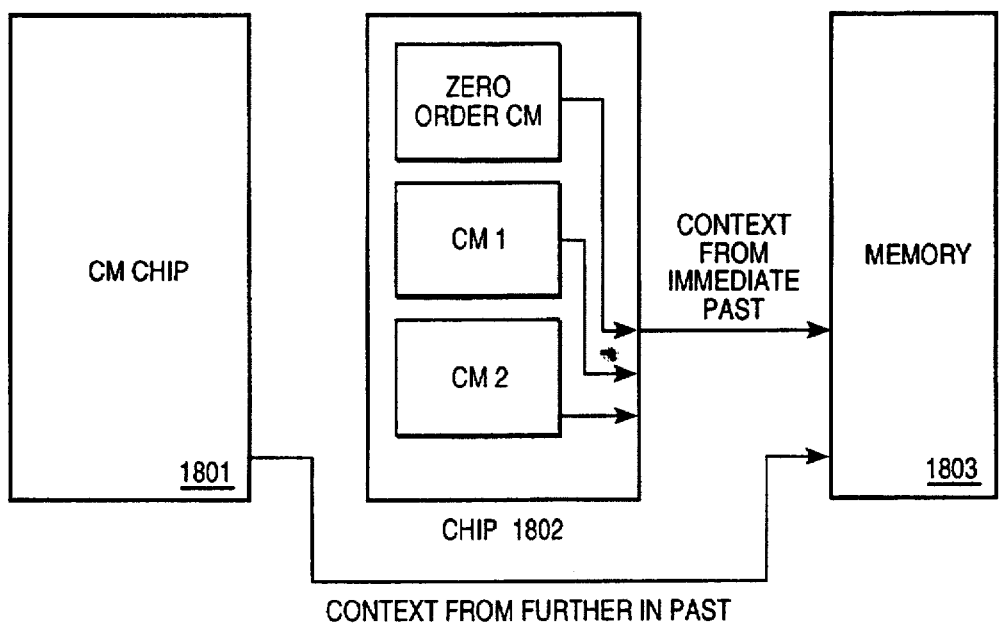
FIG_18

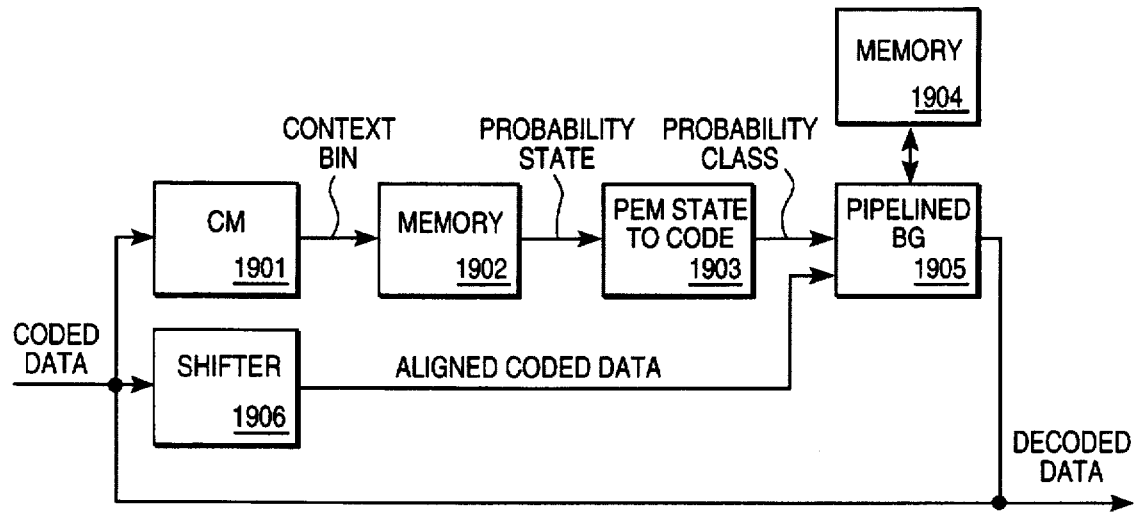
FIG_19
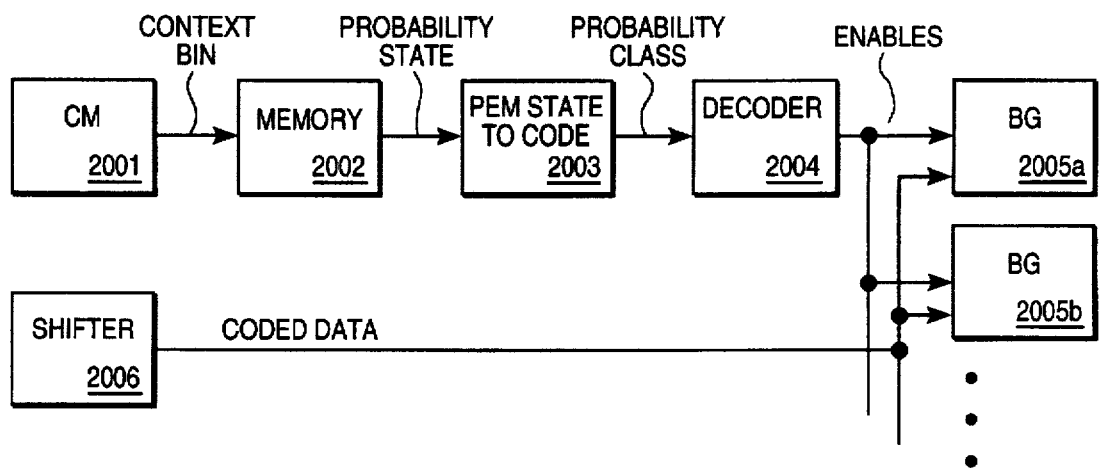
FIG_20

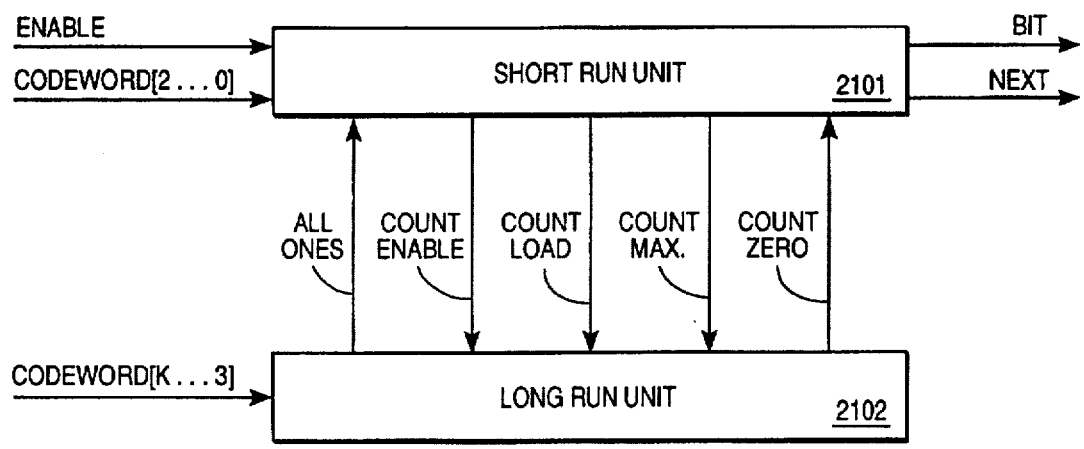
FIG_21
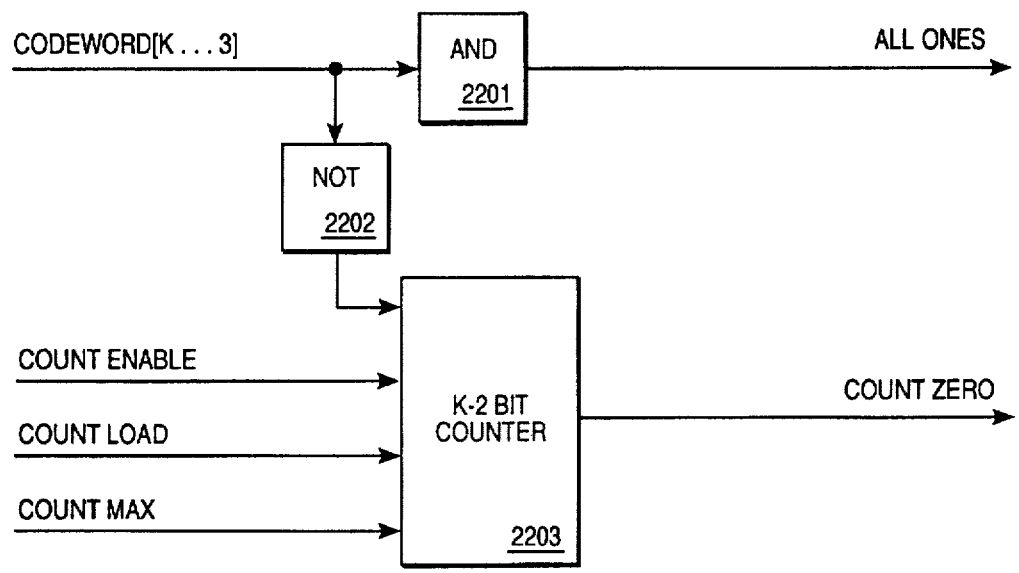
FIG_22

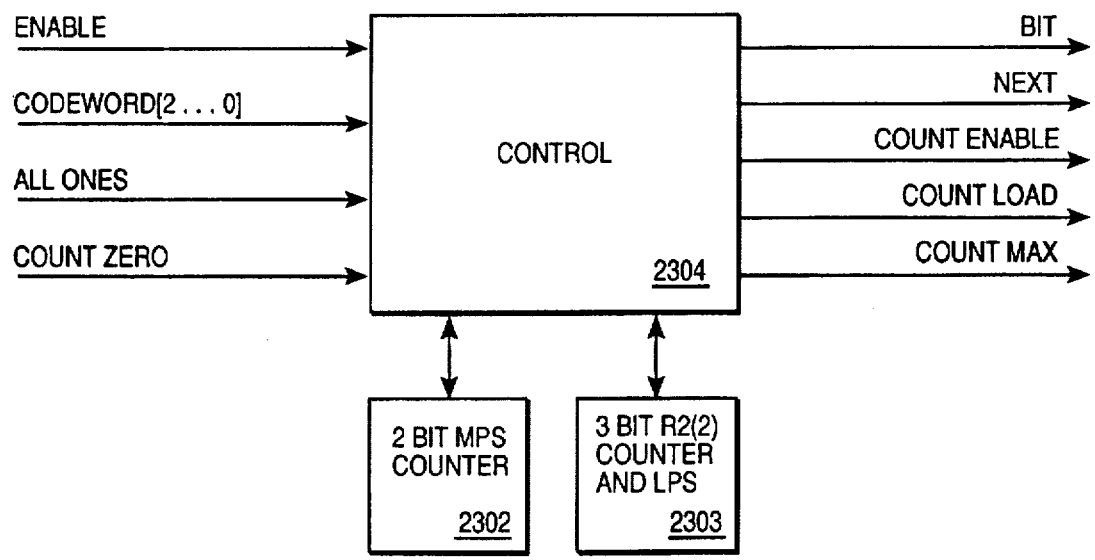
FIG_23
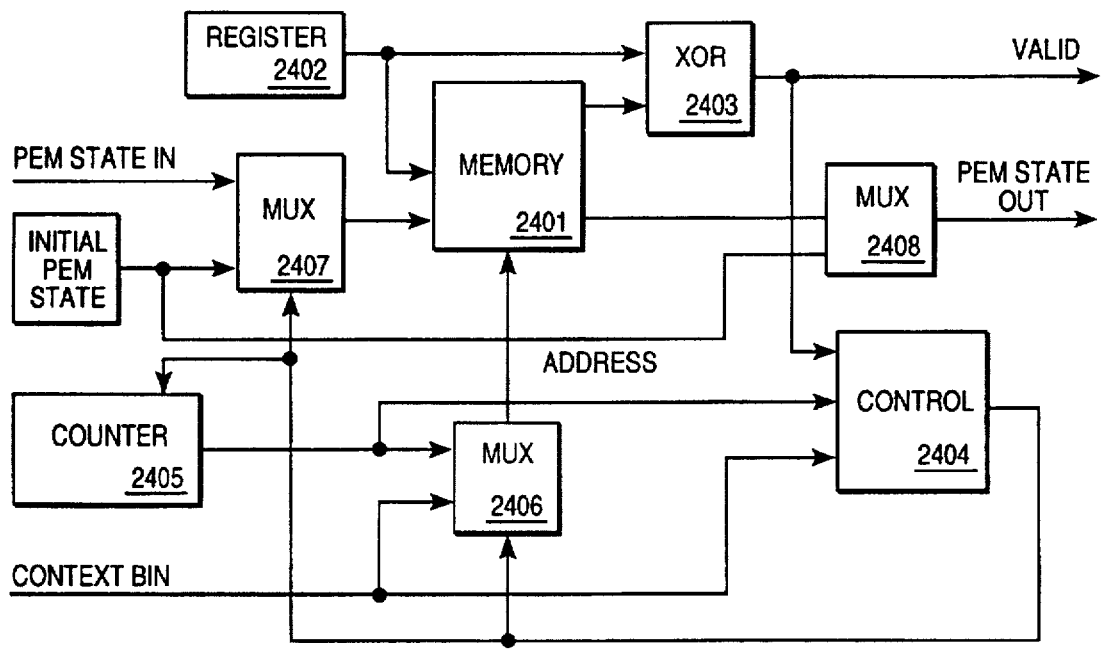
FIG_24

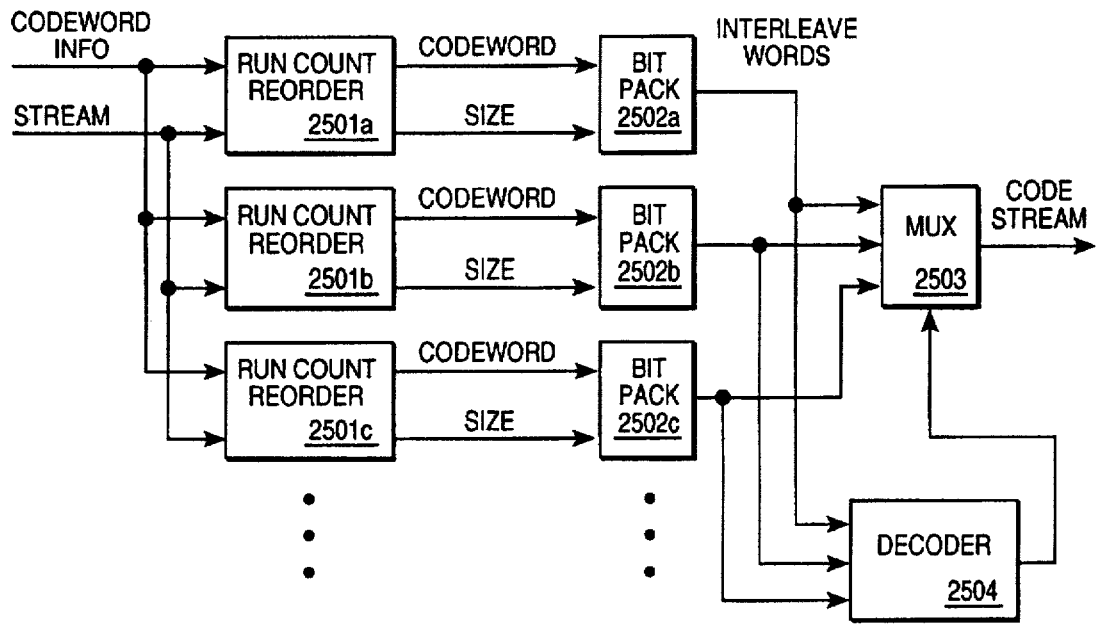
FIG_25
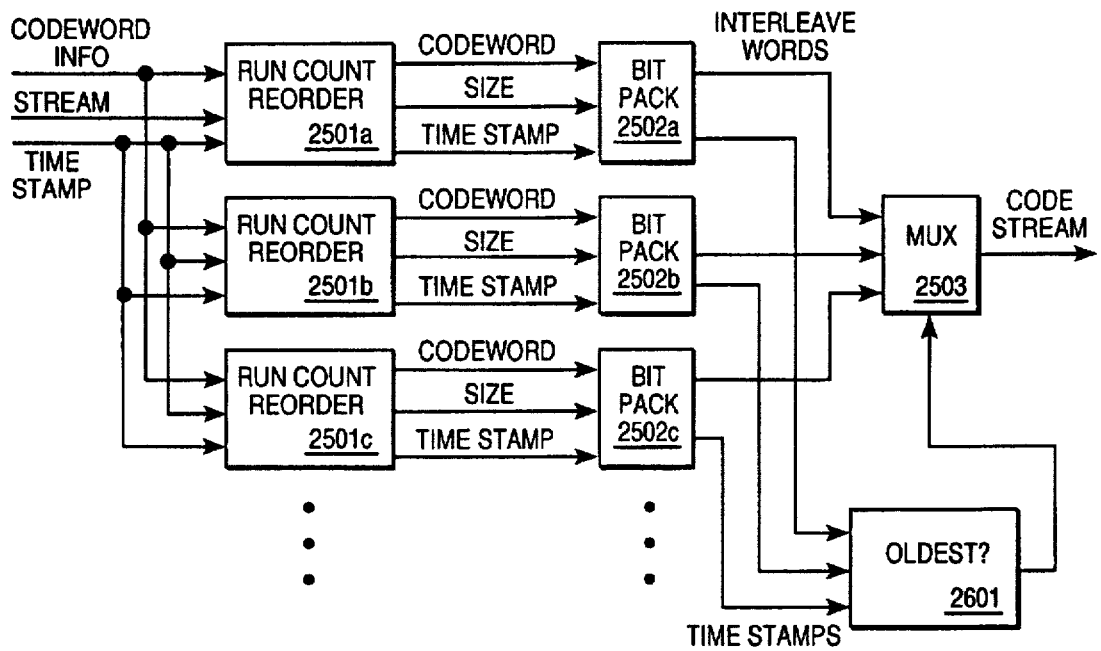
FIG_26

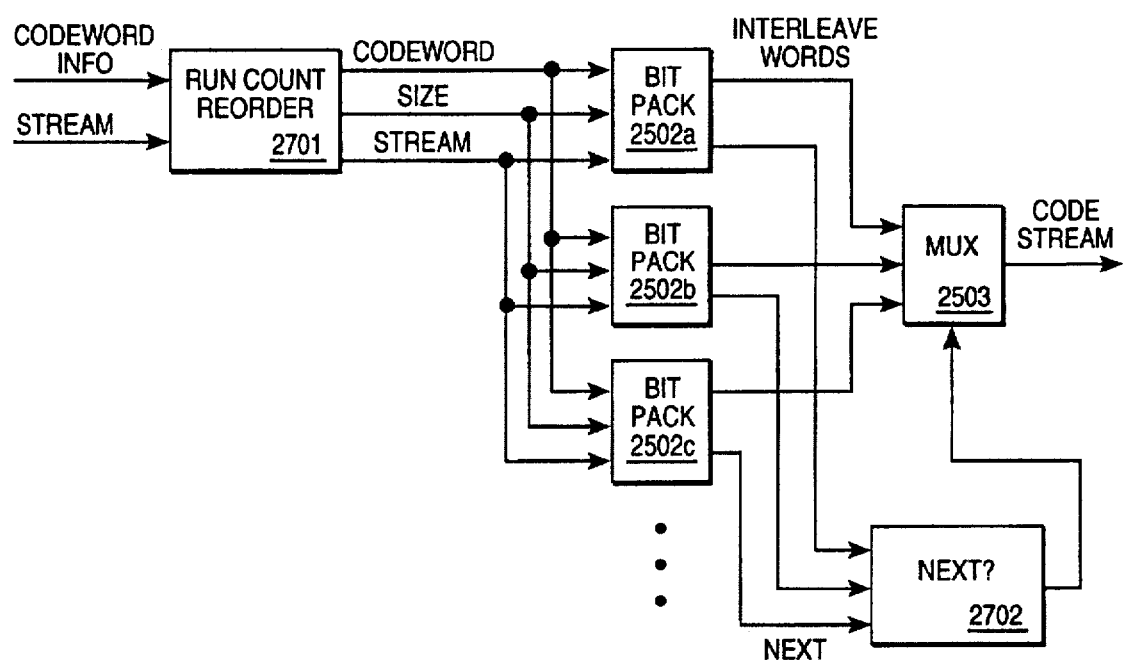
FIG_27

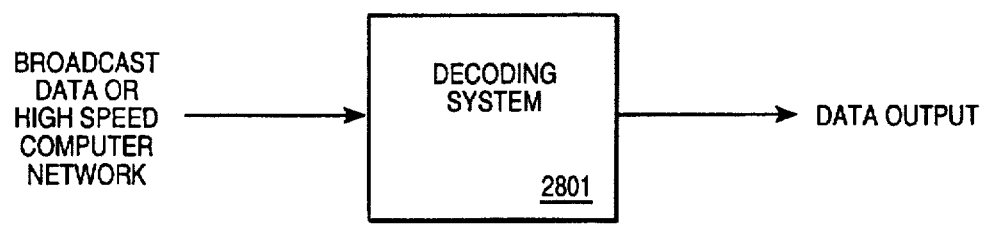
FIG_28
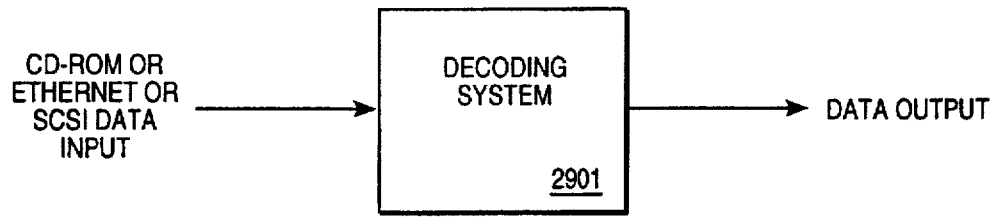
FIG_29
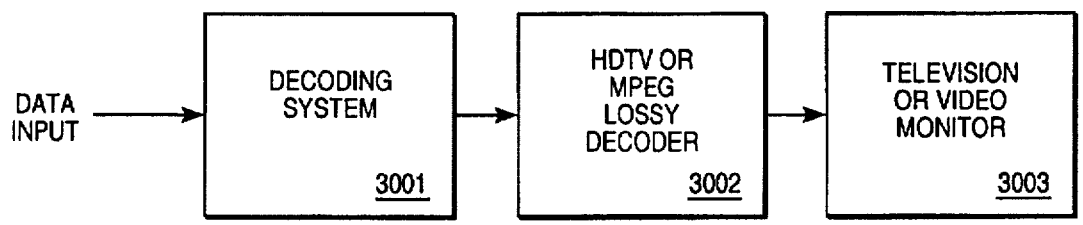
FIG_30

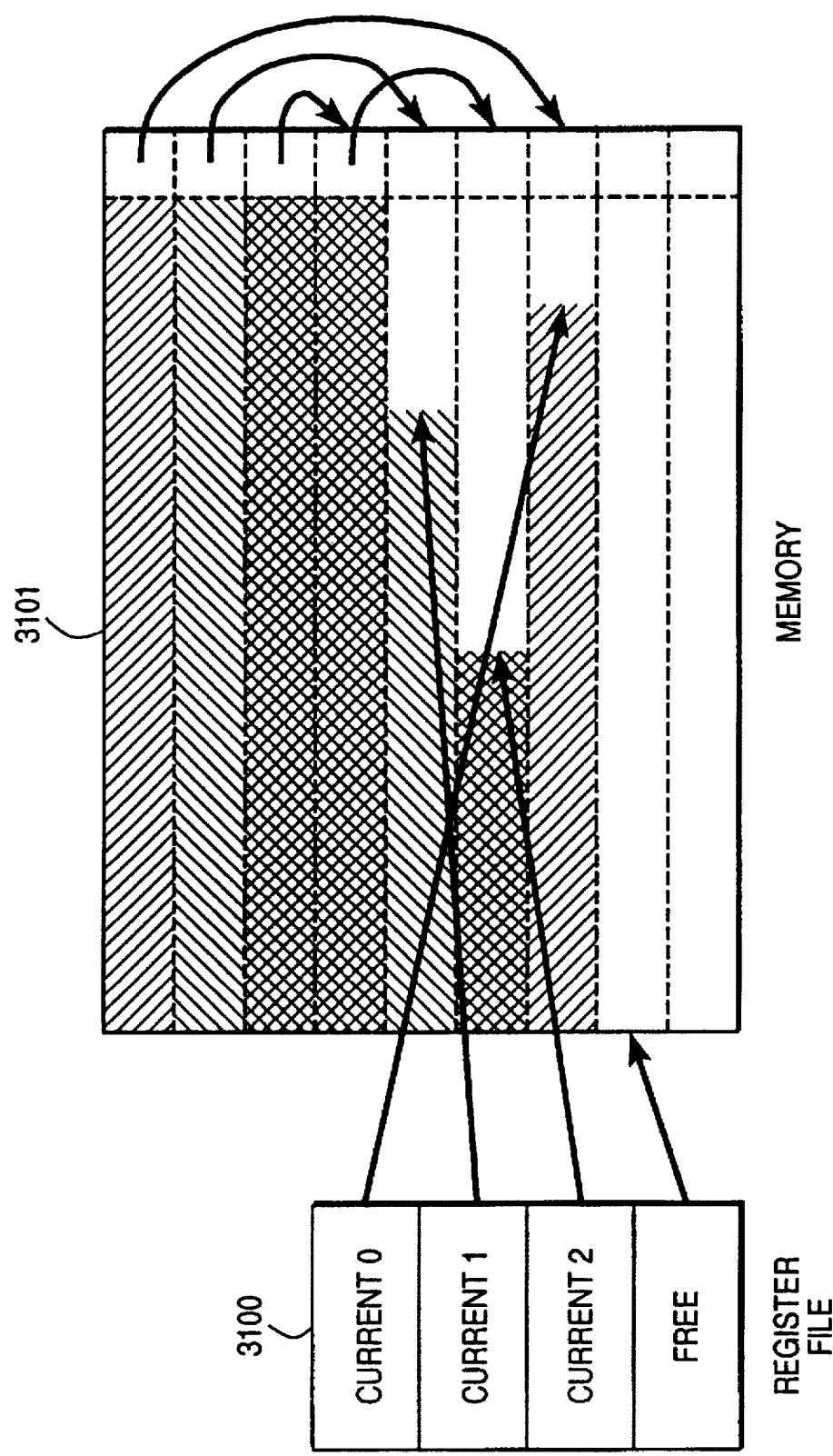
FIG_31

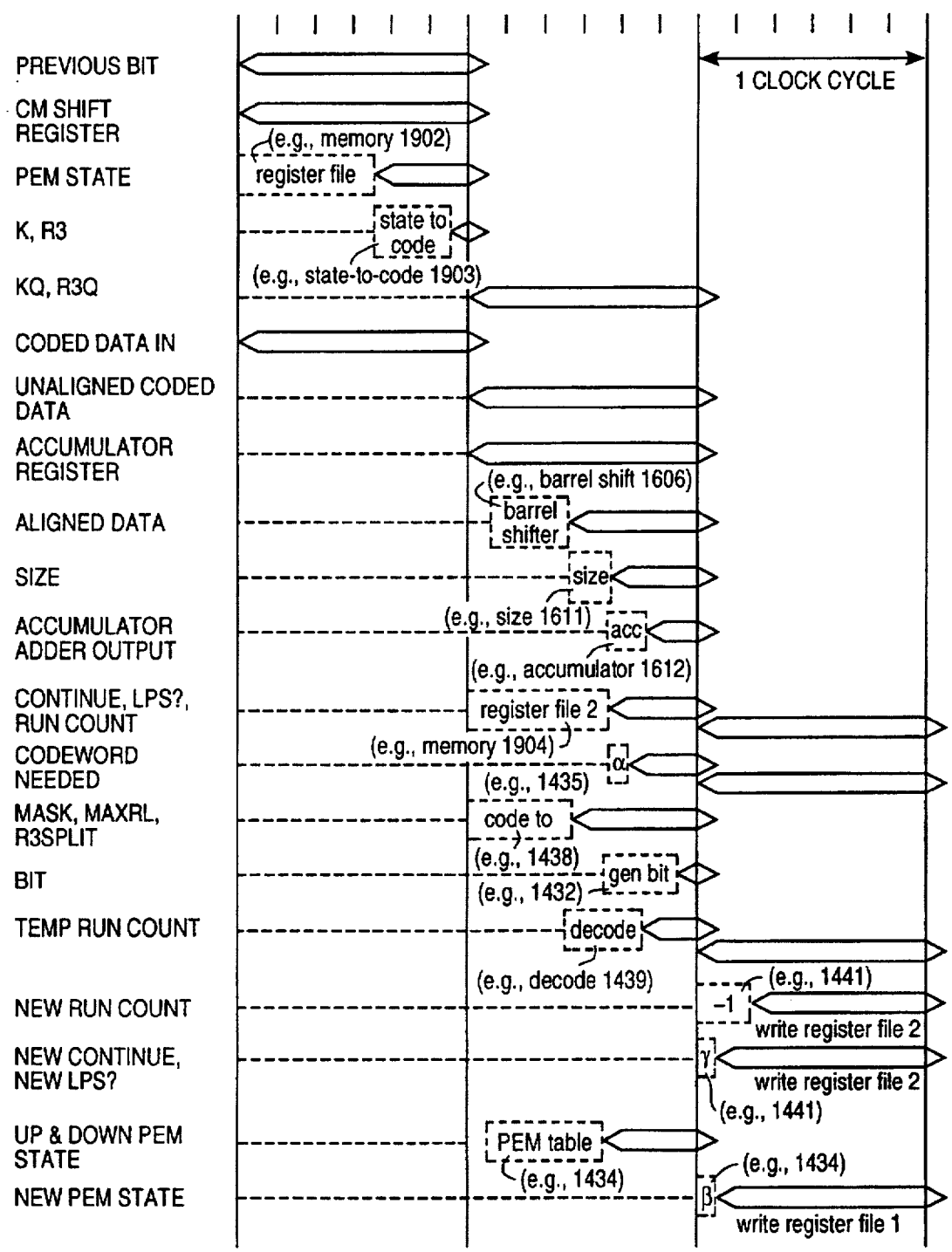
FIG_32

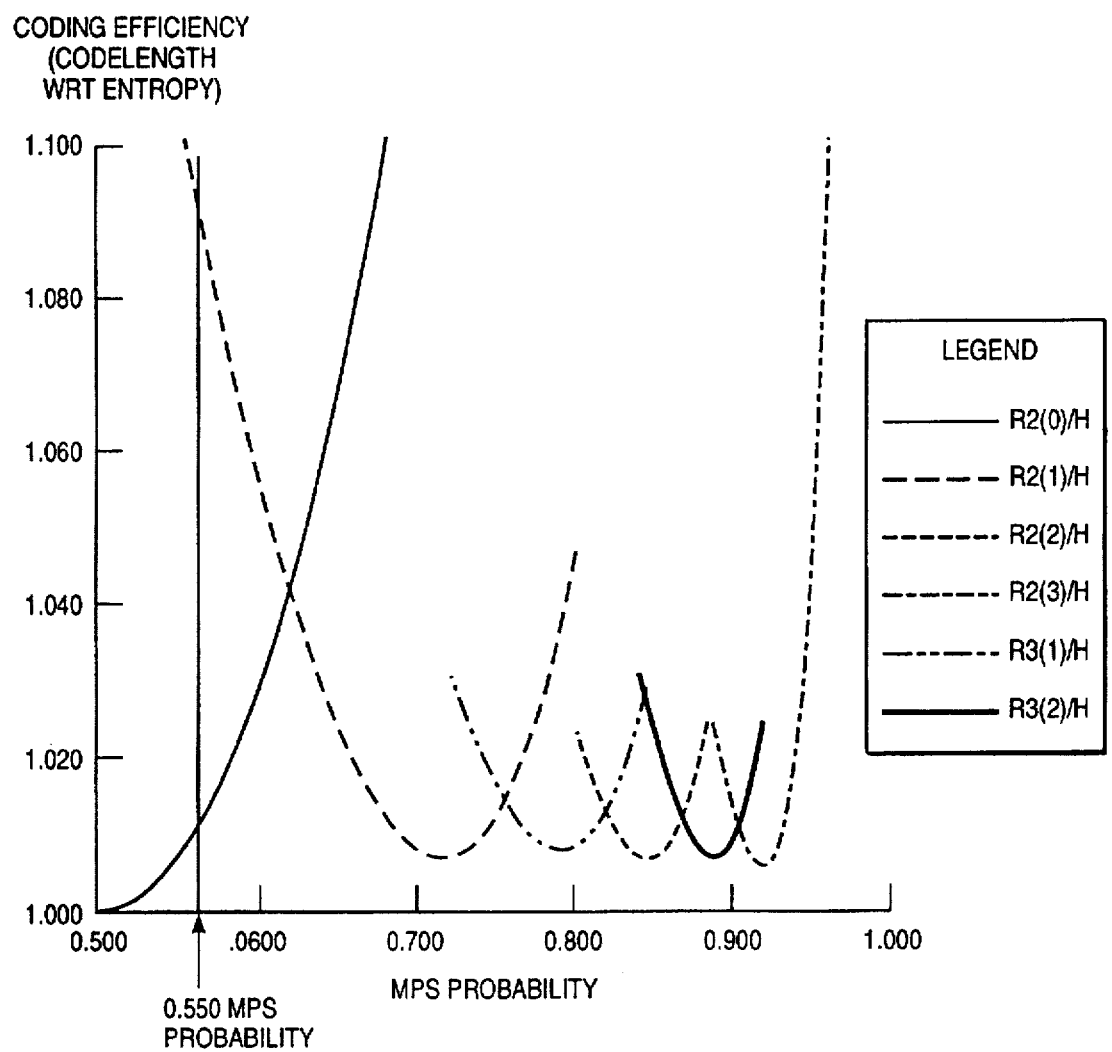
FIG_33

5,717,394

METHOD AND APPARATUS FOR ENCODING AND DECODING DATA

This is a continuation of application Ser. No. 08/316,116, filed Sep. 30, 1994, now abandoned, which is a continuation-in-part application of U.S. patent application Ser. No. 08/172,646 now U.S. Pat. No. 5,583,500 entitled "Method And Apparatus For Parallel Encoding and Decoding of Data, filed Dec. 23, 1993, which is a continuation-in-part application of U.S. patent application Ser. No. 08/016,035 entitled "Method And Apparatus For Parallel Decoding and Encoding of Data, filed Feb. 10, 1993, now U.S. Pat. No. 5,381,145.

FIELD OF THE INVENTION

The present invention relates to the field of data compression and decompression systems; particularly, the present invention relates to a method and apparatus for parallel encoding and decoding of data in compression/decompression systems.

BACKGROUND OF THE INVENTION

Today, data compression is widely used, particularly for storing and transmitting large amounts of data. Many different data compression techniques exist in the prior art. Compression techniques can be divided into two broad categories, lossy coding and lossless coding. Lossy coding involves coding that results in the loss of information, such that there is no guarantee of perfect reconstruction of the original data. In lossless compression, all the information is retained and the data is compressed in a manner which allows for perfect reconstruction.

In lossless compression, input symbols are converted to output codewords. If the compression is successful, the codewords are represented in fewer bits than the number of input symbols. Lossless coding methods include dictionary methods of coding (e.g., Lempel-Ziv), run length encoding, enumerative coding and entropy coding.

Entropy coding consists of any method of lossless coding which attempts to compress data close to the entropy limit using known or estimated symbol probabilities. Entropy codes include Huffman codes, arithmetic codes and binary entropy codes. Binary entropy coders are lossless coders which act only on binary (yes/no) decisions, often expressed as the most probable symbol (MPS) and the least probable symbol (LPS). Examples of binary entropy coders include IBM's Q-coder and a coder referred to as the B-coder. For more information on the B-coder, see U.S. Pat. No. 5,272,478, entitled "Method and Apparatus for Entropy Coding", (J. D. Allen), issued Dec. 21, 1993, and assigned to the corporate assignee of the present invention. See also M. J. Gormish and J. D. Allen, "Finite State Machine Binary Entropy Coding," abstract in *Proc. Data Compression Conference*, 30 Mar. 1993, Snowbird, Utah, pg. 449. The B-coder is a binary entropy coder which uses a finite state machine for compression.

FIG. 1 shows a block diagram of a prior art compression and decompression system using a binary entropy coder. For coding, data is input into context model (CM) 101. CM 101 translates the input data into a set or sequence of binary decisions and provides the context bin for each decision. Both the sequence of binary decisions and their associated context bins are output from CM 101 to the probability estimation module (PEM) 102. PEM 102 receives each context bin and generates a probability estimate for each binary decision. The actual probability estimate is typically represented by a class, referred to as PClass. Each PClass is used for a range of probabilities. PEM 102 also determines whether the binary decision (result) is or is not in its more probable state (i.e., whether the decision corresponds to the MPS). The bit-stream generator (BG) module 103 receives the probability estimate (i.e., the PClass) and the determination of whether or not the binary decision was likely as inputs. In response, BG module 103 produces a compressed data stream, outputting zero or more bits, to represent the original input data.

For decoding, CM 104 provides a context bin to PEM 105, and PEM 105 provides the probability class (PClass) to BG module 106 based on the context bin. BG module 106 is coupled to receive the probability class. In response to the probability class and the compressed data, BG module 106 returns a bit representing whether the binary decision (i.e., the event) is in its most probable state. PEM 105 receives the bit, updates the probability estimate based on the received bit, and returns the result to CM 104. CM 104 receives the returned bit and uses the returned bit to generate the original data and update the context bin for the next binary decision.

One problem with decoders using binary entropy codes, such as IBM's Q-coder and the B-coder, is that they are slow, even when implemented in hardware. Their operation requires a single large, slow feedback loop. To restate the decoding process, the context model uses past decoded data to produce a context. The probability estimation module uses the context to produce a probability class. The bit-stream generator uses the probability class and the compressed data to determine if the next bit is the likely or unlikely result. The probability estimation module uses the likely/unlikely result to produce a result bit (and to update the probability estimate for the context). The result bit is used by the context model to update its history of past data. All of these steps are required for decoding a single bit. Because the context model must wait for the result bit to update its history before it can provide the next context, the decoding of the next bit must wait. It is desirable to avoid having to wait for the feedback loop to be completed before decoding the next bit. In other words, it is desirable to decode more than one bit or codeword at a time in order to increase the speed at which compressed data is decoded.

Another problem With decoders using binary entropy codes is that variable length data must be processed. In most systems, the codewords to be decoded have variable lengths. Alternatively, other systems encode variable length symbols (uncoded data). When processing the variable length data, it is necessary to shift the data at the bit level in order to provide the correct next data for the decoding or encoding operation. These bit level manipulations on the data stream can require costly and/or slow hardware and/or software. Furthermore, prior art systems require this shifting to be done in time critical feedback loops that limit the performance of the decoder. It would also be advantageous to remove the bit level manipulation of the data stream from time critical feedback loops, so that parallelization could be used to increase speed.

The present invention provides a lossless compression and decompression system. The present invention also provides a real-time encoder and a real-time decoder that encode and decode data, respectively, in parallel. The encoder and decoder of the present invention create a balanced parallel entropy system that perform both real-time encoding and real-time decoding in high speed/low cost hardware.

SUMMARY OF THE INVENTION

A method and apparatus for decompressing and compressing data is described. The present invention provides an encoder for use in a compression system having a decoder for decoding information generated by the encoder. The encoder of the present invention includes a coder for producing codeword information in response to data. The encoder also includes a reorder unit that generates a coded data stream in response to the codeword information from the coder. The reorder unit comprises a run count reorder unit for arranging codewords into a decoding order and a bit pack unit to combine variable length codewords into fixed length interleaved words and to output the fixed length interleaved words in an order required by the decoder.

BRIEF DESCRIPTION OF THE DRAWINGS

The present invention will be understood more fully from the detailed description given below and from the accompanying drawings of various embodiments of the invention which, however, should not be taken to limit the invention to the specific embodiments, but are for explanation and understanding only.

FIG. 1 is a block diagram of a prior art binary entropy encoder and decoder.

FIG. 2C is a block diagram of one embodiment of the decoding system of the present invention which processes context bins in parallel.

FIG. 2D is a block diagram of one embodiment of the decoding system of the present invention which processes probability classes in parallel.

FIG. 3 illustrates the non-interleaved code stream of the present invention.

FIG. 4 illustrates one embodiment of the interleaved code stream as derived from an exemplary set of data.

FIG. 5 is one example of a probability estimation table and bit-stream generator for the R-coder of the present invention.

FIG. 6 is a block diagram one embodiment of an encoder of the present invention.

FIG. 7 is a block diagram of one embodiment of a bit generator of the present invention.

FIG. 8 is a block diagram of one embodiment of the reorder unit of the present invention.

FIG. 9 is a block diagram of one embodiment of the run count reorder unit of the present invention.

FIG. 10 is a block diagram of another embodiment of the run count reorder unit of the present invention.

FIG. 11 is a block diagram of one embodiment of the bit packing unit of the present invention.

FIG. 12 is a block diagram of one embodiment of the packing logic of the present invention.

FIG. 13 is a block diagram of a block diagram of the encoder bit generator of the present invention.

FIG. 15A illustrates one embodiment of the decoding pipeline of the present invention.

FIG. 15B illustrates one embodiment of the decoder of the present invention.

FIG. 16A is a block diagram of one embodiment of the shifter of the present invention.

FIG. 16B is a block diagram of another embodiment of the shifter of the present invention.

FIG. 17 is a block diagram of a system having an external context model.

FIG. 18 is a block diagram of another system having an external context model.

FIG. 19 is a block diagram of one embodiment of a decoder of the present invention.

FIG. 20 is a block diagram of one embodiment of a decoder with separate bit generators.

FIG. 21 is a block diagram of one embodiment of a bit generator of the present invention.

FIG. 22 is a block diagram of one embodiment of the long run unit of the present invention.

FIG. 23 is a block diagram of one embodiment of the short run unit of the present invention.

FIG. 24 is a block diagram of one embodiment of the initialization and control logic of the present invention.

FIG. 25 is a block diagram of one embodiment of reordering data using a snooper decoder.

FIG. 26 is a block diagram of another embodiment of a reordering unit.

FIG. 27 is a block diagram of another embodiment of a reordering unit using a merged queue.

FIG. 28 is a block diagram of a high bandwidth system using the present invention.

FIG. 29 is a block diagram of a bandwidth matching system using the present invention.

FIG. 30 is a block diagram of a real-time video system using the present invention.

FIG. 31 illustrates one embodiment of the coded data memory of the present invention.

FIG. 32 is a timing diagram of the decoding of the present invention.

FIG. 33 illustrates a graph of coding efficiency versus MPS probability.

DETAILED DESCRIPTION OF THE INVENTION

Figure 2A:
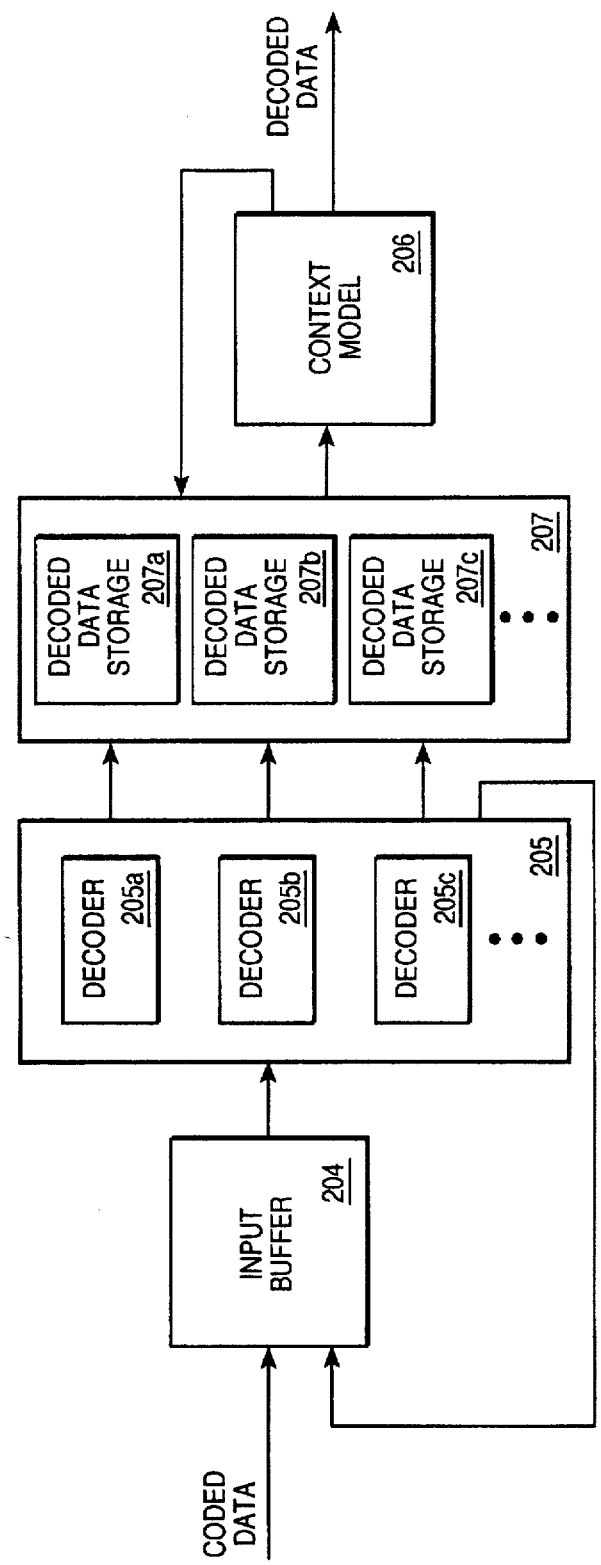
FIG. 2A is a block diagram of the decoding system of the present invention.

A method and apparatus for parallel encoding and decoding of data is described. In the following description, numerous specific details are set forth, such as specific numbers of bits, numbers of coders, specific probabilities, types of data, etc., in order to provide a thorough understanding of the preferred embodiments of the present invention. It will be understood to one skilled in the art that the present invention may be practiced without these specific details. Also, well-known circuits have been shown in block diagram form rather than in detail in order to avoid unnecessarily obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

Parallel Entropy Coding

The present invention provides a parallel entropy coding system. The system includes an encoder and a decoder. In one embodiment, the encoder performs encoding on data in real-time. Similarly, in one embodiment, the decoder of the present invention performs decoding on data in real-time. Together, the real-time encoder and real-time decoder form a balanced coding system.

The present invention provides a system that decodes losslessly encoded data in parallel. The data is decoded in parallel by using multiple decoding resources. Each of the multiple decoding resources is assigned data (e.g., codewords) from the data stream to decode. The assignment of the data stream occurs on the fly wherein the decoding resources decode data concurrently, thereby decoding the data stream in parallel. In order to enable the assignment of data in a manner which makes efficient use of the decoding resources, the data stream is ordered. This is referred to as parallelizing the data stream. The ordering of data allows each decoding resource to decode any or all of the coded data without waiting for feedback from the context model.

FIG. 2A illustrates the decoding system of the present invention without the slow feedback loop of the prior art. An input buffer 204 receives coded data (i.e., codewords) and a feedback signal from decoder 205 and supplies coded data in a predetermined order (e.g., context bin order) to decoder 205 of the present invention, which decodes the coded data. Decoder 205 includes multiple decoders (e.g., 205A, 205B, 205C, etc.).

In one embodiment, each of the decoders 205A, 205B, 205C, etc. is supplied data for a group of contexts. Each of the decoders in decoder 205 is supplied coded data for every context bin in its group of contexts from input buffer 204. Using this data, each decoder 205A, 205B, 205C, etc. produces the decoded data for its group of context bins. The context model is not required to associate coded data with a particular group of context bins.

The decoded data is sent by decoder 205 to decoded data storage 207 (e.g., 207A, 207B, 207C, etc.). Note that decoded data storage 207 may store intermediate data that is neither coded nor uncoded, such as run counts. In this case, decoded data storage 207 stores the data in a compact, but not entropy coded, form.

Operating independently, context model 206 is coupled to receive the previously decoded data from decoded data storage 207 (i.e., 207A, 207B, 207C, etc.) in response to a feedback signal it sends to decoded data storage 207. Therefore, two independent feedback loops exist, one between decoder 205 and input buffer 204 and a second between context model 206 and decoder data storage 207. Since the large feedback loop is eliminated, the decoders in decoder 205 (e.g., 205A, 205B, 205C, etc.) are able to decode their associated codewords as soon as they are received from input buffer 204.

The context model provides the memory portion of the coding system and divides a set of data (e.g., an image) into different categories (e.g., context bins) based on the memory. In the present invention, the context bins are considered independent ordered sets of data. In one embodiment, each group of context bins has its own probability estimation model and each context bin has its own state (where probability estimation models are shared). Therefore, each context bin could use a different probability estimation model and/or bit-stream generator.

Thus, the data is ordered, or parallelized, and data from the data stream is assigned to individual coders for decoding.

Adding Parallelism to the Classic Entropy Coding Model

To parallelize the data stream, the data may be divided according to either context, probability, tiling, codeword sequence (based on codewords), etc. The reordering of the coded data stream is independent of the parallelism, a method used to parallelize data or the probability at any other point. A parallel encoder portion of an encoding system of the present invention fed by data differentiated by context model (CM) is shown in FIG. 2B.

Figure 2B:
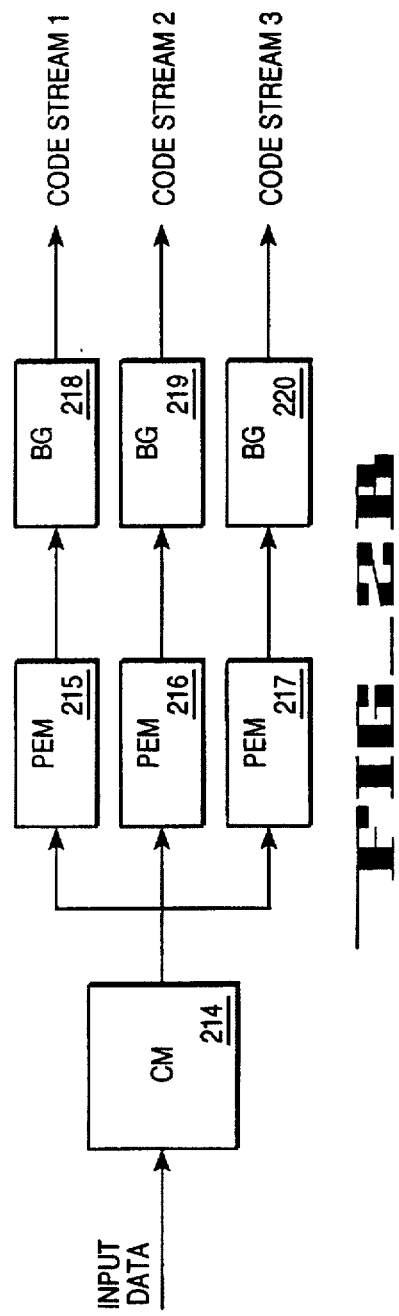
FIG. 2B is a block diagram of one embodiment of the encoding system of the present invention.

Referring to FIG. 2B, the context dependent parallel encoder portion comprises context model (CM) 214, probability estimation modules (PEMs) 215–217, and bitstream generators (BGs) 218–220. CM 214 is coupled to receive coded input data. CM 214 is also coupled to PEMs 215–217. PEMs 215–217 are also coupled BGs 218–220, respectively, which output code streams 1, 2 and 3 respectively. Each PEM and BG pair comprises a coder. Therefore, the parallel encoder is shown with three coders. Although only three parallel codes are shown, any number of coders may be used.

CM 214 divides data stream into different contexts in the same way as a conventional CM and sends the multiple streams to the parallel hardware encoding resources. Individual contexts, or groups of contexts, are directed to separate probability estimators (PEMs) 215–217 and bit generators (BGs) 218–219. Each of BGs 218–220 outputs a coded data stream.

FIG. 2C is a block diagram of one embodiment of the decoder portion of the decoding system of the present invention. Referring to FIG. 2C, a context dependent parallel decoder is shown having BGs 221–223, PEMs 224–226 and CM 227. Code streams 1–3 are coupled to BGs 221–223 respectively. BGs 221–223 are also coupled to PEMs 224–226 respectively. PEMs 224–226 are coupled to CM 227 which outputs the reconstructed input data. The input comes from several code streams, shown as code streams 1–3. One code stream is assigned to each PEM and BG. Each of the BG 221–223 returns a bit representing whether the binary decision is in its more probable state, which the PEMs 224–226 use to return decoded bits (e.g., the binary decision). Each of PEMs 224–226 is associated with one of BGs 221–223, indicating which code is to be used to produce a data stream from its input code stream. CM 227 produces a decoded data stream by selecting the decoded bits from the bit-stream generators in the proper sequence, thereby recreating the original data. Thus, the CM 227 obtains the decompressed data bit from the appropriate PEM and BG, in effect reordering the data into the original order. Note that the control for this design flows in the reverse direction of the data stream. The BG and PEM may decode data before the CM 227 needs it, staying one or more bits ahead. Alternatively, the CM 227 may request (but not receive) a bit from one BG and PEM and then request one or more bits from other BGs and PEMs before using the initially requested bit.

The configuration shown in FIG. 2C is designed to couple the PEM and BG tightly. The IBM Q-Coder is a good example of a coder having a tightly coupled PEM and BG. Local feedback loops between these two are not fundamental limit to system performance.

in a different design, the PEM could differentiate the data and send it to parallel BG units. Thus, there would be only one CM and PEM and the BG is replicated. Adaptive Huffman coding and finite state machine coding could be used in this way.

A similar decoding system that uses the PEM to differentiate the data and send it to parallel BGs is shown in FIG. 2D. In this case, probability classes are handled in parallel and each bit-stream generator is assigned to a specific probability class and receives knowledge of the result. Referring to FIG. 2D, the coded data streams 1–3 are coupled to one of multiple bit-stream generators (e.g., BG 232, BG 233, BG 234, etc.), which are coupled to receive it. Each of the bit-stream generators is coupled to PEM 235. PEM 235 is also coupled to CM 236. In this configuration, each of the bit-stream generators decodes coded data and the results of the decoding are selected by PEM 235 (instead of by CM 236). Each of the bit-stream generator receives coded data from a source associated with one probability class (i.e., where the coded data could from any context bin). PEM 235 selects the bit-stream generators using a probability class. The probability class is dictated by the context bin provided to it by CM 236. In this manner, decoded data is produced by processing probability classes in parallel.

Numerous implementations exist for the parallel decoding systems of the present invention. In one embodiment, the coded data streams corresponding to the multiple context bins can be interleaved into one stream ordered by the demands of the various coders. In one embodiment of the present invention, the coded data is ordered such that each coder is constantly supplied with data even though the coded data is delivered to the decoder in one stream. Note that the present invention operates with all types of data, including image data.

By using small simple coders that can be cheaply replicated in integrated circuits, coded data can be decoded quickly in parallel. In one embodiment, the coders are implemented in hardware using field programmable gate array (FPGA) chips or a standard cell application specific integrated circuit (ASIC) chip. The combination of parallelism and simple bit-stream generators allow the decoding of coded data to occur at speeds in excess of the prior art decoders, while maintaining or exceeding the compression efficiency of the prior art decoding systems.

Channel Ordering of Multiple Data Streams

There are many different design issues and problems that affect system performance. A few of these will be mentioned below. However, the embodiments shown in FIG. 2B and 2C (and 2D) use the multiple code streams. Systems with parallel channels that could accommodate this embodiment are imaginable: multiple telephone lines, multiple heads on a disk drive, etc. In some applications, only one channel is available, or convenient. Indeed, if multiple channels are required there may be poor utilization of the bandwidth because of the bursty nature of the individual code streams.

In one embodiment, the code streams are concatenated and sent contiguously to the decoder. A preface header contains pointers to the beginning bit location of each stream. FIG. 3 illustrates one embodiment of the arrangement of this data. Referring to FIG. 3, three pointers 301–300 indicate the starting location in the concatenated code of code streams 1, 2 and 3 respectively. The complete compressed data file is available in a buffer to the decoder. As needed, the codewords are retrieved from the proper location via the proper pointer. The pointer is then updated to the next codeword in that code stream.

Note that this method requires an entire coded frame to be stored at the decoder and, for practical purposes, at the encoder. If a real-time system, or less bursty data flow, is required then two frame buffers may be used for banking at both the encoder and the decoder.

Data Order to Codeword Order

Notice that a decoder decodes codewords in a given deterministic order. With parallel coding, the order of the requests to the code stream is deterministic. Thus, if the codewords from parallel code streams can be interleaved in the right order at the encoder, then a single code stream will suffice. The codewords are delivered to the decoder in the same order on a just-in-time basis. At the encoder, a model of the decoder determines the codeword order and packs the codewords into a single stream. This model might be an actual decoder.

A problem with delivering data to the parallel decoding elements arises when data is variable length. Unpacking a stream of variable length codewords requires using a bit shifter to align the codewords. Bit shifters are often costly and/or slow when implemented in hardware. The control of the bit shifter depends on the size of the particular codeword. This control feedback loop prevents variable length shifting from being performed quickly. The virtues of feeding multiple decoders with a single stream cannot be realized if the process of unpacking the stream is performed in a single bit shifter that is not fast enough to keep up with the multiple decoders.

The solution offered in this invention separates the problem of distributing the coded data to the parallel coders from the alignment of the variable-length codewords for decoding. The codewords in each independent code stream are packed into fixed-length words, called interleaved words. At the decoder end of the channel these interleaved words can be distributed to the parallel decoder units with fast hardwired data lines and a simple control circuit.

It is convenient to have the interleaved word length larger than the maximum codeword length so that at least enough bits to complete one codeword is contained in each interleaved word. The interleaved words can contain may codewords and parts of codewords. FIG. 4 illustrates the interleaving of an example set of parallel code streams.

These words are interleaved according to the demand at the decoder. Each independent decoder receives an entire interleaved word. The bit shifting operation is now done locally at each decoder, maintaining the parallelism of the system. Note in FIG. 4 that the first codeword in each interleaved word is the lowest remaining codeword in the set. For instance, the first interleaved words come from code stream 1, starting with the lowest codeword (i.e., #1). This is followed by the first interleaved word in code stream 2 and then by the first interleaved word in code stream 3. However, the next lowest codeword not contained completely in an already ordered interleaved word is #7. Therefore, the next word in the stream is the second interleaved word of code stream 2.

In another embodiment, the order in which the subsequent set of interleaved words (e.g., the codeword starting with codeword #8 in stream 1, the codeword starting with codeword #7 in stream 2, the codeword starting with codeword #11 in stream 3) are inserted into the interleaved codestream is based on the first codeword of the previous set of interleaved words (e.g., the codeword starting with codeword #1 in stream 1, the codeword starting with codeword #2 in stream 2, the codeword starting with codeword #4 in stream 3) and are ordered from the interleaved word with the lowest number first codeword to the interleaved word with the highest number first codeword. Therefore, in this case, since the interleaved word starting with codeword #1 was first, then the next interleaved word in stream I is the first of the second group of interleaved words to be inserted into the interleaved stream, followed by the next interleaved word in stream 2 and then the next interleaved word in stream 3. Note that after the second group of interleaved words is inserted into the interleaved stream, the next interleaved word in stream 2 would be the next interleaved word inserted into the stream because codeword #7 is the lowest codeword of the second set of interleaved words (followed by codeword #8 in stream 1 and then codeword #11 in stream 3).

Using the actual decoder as the modeler for the data stream accounts for all design choices and delays to create the interleaved stream. This is not a great cost for duplex systems that have both encoders and decoders anyway. Note that this can be generalized to any parallel set of variable-length (or different sized) data words that are consumed in a deterministic order.

Types Of Codes and Bit-Stream Generators For Parallel Decoding

The present invention could employ existing coders, such as Q-coders or B-coders, as the bit-stream generation elements which are replicated in parallel. However, other codes and coders may be used. The coders and their associated codes employed by the present invention are simple coders.

In the present invention, using a bit-stream generator with a simple code instead of complex code, such as the arithmetic code used by the Q-coder or the multi-state codes used by the B-coder, offers advantages. A simple code is advantageous in that the hardware implementation is much faster and simpler and requires less silicon than a complex code.

Another advantage of the present invention is that coding efficiency can be improved. A code that uses a finite amount of state information cannot perfectly meet the Shannon entropy limit for every probability. Hardware implemented codes known in the art that allow a single bit-stream generator to handle multiple probabilities or contexts have constraints that reduce coding efficiency. Removing the constraints needed for multiple contexts or probability classes allows the use of codes that comes closer to meeting the Shannon entropy limit.

R-codes

The code (and coder) employed by one embodiment of the present invention is referred to as an R-code. R-codes are adaptive codes that convert a variable number of identical input symbols into a codeword. In an embodiment, the R-codes are parameterized so that many different probabilities can be handled by a single decoder design. Moreover, the R-codes of the present invention can be decoded by simple, high-speed hardware.

In the present invention, R-codes are used by an R-coder to perform encoding or decoding. In one embodiment, an R-coder is a combined bit-stream generator and probability estimation module. For instance, in FIG. 1, an R-coder could include the combination of probability estimation module 102 and bit-stream generator 103 and the combination of probability estimation module 105 with bit-stream generator 106.

Codewords represent runs of the most probable symbol (MPS). A MPS represents the outcome of a binary decision with more than 50% probability. On the other hand, the least probable symbol (LPS) represents the outcome in a binary decision with less than 50% probability. Note that when two outcomes are equally probable, it is not important which is designated MPS or LPS as long as both the encoder and decoder make the same designation. The resulting bit sequence in the compressed file is shown in Table 1, for a given parameter referred to as MAXRUN.

TABLE 1

| Codeword | Bit-generation Encoding Meaning |
|---|---|
| 0 | MAXRUN Consecutive MPSs |
| 1N | N Consecutive MPSs followed by LPS, N < MAXRUN |

To encode, the number of MPSs in a run are counted by a simple counter. If that count equals the MAXRUN count value, a 0 codeword is emitted into the code stream and the counter is reset. If an LPS is encountered, then a 1 followed by the bits N, which uniquely describe the number of MPS symbols before the LPS, is emitted into the code stream. (Note that there are many ways to assign the N bits to describe the run length). Again the counter is reset. Note that the number of bits needed for N is dependent on the value of MAXRUN. Also note that the 1's complement of the codewords could be used.

To decode, if the first bit in the code stream is 0, then the value of MAXRUN is put in the MPS counter and the LPS indication is cleared. Then the 0 bit is discarded. If the first bit is a 1, then the following bits are examined to extract the bits N and the appropriate count (N) is put in the MPS counter and the LPS indicator is set. Then the code stream bits containing the 1N codeword are discarded.

R-codes are generated by the rules in Table 1. Note that the definition of a given R-code Rx(k) is defined by the MAXRUN. For instance:

MAXRUN for $Rx(k) = x * 2^{k-1}$, thus

MAXRUN for $R2(k) = 2 * 2^{k-1}$,

MAXRUN for $R3(k) = 3 * 2^{k-1}$, etc. ...

Note that R-codes are a subset of Golomb codes. Also note that Rice codes use R2(●) codes only. The R-codes of the present invention allow the use of both R2(k) and R3(k) codes, and other Rn(k) codes if desired. In one embodiment, R2(k) and R3(k) codes are used. Note that Rn exists for n=2 and n equals any odd number (e.g., R2, R3, R5, R7, R9, R11, R13, R15). In one embodiment, for R2(k) code, the run count, r, is encoded in N; the run count, r, is described in k bits, such that 1N is represented with k+1 bits. Also in one embodiment, for an R3(k) code, the bits N can contain 1 bit to indicate if $n<2^{(k-1)}$ or $n \geq 2^{(k-1)}$ and either k−1 or k bits to indicate the run count, r, such that the variable N is represented by a total k or k+1 bits respectively. In other embodiments, the 1's complement of N could be used in the codeword. In this case, the MPS tends to produce code streams with many 0s and LPS tends to produce code streams with many 1s.

Tables 2, 3, 4 and 5 depict some efficient R-codes utilized for one embodiment of the present invention. It should be noted that other run length codes may also be used in the present invention. An example of alternative run length code for R2(2) is shown in Table 6. Tables 7 and 8 show examples of the codes used in an embodiment.

TABLE 2

R2(0)

| uncoded data | codeword |
|---|---|
| 0 | 0 |
| 1 | 1 |

TABLE 3

R2(1)

| uncoded data | codeword |
|---|---|
| 00 | 0 |
| 01 | 10 |
| 1 | 11 |

TABLE 4

R3(1)

| uncoded data | codeword |
|---|---|
| 000 | 0 |
| 001 | 100 |
| 01 | 101 |
| 1 | 11 |

TABLE 5

R2(2)

| uncoded data | codeword |
|---|---|
| 0000 | 0 |
| 0001 | 100 |
| 001 | 101 |
| 01 | 110 |
| 1 | 111 |

TABLE 6

Alternative R2(2)

| Alternative | R2(2) |
|---|---|
| 0000 | 0 |
| 0001 | 111 |
| 001 | 101 |
| 01 | 110 |
| 1 | 100 |

TABLE 7

Alternative R3(2) Code

| Preferred | R3(2) |
|---|---|
| 000000 | 0 |
| 000001 | 1000 |
| 00001 | 1010 |
| 0001 | 1001 |
| 001 | 1011 |
| 01 | 110 |
| 1 | 111 |

TABLE 8

Another Alternative R2(2) Code

| Preferred | R2(2) |
|---|---|
| 0000 | 0 |
| 0001 | 100 |
| 001 | 110 |
| 01 | 101 |
| 1 | 111 |

Probability Estimation Model for R-Codes

In an embodiment, the R2(0) code performs no coding: an input of 0 is encoded into a 0 and an input of 1 is encoded into a 1 (or vice versa) and is optimal for probabilities equal to 50%. The R2(1) code of the currently preferred embodiment is optimal for probabilities close to 0.707 (i.e., 70.7%) and the R3(1) is optimal for the 0.794 probability (79.4%). The R2(2) code is optimal for the 0.841 probability (84.1%). Table 9 below depicts the near-optimal run-length code, where the probability skew is defined by the following equation:

*Probability skew*=−$log_2$ (*LPS*).

TABLE 9

| probability | probability skew | Best Golomb Code |
|---|---|---|
| .500 | 1.00 | R2(0) |
| .707 | 1.77 | R2(1) |

TABLE 9-continued

| probability | probability skew | Best Golomb Code |
|---|---|---|
| .841 | 2.65 | R2(2) |
| .917 | 3.59 | R2(3) |
| .958 | 4.56 | R2(4) |
| .979 | 5.54 | R2(5) |
| .989 | 6.54 | R2(6) |
| .995 | 7.53 | R2(7) |
| .997 | 8.53 | R2(8) |
| .999 | 9.53 | R2(9) |

Note that the codes are near-optimal in that the probability range, as indicated by the probability skew, is covering the space relatively evenly even though the optimal probabilities do not differentiate as much in the higher k values as in the lower k values.

Reference is made to the probability at which an R-code is optimal. In fact, only R2(2) meets the entropy curve. The real consideration is for what range of probabilities is a particular R-coder better than all other R-codes in a given class. The following tables provide the probability ranges for the class of R2 codes and the class of R2 and R3 codes.

For the class of R2 codes from 0 to 12 the ranges are in the Table 10 below. For example, when only R2 codes are used, R2(0) is best when 0.50 ≦probability≦0.6180. Similarly, R2(1) is best when 0.6180≦probability≦0.7862.

TABLE 10

| R2 Codes from 0 to 12 | |
|---|---|
| Code | Probabilities |
| R2(0) | 0.6180 |
| R2(1) | 0.7862 |
| R2(2) | 0.8867 |
| R2(3) | 0.9416 |
| R2(4) | 0.9704 |
| R2(5) | 0.9851 |
| R2(6) | 0.9925 |
| R2(7) | 0.9962 |
| R2(8) | 0.9981 |
| R2(9) | 0.9991 |
| R2(10) | 0.9995 |
| R2(11) | 0.9998 |
| R2(12) | — |

For the class of R2 and R3 codes the solutions are in the Table 11 below. For example, when R2 and R3 codes are used, R2(1) is best when 0.6180≦probability≦0.7549.

TABLE 11

| R2 and R3 codes lengths less than or equal to 13 bits | |
|---|---|
| Code | Probabilities |
| R2(0) | 0.6180 |
| R2(1) | 0.7549 |
| R3(1) | 0.8192 |
| R2(2) | 0.8688 |
| R3(2) | 0.9051 |
| R2(3) | 0.9321 |
| R3(3) | 0.9514 |
| R2(4) | 0.9655 |
| R3(4) | 0.9754 |
| R2(5) | 0.9826 |
| R3(5) | 0.9876 |
| R2(6) | 0.9913 |
| R3(6) | 0.9938 |
| R2(7) | 0.9956 |

TABLE 11-continued

| R2 and R3 codes lengths less than or equal to 13 bits | |
|---|---|
| Code | Probabilities |
| R3(7) | 0.9969 |
| R2(8) | 0.9978 |
| R3(8) | 0.9984 |
| R2(9) | 0.9989 |
| R3(9) | 0.9992 |
| R2(10) | 0.9995 |
| R3(10) | 0.9996 |
| R2(11) | 0.9997 |
| R3(11) | 0.9998 |
| R2(12) | — |

An R2(k) for a fixed k is called a run-length code. However, a fixed k is only best for a range of probabilities. It is noted that when coding near an optimal probability, an R-code according to the present invention uses a 0 and 1N codewords with roughly equal frequency. In other words, half the time, the R-coder of the present invention outputs one code and the other half of the time, the R-coder outputs the other. By examining the number of 0 and 1N codewords, a determination can be made as to whether the best code is being used. That is, if too many 1N codewords are being output, then the run-length is too long; on the other hand, if too many 0 codewords are being output, then the run length is too short.

The probability estimation model used by Langdon examines the first bit of each codeword to determine whether the source probability is above or below the current estimate. See G. G. Langdon, "An Adaptive Run-Length Coding Algorithm", *IBM Technical Disclosure Bulletin*, Vol. 26, No. 7B, December 1983. Based on this determination, k is increased or decreased. For example, if a codeword indicating MPS is seen, the probability estimate is too low. Therefore, according to Langdon, k is increased by 1 for each 0 codeword. If a codeword indicating less than MAXRUN MPS followed by an LPS (e.g., 1N codeword) is seen, the probability estimate is too high. Therefore, according to Langdon, k is decreased by 1 for each 1N codeword.

The present invention allows more complex probability estimation than the simple increase or decrease of k by 1 every codeword. The present invention includes a probability estimation module state that determines the code to use. Many states may use the same code. Codes are assigned to states using a state table or state machine.

In one embodiment of the present invention, the probability estimate changes state every codeword output. Thus, the probability estimation module increases or decreases the probability estimate depending on whether a codeword begins with a 0 or a 1. For instance, if a "0" codeword is output, an increase of the estimate of the MPS probability occurs. On the other hand, if a "1" codeword is output, the estimate of MPS probability is decreased.

The Langdon coder of the prior art only used R2(k) codes and increased or decreased k for each codeword. The present invention, alternatively, uses R2(k) and R3(k) codes, in conjunction with the state table or state machine, to allow the adaptation rate to be tuned to the application. That is, if there is a small amount of stationary data, adaptation must be quicker to result in more optimal coding, and where there is a larger amount of stationary data, the adaptation time can be longer so that the coding can be chosen to achieve better compression on the remainder of the data. Note that where variable numbers of state changes can occur, application specific characteristics may also influence the adaptation rate. Because of the nature of the R-codes, the estimation for R-codes is simple and requires little hardware, while being very powerful. FIG. 33 illustrates this graph of coding efficiency (codelength normalized with respect to entropy) versus MPS probability. FIG. 33 shows how some of the R-codes of the present invention cover the probability space. AS an example, FIG. 33 shows that for a MPS probability of approximately 0.55, the efficiency of the R2(0) code is 1.01 (or 1% worse than) the entropy limit. In contrast, the R2(1) code has an efficiency of 1.09 (or 9% worse than) the entropy limit. This example shows that using the wrong code for this particular low probability case cause an 8% loss in coding efficiency.

The incorporation of the R3(k) codes allows more probability space to be covered with a greater efficiency. An example probability estimation state table according to the present invention is shown in FIG. 5. Referring to FIG. 5, the probability estimation state table shows both a state counter and the code associated with each of the separate states in the table. Note that the table includes both positive and negative states. The table is shown having 37 positive states and 37 negative states, including the zero states. The negative states signify a different MPS than the positive states. In one embodiment, the negative states can be used when the MPS is 1 and the positive states can be used when the MPS is 0, or vice versa. Note that the table shown in FIG. 5 is an example only and that other tables might have more or less states and a different state allocation.

Initially, the coder is in state 0 which is the R2(0) code (i.e., no code) for probability estimate equal to 0.50. After each codeword is processed, the state counter is incremented or decremented depending on the first bit of the codeword. In one embodiment, a codeword of 0 increases the magnitude of a state counter; a codeword starting with 1 decreases the magnitude of the state counter. Therefore, every codeword causes a change to be made in the state by the state counter. In other words, the probability estimation module changes state. However, consecutive states could be associated with the same code. In this case, the probability estimation is accomplished without changing codes every codeword. In other words, the state is changed for every codeword; however, the state is mapped into the same probabilities at certain times. For instance, states 5 to −5 all use the R2(0) code, while states 6 through 11 and −6 through −11 use the R2(1) code. Using the state table of the present invention, probability estimation is allowed to stay with the same coder in a non-linear manner.

It should be noted that more states with the same R-code are included for the lower probabilities. This is done because the loss of efficiency when using the wrong code at low probabilities is great. The nature of the run length codes state table is to transfer between states after each codeword. In a state table designed to change codes with every change in state, when toggling between states at the lower probabilities, the code toggles between a code which is very close to the entropy efficiency limit and code which is far from the entropy efficiency limit. Thus, a penalty (in terms of the number of coded data bits) can result in the transition between states. Prior art probability estimation modules, such as Langdon's probability estimation module, lose performance because of this penalty.

In the higher probability run length codes, the penalty for being in the wrong code is not as great. Therefore, in the present invention, additional states are added at the lower probabilities, so that the changes of toggling between the two correct states are increased, thereby reducing the coding inefficiency.

Note that in certain embodiments, the coder may have initial probability estimate state. In other words, the coder could start in a predetermined one of the states, such as state 18. In one embodiment, a different state table could be used so that some states would be used for the first few symbols to allow for quick adaptation, and a second state table could be used for the remaining symbols for slow adaptation to allow fine-tuning of the probability estimate. In this manner, the coder may be able to use a more efficient code sooner in the coding process. In another embodiment, the code stream could specify an initial probability estimate for each context. In one embodiment, the increments and decrements are not made according to a fixed number (e.g., 1). Instead, the probability estimate state can be incremented by a variable number according to the amount of data already encountered or the amount of change in the data (stability). Examples of such tables are Tables 21-25 described below.

If the state table is symmetric, as the example table of FIG. 5 shows, only half of it (including the zero state) needs to be stored or implemented in hardware. In one embodiment, the state number is stored in sign magnitude (1s) complement form to take advantage of the symmetry. In this manner, the table can be utilized by taking the absolute value of the ones complement number to determine the state and examining the sign to determine whether the MPS is a 1 or 0. This allows the hardware needed for incrementing and decrementing the state to be reduced because the absolute value of the state is used to index the table and the computation of the absolute value of ones complement number is trivial. In another embodiment, for greater hardware efficiency, a state table can be replaced by a hardwired or programmable state machine. A hardwired state to code converter is one implementation of the state table.

Overview of the Balanced Parallel Entropy Coding System

The present invention provides a balanced parallel entropy coding system. The parallel entropy coding system includes both real-time encoding and real-time decoding performed in high speed/low cost hardware. The present invention may be used in numerous lossless coding applications, including, but not limited to, real-time compression/decompression of writeable optical disk or magnetic disk data, real-time compression/decompression of computer network data, real-time compression/decompression of image data in a compressed framestore in a multi-function (e.g., copier, facsimile, scanner, printer, etc.) machine, and real-time compression/decompression of audio data.

Specifying the performance of the encoder requires some attention. It is straightforward to design and encoder that achieves a certain rate for the original data given a sufficiently fast coded data channel. In many applications, however, the goal is for the encoder to utilize the coded data channel efficiently. Coded data channel utilization is impacted by the maximum burst rate of the original data interface, the encoder speed, and the compression achieved on the data. The impact of these effects must be considered over some local amount of data which is dependent on the amount of buffering in the encoder. It is desirable to have an encoder that utilizes the coded data channel efficiently white maintaining encoder speed and high compression and still accommodating the maximum burst rate.

The following description describes the encoder of the present invention. A decoder that may be used with the encoder is also described.

Real-time Encoding in the Present Invention

FIG. 6 is a block diagram of the encoding system of the present invention. In one embodiment, the encoder of the present invention performs real-time encoding. Referring to FIG. 6, the encoding system 600 includes an encoder 602 coupled to a context model (CM) & state memory 603 for generating coded information in the form of codeword information 604 in response to original data 601. Codeword information 604 is received by a reorder unit 606, which is coupled to a reorder memory 607. In response to codeword information 604, reorder unit 606 in cooperation with reorder memory 607 generates coded data stream 608. It should be noted that the encoding system 600 is not limited to operating on codewords, and may, in other embodiments operate on discrete analog waveforms, variable length bit patterns, channel symbols, alphabets, events, etc., using the teachings of the present invention.

Encoder 602 includes a context model (CM), a probability estimation machine (PEM) and a bitstream generator (BG). The context model and PEM (probability estimation machine) in encoder 602 are essentially identical to those in the decoder (except the direction of data flow). The bit generator of encoder 602 is similar to the decoder bit generator, and is described below. The result of the coding by encoder 602 is the output of zero or more bits that represent the original data. In one embodiment, the output of the bitstream generator also includes one or more control signals. These control signals provide a control path to the data in the bit stream. In one embodiment, the codeword information may comprise a start of run indication, an end of run indication, a codeword and an index identifying the run count (whether it be by context or probability class) for the codeword. One embodiment of the bitstream generator of the present invention is described below.

Reorder unit 606 receives the bits and control signals generated by the bit stream generator (if any) of coder 602 and generates coded data. In one embodiment, the coded data output by reorder unit 606 comprises a stream of interleaved words.

In one embodiment, reorder unit 606 performs two functions. Reorder unit 606 moves codewords from the end of runs as created by the encoder to the beginning of runs as needed by the decoder and combines variable length codewords into fixed length interleaved words and outputs them in the proper order required by the decoder.

The recorder unit 606 uses a temporary reordering memory 607. In one embodiment, where encoding is performed on a workstation, temporary recording memory 607 can be over 100 Megabytes in size. In the balanced system of the present invention, the temporary recording memory 607 is much smaller (e.g., approximately 1 Kbyte) and fixed. Thus, in one embodiment, real-time encoding is performed using a fixed amount of memory, even if this increases the memory required by the decoder or the bitrate (such as when an output is made prior to the completion of a run). The decoder of the present invention is able to determine the effects of the reorder unit's limited memory using, for instance, implicit, explicit or instream signaling (as described below). Reorder unit 606 has finite memory available for reordering, but the memory "needed" is unbounded. Both the effect of limited memory for end of run to beginning of run queue and for interleaved word reordering must be considered.

In one embodiment, the encoding system (and corresponding decoding system) of the present invention performs the encoding (or decoding) using a single integrated circuit chip. In another embodiment, a single integrated circuit contains the encoder system of the present invention, including its encoder and decoder, and memory. A separate external memory may be added to aid in encoding. A multi-chip module or integrated circuit may contain both the encoding/decoding hardware and the memory. The encoding system of the present invention may attempt to increase the effective bandwidth by up to a factor of N. If the compression achieved is less than N:1, then the coded data channel will be fully utilized but the effective bandwidth increase achieved is only equal to the compression rate. If the compression achieved is greater then N:1, then the effective bandwidth is achieved with extra bandwidth being writable. In both cases, the compression achieved must be over a local region of the data defined by the amount of buffering present in the encoding system.

The Bit Generator for the Encoder of the Present Invention

FIG. 7 shows one embodiment of the encoder bit generator of the present invention. Bit generator 701 is coupled to receive a probability class and an uncoded bit (e.g., an MPS or LPS indication) as inputs. In response to the inputs, bit generator 701 outputs multiple signals. Two of the outputs are control signals that indicate the start of the run and the end of a run (each codeword represents a run), start signal 711 and end signal 712 respectively. It is possible for a run to start and end at the same time. When a run starts or ends, "index" output 713 comprises an indication of the probability class (or context) for the uncoded bit. In one embodiment, index output 713 represents a combination of the probability class for the bit and a bank identification for systems in which each probability class is replicated in several banks of memory. Codeword output 714 is used to output a codeword from bit generator 701 when a run ends.

A memory 702 is coupled to bit generator 701 and contains the run count for a given probability class. During bit generation, bit generator 701 reads from memory 702 using the index (e.g., probability class). After reading from memory 702, bit generator 701 performs bit generation as follows. First, if the run count equals zero, then start signal 711 is asserted indicating the start of a run. Then, if the uncoded bit is equal to the LPS, then end signal 712 is asserted indicating the end of the run. Also if the uncoded bit equals an LPS, codeword output 714 is set to indicate that the codeword is a 1N codeword and the run count is cleared, e.g., set to zero (since its the end of the run). If the uncoded bit does not equal the LPS, then the run count is incremented and a test determines if the run count equals the maximum run count for the code. If so, then end signal 712 is asserted, codeword output 714 is set to zero and the run count is cleared (e.g., run count is set to zero). If the test determines that the run count does not equal the maximum for the code, then the run count is incremented. Note that index signal 713 represents the probability class received as an input.

In the present invention, the generation of 1N codewords is performed such that their length can be determined without any additional information. Table 12 illustrates 1N codewords representations of R3(2) codewords for the decoder and encoder. The decoder expects that the "1" bit in a "1N" codeword be the LSB and that "N" count portion is in the proper MSB . . . LSB order. In decoder order, the variable length codeword cannot be distinguished from zero padding without knowing which particular code is used. In encoder order; the codeword is reversed and the position of the most significant "1" bit indicates the length of "1N" codewords. To generate codewords in encoder order, the complement of the count value must be reversed. This can be accomplished by reversing the 13-bit count and then shifting it so that it is aligned to the LSB. As described in detail below, the bit pack unit reverses the codewords back into decoder order. However, this reversal of codewords causes no increased complexity of the bit pack unit 606 since it must performing shifting anyway.

TABLE 12

"1N" Codeword Representations for R3(2) Codewords

| uncoded data | code-word | reverse of count value | decoder order | encoder order (count value is underlined) |
|---|---|---|---|---|
| 000000 | 0 | | 0000000000000 | 0000000000000 |
| 000001 | 1000 | 00 | 000000000001 | 000000001000 |
| 00001 | 1010 | 01 | 000000000101 | 000000001010 |
| 0001 | 1001 | 10 | 000000001001 | 000000001001 |
| 001 | 1011 | 11 | 000000001101 | 000000001011 |
| 01 | 110 | 0 | 000000000011 | 000000000110 |
| 1 | 111 | 1 | 000000000111 | 000000000111 |

For R3 codes, generating "N" codewords also requires that the bit following the "1" indicate whether a short or long count is present.

By using multiple banks of memory, the present invention allows pipelining. For instance, in the case of a multi-ported memory, a read operation occurs to memory for an uncoded bit while a write operation occurs to the memory for the previous uncoded bit.

An Altera AHDL Sample Design

One embodiment of the encoder bit generator of the present invention comprises a FPGA. The design handles all R2 and R3 codes up to R2(12). The AHDL (Altera Hardware description language) source code is listed below.

The design comprises multiple parts, as shown in FIG. 13. First, "ENCBG" 1301 is the main part of the design which has the logic to handle the start, end and continuation of runs. Second, "KEXPAND" 1302 is used to expand the probability class into the maximum run length, a variable length mask, and the length of the first long codeword for R3 codes. "KEXPAND" 1303 is identical to the decoder function with the same name. Third, the "LPSCW" 1304 part takes a count value and information about the probability class as inputs and generates the proper "1N" codeword.

The design uses two pipeline stages. During the first pipeline stage, the count is incremented, the probability class is expanded, and a subtraction and comparison for long R3 codewords is performed. All of the other operations are performed during the second pipeline stage.

The Reorder Unit of the Present Invention

FIG. 8 is a block diagram of one embodiment of the reorder unit. Referring to FIG. 8, reorder unit 606 comprises a run count reorder unit 801 and a bit packing unit 802. Run count reorder unit 801 moves codewords from the end of runs as created by the encoder to the beginning of runs as needed by the decoder, while bit packing unit 802 combines variable length codewords into fixed length interleaved words and outputs them in the proper order required by the decoder.

A "snooper" decoder can be used to reorder for any decoder, in which a decoder is included in the encoder and provides requests for data in an order in which the codewords will be needed by the real decoder. To support a snooper decoder, reordering of run counts might have to be done independently for each stream. For decoders that can be modeled easily, multiple time stamped queues or a single merged queue may be used to allow reordering. In one embodiment, reordering each codeword can be accomplished using a queue-like data structure and is independent of the use of multiple coded data streams. A description of how the reordering may be performed is given below.

The first reordering operation that is performed in the encoder is to reorder each of the run counts so that the run count is specified at the beginning of the run (as the decoder requires for decoding). This reordering is required because the encoder does not determine what a run count (and codeword) is until the end of a run. Thus, the resulting run count produced from coding the data is reordered so that the decoder is able to properly decode the run counts back into the data stream.

Referring back to FIG. 8, reorder unit 606 of the present invention comprises run count reorder unit 801 and bit pack unit 802. Run count reorder unit 801 is coupled to receive multiple inputs that include start signal 711, end signal 712, index signal 713 and codeword 714. These signals will be described in more detail in conjunction with the run count reorder unit of FIG. 9. In response to the inputs, the run count reorder unit 801 generates codeword 803 and signal 804. Signal 804 indicates when to reset the run count. Codeword 803 is received by bit pack unit 802. In response to codeword 803, bit pack unit 802 generates interleaved words 805.

Run count reorder unit 801 and bit pack unit 802 are described in further detail below.

Run Count Reorder Unit

As described above, the decoder receives codewords at the time the beginning of the data coded by the codeword is needed. However, the encoder does not know the identity of the codeword until the end of the data coded by the codeword.

A block diagram of one embodiment of the run count reorder unit 801 is described in FIG. 9. The described embodiment accommodates four interleaved streams, where each interleaved word is 16 bits, and the codewords vary in length from one to thirteen bits. In such a case, the reorder unit 300 may be pipelined to handle all streams. Furthermore, an encoder that associates run counts with probability classes is used such that the maximum number of run counts that can be active at any time is small, and is assumed to be 25 for this embodiment. Note that the present invention is not limited to four interleaved streams, interleaved words of 16 bits or codeword lengths of 1 to 13 bits, and may be used for more or less streams with interleaved words of more or less than 16 bits and codeword lengths that extend from 1 bit to over 13 bits.

Referring to FIG. 9, a pointer memory 901 is coupled to receive index input 713 and produces an address output that is coupled to one input of multiplexer (MUX) 902. Two other inputs of MUX 902 are coupled to receive an address in the form of a head pointer from head counter 903 and an address in the form of a tail pointer from tail counter 904. The output of MUX 902 is an address coupled to and used to access a codeword memory 908.

Index input 713 is also coupled to as an input to MUX 905. Another input of MUX 905 is coupled to the codeword input 714. The output of MUX 905 is coupled to an input of valid detection module 906 and to a data bus 907. Data bus 907 is coupled to codeword memory 908 and an input of MUX 905. Also coupled to data bus 907 is an output of control module 909. Start input 711 and end input 712 are coupled to separate inputs of control module 909. The outputs of valid detection module 906 comprise the codeword output 803 and the signal 804 (FIG. 8). Run count reorder unit 801 also comprises controller logic (not shown to avoid obscuring the present invention) to coordinate the operations of the various components of run count reorder unit 801.

To reiterate, index input 713 identifies a run. In one embodiment, the index indicates one of 25 probability classes. In such a case, five bits are needed to represent the index. Note that if multiple banks of probability classes are used, then extra bits might be required to specify the particular bank. In one embodiment, the index input identifies the probability class for the run count. Codeword input 714 is the codeword when the end of a run occurs and is a "don't care" otherwise. Start input 711 and end input 712 are control signals that indicate whether a run is beginning, ending, or both. A run begins and ends at the same time when the run consists of a single uncoded bit.

Run count reorder unit 801 reorders the run counts generated by the bit generator in response to its input signals. Codeword memory 908 stores codewords during reordering. In one embodiment, codeword memory 908 is larger that the number of run counts that can be active at one time. This leads to better compression. If the codeword memory is smaller than the number of run counts that can be active at one time, this would actually limit the number of active runcounts to the number that could be held in memory. In a system that provides good compression, it often occurs that while data for one codeword with a long runcount is being accumulated, many codewords with short runcounts will start (and perhaps end also). This requires having a large memory to avoid forcing out the long run before it is completed.

Pointer memory 901 stores addresses for codeword memory locations for probability classes that are in the middle of a run and addresses codeword memory 908 in a random access fashion. Pointer memory 901 has a storage location for the address in codeword memory 908 for each probability class that may be in the middle of a run. Once a run has completed for a particular probability class, the address stored in pointer memory 901 for that probability class is used to access codeword memory 908 and the completed codeword is written into codeword memory 908 at that location. Until that time, that location in codeword memory 908 contained an invalid entry. Thus, pointer memory 901 stores the location of the invalid codeword for each run count.

Head counter 903 and tail counter 904 also provide addresses to access codeword memory 908. Using head counter 903 and tail counter 904 allow codeword memory 908 to be addressed as a queue or circular buffer (e.g., a first in, first out [FIFO] memory). Tail pointer 904 contains the address of the next available location in codeword memory 908 to permit the insertion of a codeword into codeword memory 908. Head counter 903 contains the address in codeword memory 908 of the next codeword to be output. In other words, head counter 903 contains the codeword memory address of the next codeword to be deleted from codeword memory 908. A location for each possible index (e.g., probability class) in pointer memory 901 is used to remember where tail pointer 904 was when a run was started so that the proper codeword can be placed in that location of codeword memory 908 when the run ends.

Control module 909 generates a valid signal as part of the data stored in codeword memory 908 to indicate whether or not an entry stores valid codeword data. For instance, if the valid bit is at a logical 1, then the codeword memory location contains valid data. However, if the valid bit is at a logic 0, then the codeword memory location contains invalid data. Valid detect module 907 determines if a memory location contains a valid codeword each time a codeword is read out from codeword memory 809. In one embodiment, the valid detection module 907 detects whether the memory location has a valid codeword or a special invalid code.

When starting a new run, an invalid data entry is put in codeword memory 908. The invalid data entry acts as space holders in the stream of data stored in codeword memory 908, such that the codeword for the run may be stored in the memory in the correct location (to ensure proper ordering to model the decoder) when the run has completed. In one embodiment, the invalid data entry includes the index via MUX 905 and an invalid indication (e.g., an invalid bit) from control module 909. The address in codeword memory 908 at which the invalid entry is stored is given by tail pointer 904, and subsequently stored in pointer memory 901 as a reminder of the location for the run count in codeword memory 908. The remainder of the data that appears between head pointer 903 and tail pointer 904 in codeword memory 908 as completed run counts (e.g., reordered run counts). The maximum number of invalid memory locations is 0 to I-1 where I is the number of run counts. When a codeword is complete at the end of a run, the run count is filled in codeword memory 908 using the address stored in pointer memory 901.

When a run starts, the index for the run is stored in codeword memory 908, so that if codeword memory 908 is full but the run is not yet complete, the index is used in conjunction with signal 804 to reset the corresponding run counter. In addition to storing codewords or indices in codeword memory 908, one bit, referred to herein as the "valid" bit, is used to indicate which of these two types of data is stored.

If not starting or ending a run, the run count reorder unit is idle. If starting a run and not ending a run and if the memory is full, then a codeword is output from codeword memory 908. The codeword that is output is the codeword stored at the address contained in head pointer 903 for that probability class. Then, if starting a run and not ending a run (irrespective of whether the memory is full), index input 713 is written into codeword memory 908 via MUX 905 at the address designated by tail pointer 904. Tail pointer 904 is then written into pointer memory 901 at an address designated by the data on index input 713 (e.g., at the location in pointer memory 901 for the probability class). After writing tail pointer 904, tail pointer 904 is incremented.

If ending a run and not starting a run, then the address stored in the pointer memory 901 corresponding to the index (probability class) is read out and used as the location in the codeword memory to store the completed codeword on codeword input 714.

If starting a run and ending a run (i.e., a run both begins and ends at the same time), and the memory is full, then a codeword is output from codeword memory 908. Then, if starting a run and ending a run (irrespective of whether the memory is full), codeword input 714 is written into codeword memory 908 at the address specified by tail pointer 904. Tail pointer 904 is then incremented to contain the next available location (e.g., increment by 1).

In the present invention, run count reorder unit 801 may output codewords at different times. In one embodiment, codewords may be output when they are valid or invalid. Codewords may be output when invalid if a memory full condition exists and a run has not completed. Invalid codewords may also be output to maintain a minimum rate (i.e., for rate control). Also, invalid codewords may be output to flush codeword memory 908 when all of the data has undergone run count reordering or when the run count reorder unit jumps to the middle of codeword memory 908 as a result of a reset operation. Note that in such a case, the decoder must be aware that the encoder is operating in this way.

As described above, a codeword is output whenever the codeword memory 908 is full. Once the memory is full, whenever an input (i.e., starting a new codeword) to the codeword memory 908 is made, an output from the codeword memory 908 is made. Note that an update to an entry does not cause an output from the codeword memory 908 when a memory full condition exists. That is, the completion of a run followed by the writing of the resulting codeword into its previously assigned memory location does not cause a memory full output to occur. Similarly, when a run ends and the corresponding address in pointer memory 901 and the address in the head counter 903 are the same, the codeword can be output immediately and the head counter 903 can then be incremented without accessing the codeword memory 908. In one embodiment, a memory full condition occurs when the tail pointer 904 is equal the head pointer 903 after the tail pointer has been incremented. Therefore, once the tail pointer 904 has been incremented, the controller logic in the run count reorder unit 801 compares the tail pointer 904 and the head pointer 903 and if the same, the controller logic determines that the codeword memory 908 is full and that a codeword should be output. In another embodiment, codewords may be output prior to the memory being full. For instance, if the portion of the queue addressed by the head contains valid codewords, it may be output. This requires that the beginning of the queue be repeatedly examined to determine the status of the codewords therein. Note that the codeword memory 908 is emptied at the end of coding of file.

Using run count reorder unit 801, a codeword is output by first reading a value (e.g., data) from codeword memory 908 at an address specified by head pointer 903. The outputting of codewords is controlled and coordinated using controller logic. Valid detection module 906 performs a test to determine if the value is a codeword. In other words, valid detection module 906 determines if the codeword is valid. In one embodiment, valid detection module 906 determines the validity of any entry by checking the validity bit stored with each entry. If the value is a codeword (i.e., the codeword is valid), then the value is output as a codeword. On the other hand, if the value is not a codeword (i.e., the codeword is invalid), then any codeword may be output which has a run of MPSs at least as long as the current run count. The "0" codeword is one codeword that correctly represents the current run thus far, and may be output. After the output has been made, head pointer 903 is incremented to the next location in codeword memory 908 Alternatively, using the "1N" with the shortest allowable run lengths allows the decoder to check only whether a codeword has been forced out before emitting a LPS.

In one embodiment, run count reorder unit 801 operates with a two clock cycle time. In the first clock cycle, inputs are received into run count reorder unit 801. In the second clock cycle, an output from codeword memory 908 occurs.

While codewords may be output whenever head pointer 903 addresses a valid codeword, it may be desirable in some implementations to only output a codeword when the buffer is full. This causes the system to have a fixed delay in terms of a number of codewords, instead a variable delay. If memory 908 is able to hold a predetermined number of codewords, between the time when a run is started and is input and when is output, the delay is that number of codewords since an output it is not made until it is full. Thus, there is constant delay in codewords. Note that the reordering delay is still variable in other measures, for example, the amount of coded or original data. By allowing memory 908 to fill up prior to producing an output, the output generates a codeword per cycle.

Note that if a codeword memory location is marked as invalid, the unused bits may be used to store an identification of what run count it is for (i.e., the context bin or probability class that must fill the location is stored therein). This information is useful for handling the case where the memory is full. Specifically, the information may be used to indicate to the bit generator that a codeword for this particular run length was not finished and that it must be finished now. In such a case, a decision has been made to output an invalid codeword, which may have occurred due to a memory full condition. Thus, when the system resets the run counter, the information indicates when, in terms of bit generators and run counts, the system is to begin again.

With respect to the index input, for pipelining reasons when banks of probability classes are used, the index may include a bank identifier. That is, there may be multiple run counts for a particular probability class. For instance, two run counts may be used for the 80 percent code, where one is used and then the other.

Since the codewords are variable length, they must be stored in codeword memory 908 in a manner that allows their length to be determined. While it would be possible to store the size explicitly, this would not minimize memory usage. For R-codes, storing a value of zero in memory can indicate a one bit "0" codeword and the "1N" codewords can be stored such that a priority encoder can be used to determine the length from the first "1" bit.

If codeword memory 908 is multi-ported (e.g., dual ported), this design can be pipelined to handle one codeword per one clock cycle. Because any location in codeword memory 908 could be accessed from multiple ports, a location in codeword memory 908 may be written, such as when an invalid or codeword is being stored, while another portion may be read, such as when a codeword is being output. Note that in such a case, the mutliplexers may have to be modified to support the multiple data and address buses.

Whenever the encoder outputs a "0" codeword and resets a run counter because the codeword memory is full, the decoder must do the same. This requires the decoder to model the encoder's codeword memory queue. How this is accomplished will be discussed below.

Note that to save power in CMOS implementations, counters can be disabled for "1N" codewords when "0" codewords are output for invalid runs. This is because a "1N" codeword being decoded is valid, while only a "0" codeword may be invalid.

Alternative Embodiment Based on Context

FIG. 10 is a block diagram for another embodiment of a run count reorder unit that reorders data received according to context (as opposed to probability class). The run count reorder unit 1000 performs reordering using the R-codes. Referring to FIG. 10, the reorder unit 1000 includes a pointer memory 1001, a head counter 1002, a tail counter 1003, a data multiplexer (MUX) 1004, an address MUX 1005, a compute length block 1006, a valid detect block 1007, and a codeword memory 1008. Codeword memory 1008 stores codewords during reordering. Pointer memory 1001 stores addresses for codeword memory locations for context bins that are in the middle of a run. Head counter 1002 and tail counter 1003 allow codeword memory 1008 to be addressed as a queue or circular buffer in addition to being addressed in random access fashion by the pointer memory 1001. For R-codes, storing a value of zero in memory can indicate a one bit "0" codeword and the "1N" codewords can be stored such that a priority encoder can be used to determine the length from the first "1" bit. Compute length module 1006 operates like a priority encoder. (If other variable length codes were used, it would be more memory efficient to add a "1" bit to mark the start of the codeword than to add $log_2$ bits to explicitly store the length.) Run count reorder unit 1000 also includes backstage controller logic to coordinate and control the operation of the components 1001–1008.

The operation of the run count reorder unit 1000 is very similar to the run count reorder unit that is based on probability estimates. If starting a new run, then an invalid entry including the context bin is written into codeword memory 1008 at the address indicated by tail pointer 1003. Tail pointer 1003 address is then stored in pointer memory 1001 at the address of the context bin of the current run count. Tail pointer 1003 is then incremented. When completing a run, then the pointer in pointer memory 1001 corresponding to the run count is read from pointer memory 1001 and the codeword is written in parallel into codeword memory 1008 at a location designated by that pointer. If neither starting or ending a run, and if a location in codeword memory 1008 designated by the address of head pointer 1002 does not contain invalid data, then the codeword addressed by the head is read and output. Head pointer 1002 is then incremented. For the case when a run both begins and ends at the same time, the codeword is written into codeword memory 1008 at the address designated by tail pointer 1003 and then tail pointer 1003 is incremented.

Similarly, when a run ends and the corresponding address in pointer memory 1001 and the address in head counter 1002 are the same, the codeword can be output immediately and value in head counter 1002 can be incremented without accessing codeword memory 1008.

For run count "by context" systems, every context requires a memory location in pointer memory 1001, so the width of the BG and PEM state memory can be extended to implement this memory. The width of pointer memory 1001 is equal to the size needed for a codeword memory address.

The number of locations in codeword memory 1008 can be chosen by the designer in a particular implementation. The limited size of this memory reduces compression efficiency, so there is a cost/compression trade-off. The width of the codeword memory is equal to the size of the largest codeword plus one bit for a valid/invalid indication.

An example using the R2(2) code, show in Table 13 below, will be used to illustrate reordering. Table 14 shows the data to be reordered (0=MPS, more probable symbol; 1=LPS, less probable symbol), labeled by context. There are only two contexts. The uncoded bit numb, $\tau$ indicates time in uncoded bit clock cycles. Start and end of runs are indicated and codewords are shown at the end of runs.

TABLE 13

R2(2) Code

| Original | Codeword |
|---|---|
| 0000 | 0 |
| 0001 | 100 |
| 001 | 110 |
| 01 | 101 |
| 1 | 111 |

TABLE 14

Example Data to be Encoded

| Uncoded bit number | Data | Context | Start/End of Run | Codeword |
|---|---|---|---|---|
| 1 | 0 | 0 | S | |
| 2 | 0 | 1 | S | |
| 3 | 0 | 0 | | |
| 4 | 1 | 1 | E | 101 |
| 5 | 0 | 0 | | |
| 6 | 0 | 1 | S | |
| 7 | 0 | 0 | E | 0 |
| 8 | 1 | 1 | E | 101 |
| 9 | 0 | 0 | S | |
| 10 | 0 | 1 | S | |
| 11 | 0 | 0 | | |
| 12 | 0 | 1 | | |
| 13 | 0 | 0 | | |
| 14 | 0 | 1 | | |
| 15 | 1 | 0 | E | 100 |
| 16 | 0 | 1 | E | 0 |

The reordering operation for the example data is shown in Table 15. A codeword memory with four locations, 0–3, is used, which is large enough to not overflow in this example. Each row shows the state of the system after an operation which is either the start or end of run for a certain context or the output of a codeword. An "x" is used to indicate memory locations that are "don't care". For some uncoded bits, a run neither starts or ends so the run count reorder unit is idle. For coded bits that end runs, one or more codewords can be output, which may cause several changes to the system state.

TABLE 15

Example of Reordering Operations

| Uncoded bit number | Input | pointers | | pointer memory | | codeword memory | | | | Output |
|---|---|---|---|---|---|---|---|---|---|---|
| | | head | tail | 0 | 1 | 0 | 1 | 2 | 3 | |
| 1 | start 0 | 0 | 1 | 0 | x | invalid | x | x | x | |
| 2 | start 1 | 0 | 2 | 0 | 1 | invalid | invalid | x | x | |

TABLE 15-continued

Example of Reordering Operations

| Uncoded bit number | Input | pointers head | tail | pointer memory 0 | 1 | codeword memory 0 | 1 | 2 | 3 | Output |
|---|---|---|---|---|---|---|---|---|---|---|
| 3 | | | | | (reordering unit idle) | | | | | |
| 4 | end1,101 | 0 | 2 | 0 | x | invalid | 101 | x | x | |
| 5 | | | | | (reordering unit idle) | | | | | |
| 6 | start 1 | 0 | 3 | 0 | 2 | invalid | 101 | invalid | x | |
| 7 | end0,0 | 0 | 3 | x | 2 | 0 | 101 | invalid | x | |
| | | 1 | 3 | x | 2 | x | 101 | invalid | x | 0 |
| | | 2 | 3 | x | 2 | x | x | invalid | x | 101 |
| 8 | end1,101 | 2 | 3 | x | x | x | x | 101 | x | |
| | | 3 | 3 | x | x | x | x | x | x | 101 |
| 9 | start 0 | 3 | 0 | 3 | x | x | x | x | invalid | |
| 10 | start 1 | 3 | 1 | 3 | 0 | invalid | x | x | invalid | |
| 11 | | | | | (reordering unit idle) | | | | | |
| 12 | | | | | | | | | | |
| 13 | | | | | | | | | | |
| 14 | | | | | | | | | | |
| 15 | end0,100 | 3 | 1 | x | 0 | invalid | x | x | 100 | |
| | | 0 | 1 | x | 0 | invalid | x | x | x | 100 |
| 16 | end1,0 | 0 | 1 | x | x | 0 | x | x | x | |
| | | 1 | 1 | x | x | x | x | x | x | 0 |

Referring to Table 15, the head and tail pointers are initialized to zero, indicating that nothing is contained in the codeword memory (e.g., queue). The pointer memory is shown having two storage locations, one for each context. Each location has "don't care" values prior to bit number one. The codeword memory is shown with a depth of four codewords, all initially "don't care" values.

In response to the data received for bit number 1, the head pointer remains pointing to codeword memory location 0. Since the decoder will expect data, the next available codeword memory location, 0, is assigned to the codeword and an invalid value is written into the memory location 0. Because the context is zero, the address of the codeword memory location assigned to the codeword is stored in pointer memory location for the zero context (pointer memory location 0). Thus, a "0" is stored in pointer memory location 0. The tail pointer is incremented to the next codeword memory location 1.

In response to the data corresponding to bit number 2, the head counter remains pointing to the first memory location (since there has not been an output causing it to increment). Since the data corresponds to the second context, context 1, the next codeword memory location is assigned to the codeword as codeword memory location 1 as indicated by the tail pointer and an invalid value is written into the location. The address, codeword location 1, is written into the pointer memory location corresponding to context 1. That is, the address of the second codeword memory location is written into the pointer memory location 1. The tail pointer is then incremented.

In response to the data corresponding to bit number 3, the reorder unit is idle since a run is not starting or ending.

In response to the data corresponding to bit number 4, an end of a run is indicated for context 1. Therefore, the codeword "101" is written into the codeword memory location assigned to context 1 (codeword memory location 1) as indicated by the pointer memory location for context 1. The head and tail pointers remain the same, and the value in the pointer memory location for context 1 will not be used again, so it is "don't care".

In response to the data corresponding to bit number 5, the reorder unit is idle since a run is not starting or ending.

In response to the data corresponding to bit number 6, the same type of operations as described above for bit 2 occur.

In response to the data corresponding to bit number 7, the end of the run for the codeword for context 0 occurs. In this case, the codeword "0" is written into the codeword memory location (codeword memory location 0) as indicated by the pointer memory location for context 0 (pointer memory location 0). Then the value on the pointer memory location will not be used again, such that it is a "don't care." Also the codeword memory location designated by the head pointer contains valid data. Therefore, the valid data is output and the head pointer is incremented. Incrementing the head pointer causes it to point at another codeword memory location containing a valid codeword. Therefore, this codeword is output and the head pointer is incremented again. Note that in this example, codewords are output when they are able, as opposed to when the codeword memory is completely full.

Processing through the uncoded bits continues to occur according to the description above. Note that the codeword memory locations are not dedicated for use with particular contexts, such that codewords from any of the contexts may be stored in a particular codeword memory location throughout the coding of a data file.

The Bit Pack Unit

Bit packing is illustrated in FIG. 4 where data processed by the reorder unit before and after bit packing is shown. Referring back to FIG. 4, sixteen variable length codewords are shown, numbered 1 through 16 to indicate the order of use by the decoder. Every codeword is assigned to one of three coded streams. The data in each coded stream is broken into fixed length words called interleaved words. (Note that a single variable length codeword may be broken into two interleaved words.) In this example, the interleaved words are ordered in a single interleaved stream such that the order of first variable length codeword (or partial codeword) in a particular interleave word determines the order of the interleaved word. Other types of ordering criteria may be performed. The advantage of interleaving the multiple coded streams is that a single coded data channel to transfer data can be used and that variable length shifting can be performed for each stream in a parallel or in a pipeline.

The bit pack unit 802 of the present invention receives the variable length codewords from the run count reorder unit 801 and packs them into interleaved words. The bit pack unit 802 comprises logic to perform the handling of variable length codewords and a merged queue type reordering unit to output fixed length interleaved words in the correct order. In one embodiment, the codewords are received from the run count reorder unit at a rate of up to one codeword per clock cycle. A block diagram of one embodiment of the bit pack unit 802 is shown in FIG. 11. In the following embodiment, four interleaved streams are used, each interleaved word is 16-bits, and codewords vary in length from one to thirteen bits. In one embodiment, a single bit pack unit is pipelined to handle all streams. If the bit pack unit 802 of the present invention uses a dual-ported memory (or register file), it can output one interleaved word per clock cycle. This may be faster than required to keep up with the rest of the encoder.

Referring again to FIG. 11, the bit pack unit 802 includes packing logic 1101 a stream counter 1102, memory 1103, tail pointers 1104 and a head counter 1105. Packing logic 1101 is coupled to receive the codewords and is coupled to stream counter 1102. Stream counter 1102 is also coupled to the memory 1103. Also coupled to memory 1103 are tail pointers 1104 and head counter 1105.

Stream counter 1102 keeps track of the interleaved stream with which the current input codeword is associated. In one embodiment, stream counter 1102 repeatedly counts the streams from 0 to N-1, where N is the number of streams. Once stream counter 1102 reaches N-1, it begins counting from 0 again. In one embodiment, stream counter 1102 is a two-bit counter and counts from 0 to 3 (for four interleaved streams). In an embodiment, stream counter 1102 is initialized to zero (e.g., through global reset).

Packing logic 1101 merges the current input codeword with previously input codewords to form interleaved codewords. The length of each of the codewords may vary. Therefore, packing logic 1101 packs these variable length codewords into fixed length words. The interleaved codewords created by packing logic 1101 are output to memory 1103 in order and are stored in memory 1103 until the proper time to output them. In one embodiment, memory 1103 is a static random access memory (SRAM) or a register file with sixty-four 16-bit words.

The interleaved words are stored in memory 1103. In the present invention, the size of memory 1103 is large enough to handle two cases. One case is the normal operation case where one interleaved stream has minimum length codewords and the other interleaved streams have maximum length codewords. This first case requires 3×13=39 memory locations. The other case is the initialization case where again one stream has minimum length, or short, codewords and the others have maximum length, or long, codewords. For the second case, while 2×3×13=78 memory locations are sufficient, the operation of the PEM allows a tighter bound of 56.

Memory 1103 in cooperation with stream counter 1102 and the tail pointers 1104 perform reordering. Stream counter 1102 indicates current stream of a codeword being received by memory 1103. Each interleaved streams is associated with at least one tail pointer. Tail pointers 1104 and head counter 1105 perform a reordering of the codewords. The reason for having two tail pointers per stream follows from interleave word N being requested by the decoder when data in interleaved word N-1 contains the start of the next codeword. One tail pointer determines the location in the memory 1103 to store the next interleaved word from a given interleaved stream. The other tail pointer determines the location in memory to store the interleaved word after the next one. This allows the location of interleaved word N to be specified when the decoder request time of interleaved word N-1 is known. In one embodiment, the pointers are eight 6-bit registers (two tail pointers per stream).

In one embodiment, at the start of encoding, the tail pointers 1104 are set such that the first eight interleaved words (two from each stream) are stored in the memory 1103 in sequence one from each stream. After initialization, whenever the packing logic 1101 begins a new interleaved word for a particular code stream, the "next" tail pointer is set to value of the "after next" tail pointer, and the "after next" tail pointer for the code stream is set to the next available memory location. Thus, there are two tail pointers for each stream. In another embodiment, only one tail pointer is used for each stream and indicates where the next interleaved word is to be stored in the memory 1203.

The head counter 1105 is used to determine the memory location of the next interleaved word to output from the bit pack unit 802. In the described embodiment, the head counter 1105 comprises a 6-bit counter that is incremented to output an entire interleaved word at a time.

The memory 1103, in addition to being used for reordering, can also be used as a FIFO buffering between the encoder and the channel. It may be desirable to have this memory bigger that what is required for reordering, so a FIFO-almost-full signal can be used to stall the encoder when the channel cannot keep up with the encoder. A one-bit-per-cycle encoder cannot generate one interleaved word per cycle. When an encoder is well matched to a channel, the channel will not accept an interleaved word every cycle, and some FIFO buffering is necessary. For example, a channel that can accept a 16-bit interleaved word every 32 clock cycles would be a well matched design for 2:1 effective bandwidth expansion when compression was 2:1 or greater.

The Packing Logic of the Present Invention

A block diagram of the packing logic is shown in FIG. 12. Referring to FIG. 12, the packing logic 1101 comprises a size unit 1201, a set of accumulators 1202, a shifter 1203, a MUX 1204, a set of registers 1205, and an OR gate logic 1206. Size unit 1201 is coupled to receive codewords and is coupled to accumulators 1202. The accumulators as well as the codewords are coupled to shifter 1203. Shifter 1203 is coupled to MUX 1204 and OR gate logic 1206. MUX 1204 is also coupled to registers 1205 and an output of OR gate logic 1206. The registers are also coupled to OR gate logic 1206.

In one embodiment, codewords are input on a 13-bit bus with unused bits zeroed. These zeroed unused bits are adjacent to the "1" in "1N" codewords so a priority encoder in size unit 1201 can be used to determine the length of the "1N" codewords and generate a size for "0" codewords.

Accumulators 1202 comprise multiple accumulators, one for each interleaved stream. The accumulator for each interleaved stream maintains a record of the number of bits already in the current interleaved word. In one embodiment, each accumulator comprises a 4-bit adder (with carry out) and a 4-bit register used for each stream. In one embodiment, the output of the adder is the output of the accumulator. In another embodiment, the output of the register is the output of the accumulator. Using the size of the codewords as received from size unit 1201, the accumulators determine the number of bits to shift to concatenate the current codeword into the register containing the current interleaved word for that stream.

Based on the current value of the accumulator, the shifter 1203 aligns the current codeword so it properly follows any previous codewords in that interleaved word. Thus, data in the encoder is shifted into decoder order. The output of shifter 1203 is 28 bits, which handles the case where a 13-bit codeword must be appended to 15 bits in the current interleaved word, such that bits from the current codeword end up in the higher 12 bits of the 28 bits being output. Note that shifter 1203 operates without feedback, and, thus, can be pipelined. In one embodiment, shifter 1203 comprises a barrel shifter.

Registers 1205 store bits in the current interleaved worlds. In one embodiment, a 16-bit register for each interleaved stream holds previous bits in the current interleaved word.

Initially, a codeword of a stream is received by shifter 1203, while size unit 1201 indicates the size of the codeword to the accumulator corresponding to the stream. The accumulator has an initial value of zero set through a global reset. Since the accumulator value is zero, the codeword is not shifted and is then ORed using OR logic 1206 with the contents of the register corresponding with the stream. However, in some embodiments, 1N codewords must be shifted to be properly aligned even at the start of an interleaved word. This register has been initialized to zero and, therefore, the result of the ORing operation is to put the codeword into the right-most bit positions of the output of OR logic 1206 and are feedback through MUX 1204 to the register for storage until the next codeword from the stream. Thus, initially shifter 1203 operates as a pass through. Note that the number of bits in the first codeword are now stored in the accumulator. Upon receiving the next codeword for that stream, the value in the accumulator is sent to the shifter 1203 and the codeword is shifted to the left that number of bits for combining with any previously input bits in the interleaved word. Zeros are placed in the other bit positions in the shifted word. Bits from the register corresponding to the stream are combined with bits from shifter 1203 using OR logic 1206. If the accumulator does not produce a carry out indication (e.g., signal), then more bits are required to complete the current interleaved word and the data resulting from the ORing operation is saved back into the register through MUX 1204. In one embodiment, MUX 1204 Comprises a 2:1 multiplexer. When the accumulator generates a carry out, the 16 bits of ORed data from OR logic 1206 are a complete interleaved word and are then output. MUX 1204 causes the register to be loaded with any additional bits (e.g., the upper 12 bits of the 28 bits output from the shifter 1203) after the first 16 and fills the rest with zeros.

The control for both MUX 1204 and the outputting of the interleaved word comprises the carry out signal from the accumulator. In one embodiment, the multiplexer 1204 comprises sixteen 2:1 multiplexers with 4 of these having one input that is always zero.

Reordering Options

The present invention provides multiple options for performing reordering on the data. For instance, in a system with multiple code streams, the code streams must be reordered into interleaved words as shown in FIG. 4. The present invention provides numerous ways to accomplish reordering into interleaved words.

One method for reordering data into interleaved words is to use a snooper decoder as shown in FIG. 25. Referring to FIG. 25, multiple run count reorder units $2501_{A-n}$ are coupled to receive codeword information along with the codeword stream. Each generates a codeword output and a size output. A separate bit packing logic (1101) unit, such as bit packing units $2502_{A-n}$, is coupled to receive the codeword and size outputs, from one of the run count reorder units $2501_{A-n}$. Bit packing logic units $2502_{a-n}$ output interleaved words that are coupled to both MUX 2503 and snooper decoder 2504. Decoder 2504 provides a select control signal that is received by MUX 2503 and indicates to MUX 2503 which interleaved word to output into the code stream.

Each coded data stream has a run count reorder unit, comprising run count reorder unit 801, in FIG. 8. Each bit pack unit combines variable length codewords into fixed size interleave words, perhaps 8, 16 or 32 bits per word. Each bit pack unit contains registers and shifting circuitry, as described above. Decoder 2504 comprises a fully operational decoder (including BG, PEM and CM) that has access to interleaved words from all bit pack units (either on separate buses as shown in FIG. 25 or via a common bus). Whenever decoder 2504 is selected an interleave word from one of the bit pack units, that word is transmitted in the code stream. Since the decoder at the receiving end will request the data in the same order as the identical snooper decoder, the interleaved words are transmitted in the proper order.

An encoder with a snooper decoder may be attractive in a half duplex system, since the snooper decoder can also be used as a normal decoder. An advantage of the snooper decoder approach is its applicability for any deterministic decoder. Alternative solutions, discussed below, without dependence on a snooper decoder, use simpler models of the decoder in order to reduce hardware cost. For the decoders that decode multiple codewords in the same clock cycle, modeling the decoder with less hardware than a decoder itself may not be possible, necessitating the use of a snooper decoder. As will be described below, for decoders that only decode at most one codeword per cycle, simpler models exist.

Another technique for reordering data for pipelined decoder systems that decode at most one code word per clock cycle is based on the fact that the only information needed to model the decoder's requests for coded data is to know the order of the codewords (considering all codewords, not the codewords for each coded data stream independently). If a time stamp is associated with each codeword when it enters the run count reorder unit, whichever bit packed interleaved word has the oldest time stamp associated with it is the next interleaved codeword to be output.

An exemplary encoder reordering unit is shown in block diagram form in FIG. 26. Referring to FIG. 26, the encoding system is the same as described in FIG. 25, except time stamp information is received by each run count reorder unit $2501_{A-n}$ as well. This time stamp information is also forwarded to bit pack units $2502_{A-n}$. Bit pack units $2502_{A-n}$ provide interleaved words to MUX 2503 and their associated time stamps to logic 2601. Logic 2601 provides a control signal to MUX 2503 to select the interleaved word to be output to the code stream.

In this embodiment, the snooper decoder is replaced by a simple comparison which determines which of bit pack units $2502_{a-n}$ has a codeword (or part of a codeword) with the oldest time stamp. Such a system appears to MUX 2503 as multiple queues with time stamps. Logic 2601 simply selects between various queues. The logic of each of run count reorder units $2503_{A-n}$ only changes slightly (from run count reorder unit 801) to write a time stamp when a run is started. Each run count reorder units $2501_{A-n}$ is equipped to store the time stamp in the codeword memory. Storing time stamps with enough bits to enumerate every codeword word in the coded data stream is sufficient, but in some embodiments, fewer bits may be used.

A short description of the steps used with multiple queues with time stamps appears below. The description is discernible to one skilled in the art. These are the encoder operations. No simplification has been done for the cases where a run is both started and ended by the same codeword. The operations can be checked for each symbol encoded (although in practice not all checks need to be made). Interleaved words are assumed to be 32 bits in size.

```
if (no current codeword for context) {
    place time in Queue (used to determine next Queue)
    place contest pointer in Queue
    place invalid data in Queue
    point context to Queue entry
    increment Queue tail
}
if (already a codeword and MPS) {
    increment context runcount
}
if (MAXRUN or LPS) {
    place correct data in Queue
    (context pointer unneeded)
    zero pointer & runcount in context memory
    update probability estimate in context memory
}
if (valid data at head of next queue) {
    place 32 bits of data on output
    clear Queue entry
    increment Queue head
}
while (any queue is almost full) {
    find the next Queue which must place data on the output
    while (less than 32 bits of valid data) {
        use context pointer to find context
        zero pointer & run count in context memory
        place MAXRUN code word in Queue data
    }
}
```

The decoder operations are similar although the codewords need not be saved in the queue. It is still necessary to save the time stamp of the codewords in the queue.

The function of the time stamps discussed above is used to store the order information of the codewords. An equivalent manner of expressing the same concept is through the use of a single queue for all codewords, i.e., a merged queue. In a merged queue system, as shown in FIG. 27, a single run count reorder unit 2701 is used for all interleaved stream is. Run count reorder unit 2701 generates codeword, size and stream outputs to bit pack units $2502_{A-n}$ output interleaved words to MUX 2503 and position information to logic 2702, which signals MUX 2503 to output interleaved words as part of the code stream.

For arbitrary streams, the run count reorder memory stores an interleaved stream ID for each codeword. Each interleaved Stream has its own head pointer. When a bit pack unit needs more data, the corresponding head pointer is used to fetch as many codewords as are needed to form a new interleaved word. This may involve looking at many codeword memory locations to determine which ones are part of the proper stream. Alternatively, this may involve looking to the codeword memory for additional fields to implement a linked list.

Another method of interleaving streams in the present invention uses a merged queue with fixed stream assignment. This method uses a single tail pointer as in the merged queue case, so no time stamps are required. Also, multiple head pointers are used as in the previous case, so there is no overhead in outputting the data from a particular stream. To accomplish this, the assignment of codewords to interleaved streams is performed according to the following rule, for N streams: codeword M is assigned to stream M modulo (mod) N. Note that interleaved streams can have codewords from any context bin or probability class according to this method. If the number of streams is a power of two, M mod N can be computed by discarding some of the more significant bits. For example, assume that the codeword reorder memory is addressed with 12 bits and that four interleaved streams are used. The tail pointer is 12 bits long, and the two least significant bits identify the coded stream for the next codeword. Four head pointers with 10 bits, each are implicitly assigned to each of the four possible combinations of the two least significant bits. Both the tail and head pointers are incremented as normal binary counters.

In the decoder, the shifter has registers to store interleaved words. The shifter presents properly aligned coded data to the bit generator. When the bit generator uses some coded data, it informs the shifter. The shifter presents properly aligned data from the next interleaved stream. If the number of coded data streams is N, the shifter has N-1 clock cycles to shift out the used data and perhaps request another interleaved codeword before that particular interleaved stream will be used again.

The Decoder Of the Present Invention

The present invention includes a decoder that supports the real-time encoder with limited reorder memory. In one embodiment, the decoder also includes reduced memory requirements and complexity by maintaining a run count for each probability class instead of each context bin.

One Embodiment of the Decoder System of the Present Invention

Figure 14A:
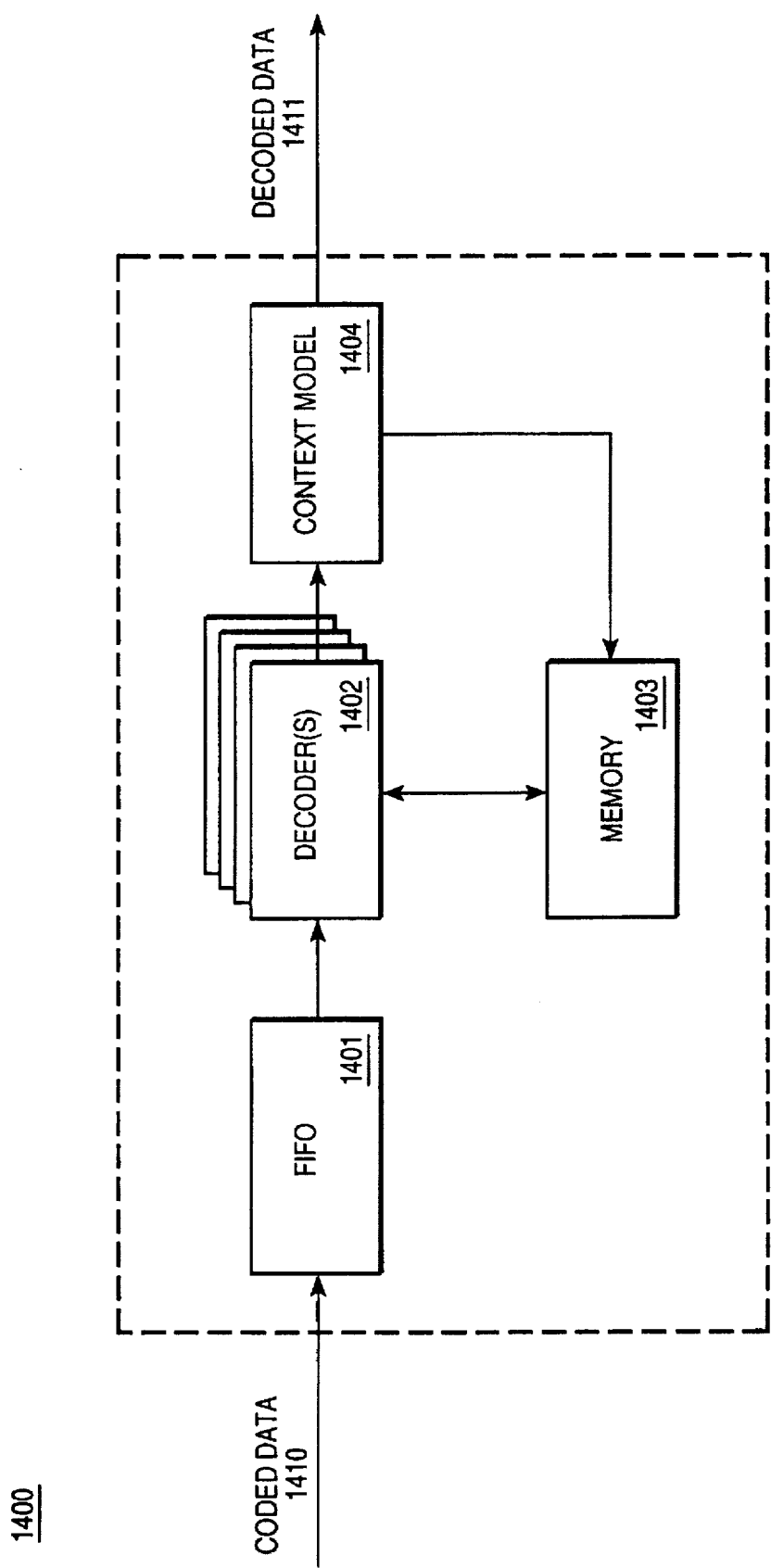
FIG. 14A is a block diagram of one embodiment of the decoding system of the present invention.

FIG. 14A illustrates a block diagram of one embodiment of the decoder hardware system of the present invention. Referring to FIG. 14A, the decoder system 1400 includes first-in/first-out (FIFO) structure 1401, decoders 1402, memory 1403, and context model 1404. Decoders 602 includes multiple decoders. Coded data 1410 is coupled to be received by FIFO structure 1401. FIFO structure 1401 is coupled to supply the coded data to decoder 1402. Decoders 1402 are coupled to memory 1403 and context model 1404. Context model 1404 is also coupled to memory 1403. One output of context model 604 comprises the decoded data 1411.

In system 1400, the coded data 1410 input into FIFO structure 1401 is ordered and interleaved. FIFO structure 1401 contains data in proper order. The streams are delivered to decoders 1402. Decoders 1402 requires data from these streams in a serial and deterministic order. Although the order in which decoders 1402 require the coded data is non-trivial, it is not random. By ordering the codewords in this order at the encoder instead of the decoder, the coded data can be interleaved into a single stream. In an, other embodiment, coded data 1410 may comprise a single stream of non-interleaved data, where data for each context bin, context class or probability class is appended onto the data stream. In this case, FIFO 1410 is replaced by a storage area 1410 to receive all of the coded data prior to forwarding the data to decoders 1402 so that the data may be segmented properly.

As the coded data 1410 is received by FIFO 1401, context model 1404 determines the current context bin. In one embodiment, context model 1404 determines the current context bin based on previous pixels and/or bits. Although not shown, line buffering may be included for context model 1404. The line buffering provides the necessary data, or template, by which context model 1404 determines the current context bin. For example, where the context is based on pixel values in the vicinity of the current pixel, line buffering may be used to store the pixel values of those pixels in the vicinity that are used to provide the specific context.

In response to the context bin, the decoder system 1400 fetches the decoder state from memory 1403 for the current context bin. In one embodiment, the decoder state includes the probability estimation module (PEM) state and the bit generator state. The PEM state determines which code to use to decode new codewords. The bit generator state maintains a record of the bits in the current run. The state is provided to decoders 1402 from memory 1403 in response to an address provided by context model 1404. The address accesses a location in memory 1403 that stores the information corresponding to the context bin.

Once the decoder state for the current context bin has been fetched from memory 1403, system 1400 determines the next uncompressed bit and processes the decoder state. Decoders 1402 then decode the new codeword, if needed, and/or updates the run count. The PEM state is updated, if needed, as well as the bit generation state. Decoders 1402 then write the new coder state into memory 1403.

Figure 14B:
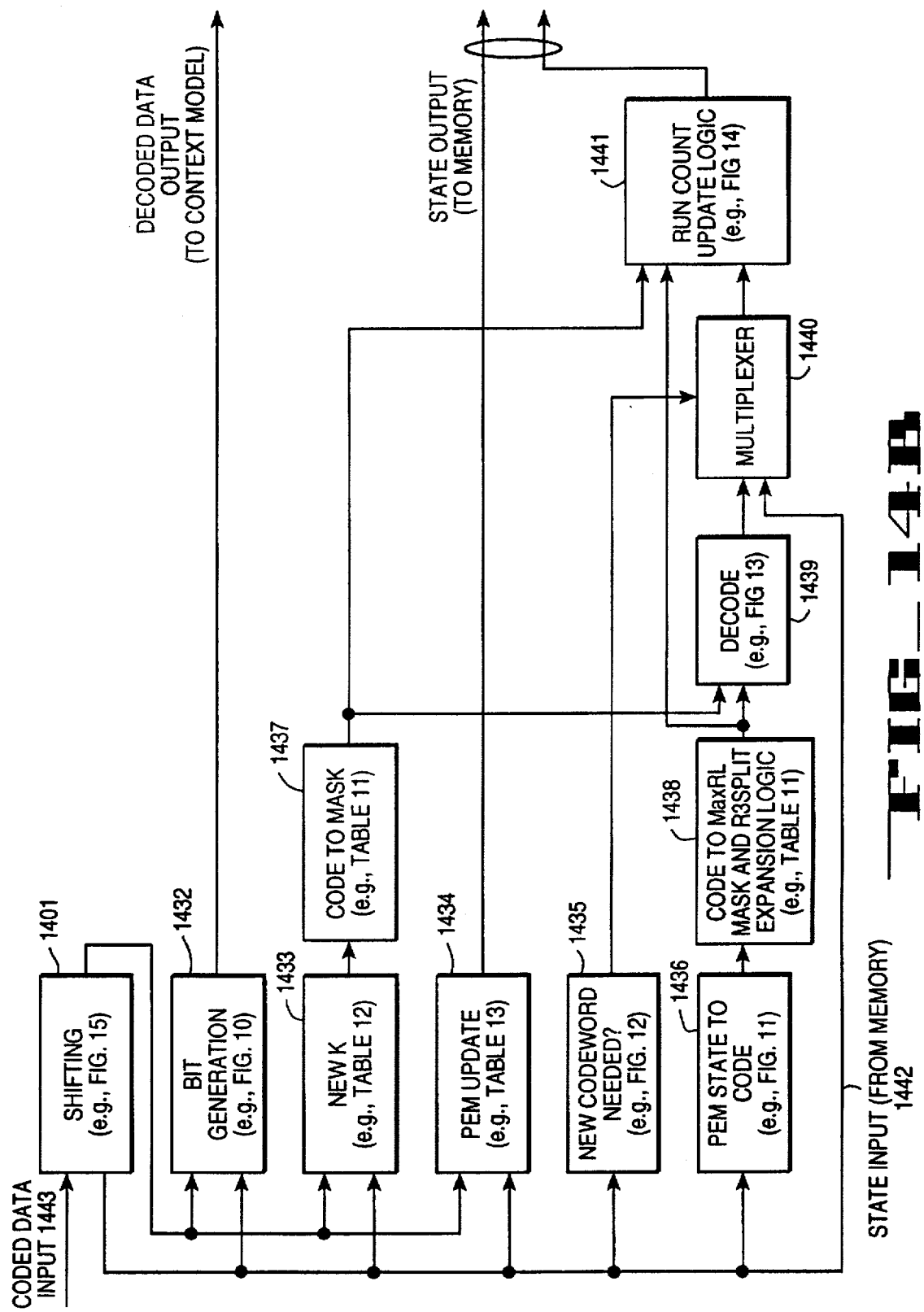
FIG. 14B is a block diagram of the decoder of the present invention.

FIG. 14B illustrates one embodiment of a decoder of the present invention. Referring to FIG. 14B, the decoder includes shifting logic 1431, bit generator logic 1432, "New k" logic 1433, PEM update logic 1434, New codeword logic 1435, PEM state to cache logic 1436, code-to-mask logic 1437, code-to-MaxPL, Mask, and R3Split expansion logic 1438, decode logic 1439, multiplexer 1440, and run count update logic 1441. Shifting ligic 1431 is coupled to receive the coded data input 1443, as well as the state input 1442 (from memory). The output of shifting logic 1431 is also coupled as an input to bit generation logic 1432, "new-k" generation logic 1433 and PEM update logic 1434. Bit generation logic 1432 is also coupled to receive the state input 1442 and generates the decoded data output to the context model. New-k logic 1433 generates an output that is coupled to an input of code-to-mask logic 1437. PEM update logic 1434 is also coupled to state input 1442 and generates the state output (to memory). State input 1442 is also coupled to inputs of new-codeword logic 1435 and PEM state-to-code logic 1436. The output of PEM state-to-code logic 1436 is coupled to be received by expansion logic 1438. The output of expansion logic 1438 is coupled to decode logic 1438 and run count update logic 1441. Another input to decode logic is coupled to the output of code-to-mask 1437. The output of decode logic 1439 is coupled to one input of MUX 1440. The other input of MUX 1440 is coupled to state input 1442. The selection input of MUX 1440 is coupled to the output of new codeword logic 1435. The output of MUX 1440 and expansion logic 1438 are coupled to two inputs of run count update logic 1441 with the output of code-to-mask logic 1437. The output of run count update logic 1441 is included in the state output to memory.

Shifting logic 1431 shift in data from the code data stream. Based on the coded data input and state input, bit generation logic 1432 generates decoded data to the context model. New-k logic 1433 also uses the shifted in data and the state input to generate a new value of k. In one embodiment, new-k logic 1433 uses the PEM state and the first bit of coded data to generate the new value of k. Based on the new k value, code-to-mask logic 1437 generates a RLZ mask for the next codeword. The RLZ mask for the next codeword is sent to decode logic 709 and the run count update logic 1441.

The PEM update logic 1434 updates the PEM state. In one embodiment, the PEM state is updated using the present state. The updated state is sent to memory. New codeword logic 1435 determine if a new codeword is needed. PEM state-to-code logic 1436 determines the code for decoding using the state input 1442. The code is input to expansion logic 1438 to generate the maximum run length, the current mask and an R3 split value. Decode logic 1439 decodes the codeword to produce a run count output. MUX 1440 selects either the output from decode logic 1439 or the state input 1442 to the run count update logic 1441. Run count update logic 1441 updates the run count.

The decoding system 1400, including decoder 1430, of the present invention operates in a pipeline manner. In one embodiment, the decoding system 600 of the present invention determines context bins, estimates probabilities, decodes codewords, and generates bits from run counts all in a pipelined manner. One embodiment of the pipeline structure of the decoding system is depicted in FIG. 15A. Referring to FIG. 15A, an embodiment of the pipelined decoding process of the present invention is shown in six stages, numbered 1–6.

In the first stage, the current context bin is determined (1501). In the second stage, after the context bin has been determined, a memory read occurs (1502) in which the current decoder state for the context bin is fetched from memory. As stated above, the decoder state includes the PEM state and the bit generator state.

In the third stage of the pipelined decoding process of the present invention, a decompressed bit is generated (1503). This allows for a bit to be available to the context model. Two other operations occur during the third stage. The PEM state is converted into a code type (1504) and a determination is made as to whether a new codeword must be decoded (1505) also occur in the third stage.

During the fourth stage, the decoding system processes a codeword and/or updates the run count (1506). Several sub-operations are involved in processing a codeword and updating the run count. For instance, a codeword is decoded to determine the next run count or the run count is updated for the current codeword (1506). If needed when decoding new codewords, more coded data is fetched from the input FIFO. Another sub-operation that occurs in the fourth stage is the updating of the PEM state (1507). Lastly, in the fourth stage of the decoding pipeline, the new PEM state is used to determine what the run length zero codeword (described later) is for the next code if the run count of the current code word is zero (1508).

During the fifth stage of the decoding pipeline of the present invention, the decoder state with an updated PEM state is written into memory (1509) and the shifting begins for the next codeword (1510). In the sixth stage, the shifting to the next codeword is completed (1510).

The pipelined decoding of the present invention actually begins with a decision as to whether to start the decoding process. This determination is based on whether there is enough data to present to the decoder of the present invention. If there is not enough data from the FIFO, the decoding system is stalled. In another case, the decoding system may be stalled when outputting decoded data to a peripheral device that is not capable of receiving all of the data output from the decoder as it is being generated. For instance, when the decoder is providing output to a video display interface and its associated video circuitry, the video may be too slow, such that the decoder needs to be stalled to allow a video to catch up.

Once the decision has been made to start the decoding process, the current context bin is determined by the context model. In the present invention, the current context bin is ascertained by examining previous data. Such previous data may be stored in line buffers and may include data from the current line and/or previous lines. For instance, in a context template, for a given bit. Bits from line buffer(s) may be designed using a template with respect to the previous data, such that the context bin for the current data is selected according to whether the previous data being examined matches the template. These line buffers may include bit shift registers. A template may be used for each bit plane of an n-bit image.

In one embodiment, the context bin is selected by outputting an address to memory during the next pipeline stage. The address may include a predetermined number of bits, such as three bits, to identify the bit plane. By using three bits, the bit position in pixel data may be identified. The template used to determine the context may also be represented as a portion of the address. The bits used to identify the bit plane and the bits identifying the template may be combined to create an address for a specific location in memory that contains the state information for the context bin defined by those bits. For example, by utilizing three bits to determine the bit position in a particular pixel and the ten previous bits in the same position in each of the previous pixels in the template, a 13-bit context address may be generated.

Using the address created by the context model, the memory (e.g., RAM) is accessed to obtain the state information. The state includes the PEM state. The PEM state includes the current probability estimate. Because more than one state uses the same code, the PEM state does not include a probability class or code designation, but rather an index into a table, such as the table shown in FIG. 5. Also when using a table such as that shown in FIG. 5, the PEM state also provides the most probable symbol (MPS) as a means for identifying whether the current PEM state is located on the positive or negative side of the table. The bit generation state may include the count value and an indication of whether an LPS is present. In one embodiment, the MPS value for the current run is also included for decoding the next codeword. In the present invention, the bit generator state is stored in memory to reduce the space required for run counters. If the cost of space in the system for counters for each context is low, the bit generation state does not have to be stored in memory.

Once the fourth stage has been completed, the new bit generator state and PEM state is written to memory. Also in the fifth stage, the coded data stream is shifted to the next codeword. The shifting operation is completed in the sixth stage.

Figure 14C:
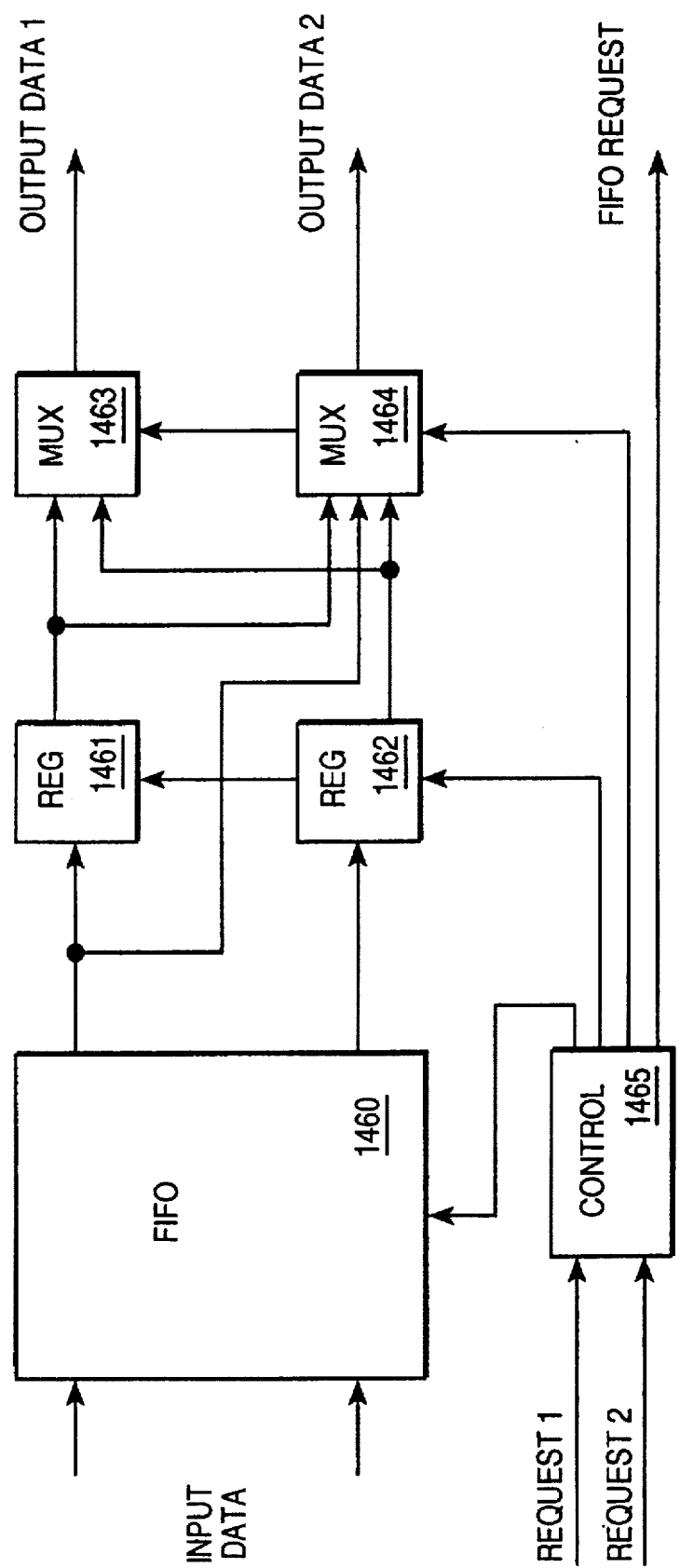
FIG. 14C is a block diagram of one embodiment of the FIFO structure of the present invention.

FIG. 14C is a block diagram of one embodiment of FIFO structure 1401 of the present invention illustrating interleave word buffering for two decoders. Note that any number of decoders may be supported using the teachings of the present invention. As shown, the input data and the FIFO are wide enough to hold two interleave words. FIFO 1401 comprises FIFO 1460, registers 1461–62, MUXs 1463–1464 and control block 1465. The two input codewords are coupled as the input interleaved words. The outputs of FIFO 1460 are coupled to inputs to registers 1461–1462. Inputs to MUX 1463 are coupled to the outputs of registers 1461 and 1462. Control block 1465 is coupled to provide control signals to FIFO 1460, registers 1461 and 1462 and MUXs 1463 and 1464. Interleave words are the output data (output data 1 and 2) provided to two decoders. Each decoder uses a request signal to indicate that the current word has been used and a new word will be needed next. The request signals from the decoders are coupled to inputs of control block 1465. Control block 1465 also outputs a FIFO request signal to request more data from memory.

Initially, the FIFO and registers 1461 and 1462 are filled with data and a valid flip flop in the control unit 1465 is set. Whenever a request occurs, the control block 1465 provides the data according to the logic shown in Table 16.

TABLE 16

| Both Valid | Request 1 | Request 2 | Multi-plexer 1 | Multi-plexer 2 | Next Both Valid | FIFO and Register Enable |
|---|---|---|---|---|---|---|
| 0 | 0 | 0 | X* | X | 0 | 0 |
| 0 | 0 | 1 | X | REG 1462 | 1 | 1 |
| 0 | 1 | 0 | REG 1462 | X | 1 | 1 |
| 0 | 1 | 1 | REG 1462 | FIFO | 0 | 1 |
| 1 | 0 | 0 | X | X | 1 | 0 |
| 1 | 0 | 1 | X | REG 1461 | 0 | 0 |
| 1 | 1 | 0 | REG 1461 | X | 0 | 0 |
| 1 | 1 | 1 | REG 1461 | REG 1462 | 1 | 1 |

*X means "don't care"

FIG. 15B illustrates a different conceptual view of the decoder of the present invention. Referring to FIG. 15B, variable length (coded) data is input into a decoder. The decoder outputs fixed length (decoded) data. The output is also fed back as a delayed feedback which received as an input into the decoder. In the decoder of the present invention, variable length shifting used in decoding is based on decoded data that is available after some delay. The feedback delay does not reduce the throughput in the delay tolerant decoders.

The input variable length data is divided into fixed length interleaved words such as described in conjunction with FIG. 4. The decoder uses the fixed length words as described in FIG. 16A below. The decoder and delay models a pipeline decoder as described in conjunction with FIGS. 15 and 32 or multiple parallel decoders such as described in conjunction with FIGS. 2A–2D. Thus, the present invention provides a delay tolerant decoder. The delay tolerant decoders of the present invention allow handling of variable length data in parallel.

Prior art decoders (e.g., Huffman decoders) are not delay tolerant. Information determined from decoding all previous codewords is required to perform the variable length shifting needed to decode the next codeword. On the other hand, the present invention provides delay tolerant decoders.

Shifting in the Decoding System

The decoder of the present invention provides shifting logic to shift the interleaved words to the proper bit generator for decoding. The shifter of the present invention does not require any particular type of "by context" or "by probability" parallelism. An encoder which assigns codeword M to stream M mod N (M%N in the C language), where N is the number of streams is assumed. In the present invention, coded data from the current stream is presented until a codeword is requested. Only then is the data switched to the next stream.

FIG. 16 illustrates one embodiment of the shifter for the decoder of the present invention. Shifter 1600 is designed for four data streams. This allows four clock cycles for each shifting operation. The interleaved words are 16 bits and the longest codeword is 13 bits. Referring to FIG. 16, shifter 1600 comprises four registers 1601–1604 coupled to receive inputs from the interleaved coded data. The outputs of each of registers 1601–1604 is coupled as inputs to MUX 1605. The output of MUX 1605 is coupled to the input of a barrel shifter 1606. The output of barrel shifter 1606 is coupled as inputs to a register 1607, MUX & registers 1608–1610, and a size unit 1611. The output of size unit 1611 is coupled to an accumulator 1612. An output of accumulator 1612 is fed back and coupled to barrel shifter 1606. An output of register 1607 is coupled as an input to MUX & register 1608. An output of MUX & register 1608 is coupled as an input to MUX & register 1309. An output of MUX & register 1609 is coupled as an input to MUX & register 1610. The output of MUX & register 1610 is the aligned coded data. In one embodiment, registers 1601–1604 are 16-bit registers, barrel shifter 1606 is a 32-bit to 13-bit barrel shifter and accumulator 1612 is a 4-bit accumulator.

Registers 1601–1604 accept 16-bit words from the FIFO and input them into barrel shifter 1606. At least 32 bits of the undecoded data is provided to barrel shifter 1606 at all times. The four registers 1601–1604 are initialized with two 16-bit words of coded data to begin. This allows there to always be at least one new codeword available for each stream.

For R-codes, codeword size unit 1611 determines if a "0" or "1N" codeword is present and, if it is an "1N" codeword so, how many bits after the "1" are part of the current codeword. The size unit, providing the same function, was described in conjunction with FIG. 12. For other codes, determining the size of a codeword is well-known in the art.

Shifter 1600 comprise a FIFO consisting of four registers, three of which have multiplexed inputs. Each register of registers 1607–1610 holds at least one codeword, so the width of the registers and the multiplexers is 13 bits to accommodate the longest possible codeword. Each register also has one control flip-flop associated with it (not shown to avoid obscuring the present invention) that indicates if a particular register contains a codeword or if it is waiting for barrel shifter 1606 to provide a codeword.

The FIFO will never empty. Only one codeword can be used per clock cycle and one codeword can be shifted per clock cycle. The delay to perform the shifting is compensated for since the system starts out four codewords ahead. As each codeword is shifted into being the aligned coded data output, the other codewords in registers 1607–1610 shift down. When the codeword left in the FIFO is stored in register 1620, the barrel shifter 1606 causes codewords to be read out from registers 1601–1604 through MUX 1605 in order to fill registers 1607–1609. Note that the FIFO may be designed to refill register 1607 with the next codeword as soon as its codeword is shifted into register 1608.

Barrel shifter 1606, codeword size calculator 1611 and an accumulator select 1612 handle the variable length shifting. Accumulator 1612 has four registers, one for each coded data stream, that contains the alignment of the current codeword for each data stream. Accumulator 1612 is a four bit accumulator used to control barrel shifter 1606. Accumulator 1612 increases its value by the value input from the codeword size unit 1611. When accumulator 1612 overflows (e.g., every time the shift count is 16 or greater), registers 1601–1604 are clocked to shift. Every other 16 bit shift causes a new 32 bit word to be requested from the FIFO. The input to accumulator 1611 is the size of the codeword, which is determined by the current code and the first one or two bits of the current codeword. Note that is some embodiments, registers 1601–1604 must be initialized with coded data before the decoding can begin.

When a codeword is requested by the system, the registers in the FIFO are clocked so that codewords are moved towards the output. When the barrel shifter 1606 is ready to deliver a new codeword, it is multiplexed into the first empty register in the FIFO.

In this embodiment, a next codeword signal from the bit generator is received before the decision to switch streams is made.

If the next codeword signal from the bit generator cannot be guaranteed to be received before the decision to switch streams, a lookahead system such as the one shown in FIG. 16B can be used. Referring to FIG. 16B, a shifter 1620 using look ahead is shown in block diagram form. Shifter 1620 includes a shifter 1600 that produces outputs of the current coded data and the next coded data. The current coded data is coupled to an input of codeword preprocessing logic unit 1621 and an input of a codeword processing unit 1624. The next coded data is coupled to an input of codeword preprocessing logic unit 1622. Outputs from both preprocessing logic units 1621 and 1622 are coupled to inputs of a MUX 1623. The output of MUX 1623 is coupled to another input of codeword processing logic 1624.

The logic that uses the codeword is divided into two parts, codeword preprocessing logic and codeword processing logic. Two identical pipelines preprocessing units 1621–1622 operate before the interleaved stream can be shifted. One of preprocessing units 1621–1622 generates the proper information if the stream is switched and the other generates the information if the stream is not switched. When the stream is switched, the output of the proper codeword preprocessing is multiplexed by MUX 1623 to codeword processing logic 1624 which completes the operation with the proper codeword.

Off Chip Memory and Context Models

In one embodiment, it may be desirable to use multiple chips for external memory or external context models. In these embodiments, it is desirable to reduce the delay between generating a bit and having the bit be available to the context model where multiple integrated circuits are used.

FIG. 17 illustrates a block diagram of one embodiment of a system with both an external context model chip 1701 and a coder chip 1702 with memory for each context. Note that only the units relevant to the context model in the coder chip are shown; it is apparent to those skilled in the art that the coder chip 1702 contains bit generation, probability estimation, etc. Referring to FIG. 17, the coder chip 1702 comprises a zero order context model 1703, context models 1704 and 1705, a select logic 1706, a memory control 1707 and a memory 1708. Zero order context model 1703 and context models 1704–1705 generate outputs that are coupled to inputs of the select logic 1706. Another input of select logic 1706 is coupled to an output of external context model chip 1701. The output of select logic 1706 is coupled to an input of memory 1708. Also coupled to an input of memory 1708 is an output of memory control 1707.

Select logic 1706 allows either an external context model or an internal context model (e.g., zero order context model 1703, context model 1704, context model 1705) to be used. Select logic 1706 allows the internal zero order portion of context model 1703 to be used even when the external context model 1701 is used. Zero order context model 1703 provides one bit or more while the external context model chip 1701 provides the remainder. For instance, the immediately previous bits may be feedback and retrieved from zero order context model 1703, while previous bits go to the external context model 1701. In this manner, the time critical information remains on-chip. This eliminates the off-chip communication delay for recently generated bits.

FIG. 18 is a block diagram of one system with an external context model 1801, and external memory 1803 and a coder chip 1802. Referring to FIG. 18, some memory address lines are driven by the external context model 1801, while others are driven by the "zero order" context model in the decoder chip 1802. That is, the context from the immediately past decoding cycle are driven by the zero order context model. This allows the decoder chip to provide the context information from the immediate past with minimum communication delay. The context model chip 1802 precedes the rest of the context information using bits decoded further in the past only, therefore allowing for communication delay. In many cases, the context information from the immediate past is zero order Markov state, and the context information from further in the past is higher order Markov state. The embodiment shown in FIG. 18 eliminates the communication delay inherent in implementing the zero order model in the external context model chip 1802. However, there may still be a context bin determination to bit generated delay due to the decoder chip 1802 and the memory 1803.

It should be noted that other memory architecture's could be used. For instance, a system with the context model and memory in one chip and the coder in another chip may be used. Also a system may includes a coder chip with an internal memory that is used for some contexts and an external memory that is used with other contexts.

Bit Generators Using a Memory

FIG. 19 shows a decoder with a pipelined bit generator using memory. Referring to FIG. 19, the decoder 1900 comprises a context model 1901, memory 1902, PEM state-to-code block 1903, pipelined bit generator 1905, memory 1904 and shifter 1906. The input of Context model 1901 comprises the decoded data from pipelined bit stream generator 1905. The inputs of shifter 1906 are coupled to receive the coded data. The output of context model 1901 is coupled to an input to memory 1902. The output of memory 1902 is coupled to PEM state-to-code 1903. The output of PEM state-to-code 1903 and the aligned coded data output from shifter 1906 are coupled to inputs of bit generator 1905. Memory 1904 is also coupled to bit generator 1905 using a bi-directional bus. The output of bit generator 1905 is the decoded data.

Context model 1901 outputs a context bin in response to coded data on its inputs. The context bin is used as an address to access memory 1902 based on the context bin to obtain a probability state. The probability state is received by PEM state-to-code module 1903 that generates the probability class in response to the probability state. The probability class is then used as an address to access memory 1904 to obtain the run count. The run count is then used by bit generator 1905 to produce the decoded data.

In one embodiment, memory 1902 comprises a 1024×7 bit memory (where 1024 is the number of different contexts), while memory 1904 comprises a 25×14 bit memory (where 25 is the number of different run counts).

Since bit generator states (run counts, etc.) are associated with probability classes, not context bins, there is additional pipeline delay before a bit is available to the context model. Because updating a bit generator state takes multiple clock cycles (the bit generator state memory revisit delay), multiple bit generator states will be used for each probability class. For example, if the pipeline is six clock cycles, then the bit generator state memory will have six entries per probability class. A counter is used to select the proper memory location. Even with multiple entries per probability class, the size of the memory will typically be less than the number of contexts. The memory can be implemented with either multiple banks of SRAM or a multi-ported register file.

Since one run count may be associated with multiple contexts, an embodiment must upgrade the probability estimation state of one or more contexts. In one embodiment, the PEM state of the context which causes a run to end is updated.

Instead of requiring a read, modify and write of a run-count before it can be read again, a run count can be used again as soon as the modify is complete.

FIG. 32 illustrates a timing diagram of a decode operation in one embodiment of the present invention. Referring to FIG. 32, a three cycle decode operation is depicted. Signal names are listed on the left hand column of the timing diagram. The validity of a signal during any one cycle is indicated with a bar during the cycle (or portion thereof). In certain cases, the unit or logic responsible for generating the signal or supplying the valid signal is shown adjacent to the valid signal indication in a dotted-lined box. At times, examples of specific elements and units disclosed herein are provided as well. Note that any portion of the signal that extends into another cycle indicates the validity of the signal only for that period of time in which the signal is shown extending into the other cycle. Also, certain signals are shown as being separately valid for more than one cycle. An example of such is the temp run count signal which is valid at one point at the end of the second cycle and then again during the third cycle. Note that this indicates that the signal is merely being registered at the end of the cycle. A list of dependencies is also shown in Table 17 below setting forth the dependcies from the same or previous clock cycle to the current time which the signal is specified to be valid.

TABLE 17

| Name | Unit* | Dependencies** |
|---|---|---|
| register file 1 | CM | {*previous bit, CM shift register*} |
| state to code | CM | register file 1 |
| barrel shift | SH | {*accumulator register, unaligned coded data registers*} |
| size | SH | barrel shifter output (aligned coded data) {K, R3} |
| acc (accumulator) | SH | size {*previous accumulator register value*} |
| register file 2 | BG | {K, R3 registered} |
| α (codeword needed) | BG | register file 2 |
| code to (mask, maxRL, R3split) | BG | {K, R3 registered} |
| gen bit (generator bit) | BG | register file 2<br>barrel shifter output (aligned coded data)<br>code to (mask, maxRL, R3split)<br>{*register file 1, registered MPS*} |
| decode | BG | barrel shifter output (aligned coded data)<br>code to (mask, maxRL, R3split) |
| PEM table | PEM | {K, R3 registered} |
| β (PEM update)†† | PEM | {*registered: PEM table output, LPS present, continue*} |
| −1 (run count update) | BG | {*registered: codeword needed registered, run count, LPS present, continue*} |
| γ(continue, LPS present update) | BG | {registered: codeword needed, run count, LPS present, continue} |

*CM = context model, SH = shifter, BG = bit generator, PEM = Probability estimation machine.
**[*italics*] means dependencies from previous clock cycle.
††In one embodiment, most combinational logic for updating the PEM state is performed in the "PEM table" step, "PEM update" is simply a multiplex operation.

Implicit Signaling

In some embodiments, the decoder must model the finite reordering buffer of the encoder. In one embodiment, this modeling is accomplished with implicit signalling.

As explained previously with regard to the encoder, when a codeword is started in the encoder, space is reserved in the appropriate buffer for the codeword in the order the codewords should be placed on the channel. When the last space in a buffer is reserved for a new codeword, then some codewords are placed in the compressed bit stream whether or not they have been completely determined.

When a partial codeword must be completed, a codeword may be chosen which is short and correctly specifies the symbols received so far. For example, in a R-coder system, if it is necessary to prematurely complete a codeword for a series of 100 MPSs in a run code with 128 maximum runlength, then the codeword for 128 MPSs can be used, since this correctly specifies the first 100 symbols.

Alternatively, a codeword that specifies 100 MPSs followed by a LPS can be used. When the codeword has been completed, it can be removed from the reordering buffer and added to the code stream. This may allow previously completed codewords to be placed in the code stream as well. If forcing the completion of one partial codeword results in the removal of a codeword from the full buffer then encoding can continue. If one buffer is still full, then the next codeword must again be completed and added to the code stream. This process continues until the buffer which was full is no longer full. The decoder may model the encoder for implicit signaling using a counter for each bit generator state information memory location.

In one embodiment, each run counter (probability class in this example) has a counter which is the same size as the head or tail counters in the encoders (e.g., 6 bits). Every time a new run is started (a new codeword is fetched), the corresponding count is loaded with the size of the codeword memory. Every time a run is started (a new codeword is fetched) all counters are decremented. Any counter that reaches zero causes the corresponding run count to be cleared (and the LPS present flag is cleared).

Options for Signaling for Finite Memory

Real-time encoding in the present invention requires the decoder handle runs of MPSs that are not followed by an LPS and are not the maximum run length. This occurs when the encoder begins a run of MPSs, but does not have enough limited re-ordering memory to wait until the run is complete. This condition requires a new codeword to be decoded the next time this context bin is used, and this condition must be signaled to the decoder. Three potential ways of modifying the decoder are described below.

When the buffer is full, the run count for the context bin or probability class that is forced out must be reset. To implement this efficiently, storing the context bin or probability class in the codeword memory is useful. Since this is only needed for runs that do not yet have an associated codeword, the memory used to store the codeword can be shared. Note that in some systems, instead of forcing out an incomplete codeword, bits can be forced into the context/ probability class of the (or any) codeword that is pending in the buffer when the buffer is full. The decoder detects this and uses the corresponding (wrong) context bin or probability class.

Instream signaling uses codewords to signal the decoder. In one embodiment, the R2(k) and R3(k) code definitions are changed to include non-maximum length runs of MPS that are not followed by an LPS. This can be implemented by adding one bit to the codeword that should occur with the lowest probability. This allows a uniquely decodable prefix for the non-maximum length run counts. Table 18 shows a replacement for R2(2) codes that allows instream signaling. The disadvantages of this method are that the R-code decoding logic must be changed and that there is a compression cost every time the codeword with the lowest probability occurs.

TABLE 18

| Original Data | Codeword |
|---|---|
| 0000 | 0 |
| 0001 | 1000 |
| 001 | 101 |
| 01 | 110 |
| 1 | 111 |
| 000 | 100100 |
| 00 | 100101 |
| 0 | 10011 |

In some embodiments, the decoder performs implicit signaling using time stamps. A counter keeps track of the current "time" by incrementing every time a codeword is requested. Also, whenever a codeword is started, the current "time" is saved in memory associated with the codeword. Anytime after the first time a codeword is used, the corresponding stored "time" value plus the size of the encoder's reordering buffer is compared with the current "time". If the current "time" is greater, an implicit signal is generated so that a new codeword is requested. Thus, the limited reorder memory in the encoder has been simulated. In one embodiment, enough bits for "time" values are used to allow all codewords to be enumerated.

To reduce the memory required, the number of bits used for the time stamps is kept to a minimum. If the time stamps use a small number of bits, such that time values are reused, care must be taken that all old time stamps am noted before the counter starts reusing times. Let N be the greater of the number of address bits for the queue or the bit generator state memory. Time stamps with N+1 bits can be used. The bit generator state memory must support multiple accesses, perhaps two reads and two writes per decoded bit. A counter is used to cycle through the bit generator state memory, incrementing once for each bit decoded. Any memory location that is too old is cleared so a new codeword is fetched when its used in the future. This guarantees all time stamps are checked before any time value is reused.

If the bit generator state memory is smaller than the queue, the rate of counting (the time stamp counter) and the memory bandwidth required can be reduced. This is because each time stamp (one per bit generator state memory) must be checked only once per the number of cycles required to use the entire queue. Also storing the time stamps in a different memory might reduce the memory bandwidth required. In a system that uses "0" codewords for partial runs, time stamps do not have to be checked for "1N" codewords. In a system that uses "1N" codewords for partial runs, the time stamp only has to be checked before generating a LPS.

In some embodiments, implicit signaling is implemented with a queue during decoding. This method might be useful in a half duplex system where the hardware for encoding is available during decoding. The operation of the queue is almost the same as during encoding. When a new codeword is requested, its index is placed in the queue and marked as invalid. When the data from a codeword is completed, it's queue entry is marked as valid. As data is taken out of the queue to make room for new codewords, if the data taken out is marked as invalid, the bit generator state information from that index is cleared. This clearing operation may require that the bit generator state memory be able to support an additional write operation.

Explicit signaling, in contrast, communicates buffer overflow as compressed data. One example is to have an auxiliary context bin that is used once for every normal context bin decode or once for every codeword that is decoded. Bits decoded from the auxiliary context bin indicates if the new-codeword-needed condition occurs and a new codeword must be decoded for the corresponding normal context bin. In this case, the codewords for this special context must be reordered properly. Since the utilization of this context is a function of something known to the reorder unit (typically, it is used once for each codeword), the memory required to reorder the auxiliary context can be bounded or modeled implicitly. Also, the possible codes allowed for this auxiliary context can be limited.

Implicit signaling models the encoder's limited buffer when decoding to generate a signal that indicates that a new codeword must be decoded. In one embodiment, a time stamp is maintained for each context. In one embodiment, the encoder's finite size reordering buffer is modeled directly. In a half duplex system, since the encoder's reordering circuitry is available during decoding, it might be used to generate the signals for the decoder.

Exactly how implicit signaling is accomplished depends on the details of how the encoder recognizes and handles the full buffer condition. For a system using a merged queue with fixed allocation, the use of multiple head pointers allows choices of what "buffer full" means. Given a design for the encoder, an appropriate model can be designed.

The following provides encoder operation and a model for use by the decoder for a merged queue with fixed stream assignment, parallel by probability system. For this example, assume that the reordering buffer has 256 locations, 4 interleaves streams are used, and each interleaved word is 16 bits. When the buffer contains 256 entries, an entry must be sent out to a bit packer (e.g., bit pack unit) before the entry for the 257th codeword can be placed in the queue. Entries can be forced out earlier if necessary.

In some systems removing the first entry in the buffer requires removing enough bits to complete an entire interleaved codeword. Therefore, if 1-bit codewords are possible, removing codeword 0 might require also removing codewords 4, 8, 12, . . . , 52, 56, 60 for 16-bit interleaved words. To ensure that all of these buffer entry have valid entries, forcing an entry to be filled to because the memory is full can be performed at address 64, 192 locations from the location where a new codeword is entered (256−16×4=192).

In the decoder there is a counter for each prebability. When a new codeword is used to start a run, the counter is loaded with 192. Any time a new codeword is used by any probability, all counters are decremented. If any counter reaches zero, the run length for that probability is set to zero (and the LPS present flag is cleared).

It may be convenient to use multiple RAM banks (multiported memory, simulation with fast memory, etc.), one bank for each coded data stream. This permits all bit pack units to receive data simultaneously, so reading multiple codewords for a particular stream does not prohibit reading by other streams.

In other systems, multiple bit pack units must arbitrate for a single memory based on the codeword order as stored in the buffer. In these systems, removing an entry from a buffer may not complete an interleaved word. Each bit pack unit typically receives some fraction of an interleaved word in sequence. Each bit pack unit receives at least a number of bits equal to the shortest codeword length (e.g. 1 bit) and at most a number of bits equal tot he longest codeword length (e.g. 13 bits). Interleave words cannot be emitted until they are complete, and must be emitted in the order of initialization. In this example, a bit pack unit might have to buffer 13 interleave words, this is the maximum number of interleave words that can be completed with maximal length codewords while another stream has an interleaved word pending that is receiving minimal length codewords.

A system where every codeword requires two writes and one read of memory may be less desirable for hardware implementation than a system that performs two writes and two reads. If this was desired for the example system with four streams, bit pack units 1 and 2 could share one memory read cycle and bit pack units 1 and 3 could share the other read cycle (or any other arbitrary combination). While this would not reduce the size of the buffering needed, it would allow a higher transfer rate into the bit pack unit. This may allow the bit pack units to better utilize the capacity of the coded data channel.

Systems with Fixed Size Memory

One advantage of a system that has multiple bit generator states per probability class is that the system can support lossy coding when a fixed size memory overflows. This might be useful for image compression for a frame buffer and other applications that can only store a limited amount of coded data.

For systems with fixed size memory, the multiple bit generator states for each probability are each assigned to a part of the data. For example, each of eight states could be assigned to a particular bitplane for eight bit data. In this case, a shifter is also assigned to each part of the data, in contrast to shifters sequentially providing the next codeword. It should be noted that the data need not be divided by bitplane. Also, in the encoder, no interleaving is performed, each part of the data is simply bitpacked. Memory is allocated to each part of the data.

Memory management for coded data is presented for systems that store all of the data in a fixed size memory and for systems that transmit data in a channel with a maximum allowable bandwidth. In both of these systems, graceful degradation to a lossy system is desired. Different streams of data are used for data with different importance so that less important streams can be stored or not transmitted when sufficient storage or bandwidth is not available.

When using memory, the coded data must be stored so that it can be accessed such that less important data streams can be discarded without losing the ability to decode important data streams. Since coded data is variable length, dynamic memory allocation can be used. FIG. 31 shows an example dynamic memory allocation unit for three coded data streams. A register file 3100 (or other storage) holds a pointer for each stream plus another pointer for indicating the next free memory location. Memory 3101 is divided into fixed size pages.

Initially, each pointer assigned to a stream points to the start of a page of memory and the free pointer to the next available page of memory. Coded data from a particular stream is stored at the memory location addressed by the corresponding pointer. The pointer is then incremented to the next memory location.

When the pointer reaches the maximum for the current page, the following occurs. The address of the start of the next free page (stored in the free pointer) is stored with the current page. (Either part of the coded data memory or a separate memory or register file could be used.) The current pointer is set to the next free page. The free pointer is incremented. These actions allocate a new page of memory to a particular stream and provide links so that the order of allocation can be determined during decoding.

When all pages in the memory are in use and there is more data from a stream that is more important than the least important data in memory, one of three things may be done.

In all three cases, memory assigned to the least important data stream is reassigned to more important data stream and no more data from the least important data stream is stored.

First, the page currently being used by the least important stream is simply assigned to the more important data. Since most typical entropy coders use internal state information, all of the least important data stored previously in that page is lost.

Second, the page currently being used by the least important stream is simply assigned to the more important data stream. Unlike the previous case, the pointer is set to the end of the page and as more important data is written to the page, the corresponding pointer is decremented. This has the advantage of preserving the least important data at the start of the page if the more important data stream does not require the entire page.

Third, instead of the current page of least important data being reassigned, any page of least important data may be reassigned. This requires that the coded data for all pages be coded independently, which may reduce the compression achieved. It also requires that the uncoded data corresponding to the start of all pages be identified. Since any page of least important data can be discarded, greater flexibility in graceful degradation to lossy coding is available.

The third alternative might be especially attractive in a system that achieves a fixed rate of compression over regions of the image. A specified number of memory pages can be allocated to a region of the image. Whether less important data is retained or not can depend on the compression achieved in a particular region. (The memory assigned to a region might not be fully utilized if lossless compression required less than the amount of memory assigned.) Achieving a fixed rate of compression on a region of the image can support random access to the image regions.

The ability to write data into each page from both ends can be used to better utilize the total amount of memory available in the system. When all pages are allocated, any page that has sufficient free space at the end can be allocated for use from the end. The ability to use both ends of a page must be balanced against the cost of keeping track of the location where the two types of data meet. (This is different from the case where one of the data types was not important and could simply be overwritten.)

Now consider a system where data is transmitted in a channel instead of being stored in a memory. Fixed size pages of memory are used, but only one page per stream is needed. (Or perhaps two if ping-ponging is needed to provide buffing for the channel, such that while writing to one, the other may be read for output) When a page of memory is full, it is transmitted in the channel, and the memory location can be reused as soon as the page is transmitted. In some applications, the page size of the memory can be the size of data packets used in the channel or a multiple of the packet size.

In some communications systems, for example ATM (Asynchronous Transfer Mode), priorities can be assigned to packets. ATM has two priority levels, priority and secondary. Secondary packets are only transmitted if sufficient bandwidth is available. A threshold can be used to determine which streams are priority and which are secondary. Another method would be to use a threshold at the encoder to not transmit streams that were less important than a threshold.

Separate Bit Generators for Each Code

FIG. 20 is a block diagram of a system with separate bit generators for each code. Referring to FIG. 20, decoding system 2000 comprises context model 2001, memory 2002, PEM state-to-code block 2003, decoder 2004, bit generators $2005_{A-n}$, and shifter 2006. The output of context model 2001 is coupled to an input of memory 2002. The output of memory 2002 is coupled to an input of PEM state-to-code block 2003. The output of PEM state-to-code block 2003 is coupled to an input of decoder 2004. The output of decoder 2004 is coupled as an enable for bit generators $2005_{A-n}$. Bit generators $2005_{A-n}$ are also coupled to receive coded data output from shifter 2006.

Context model 2001, memory 2002, and PEM state-to-code block 2003 operate like their counterparts in FIG. 19. Context model 2001 generates a context bin. Memory 2002 outputs a probability state based on the context bin. The probability state is received by the PEM state-to-code block 2003 which generates a probability class for each probability state. Decoder 2004 enables one of the bit generators $2005_{A-n}$ upon decoding the probability class. (Note that decoder 2004 is a M to $2^M$ decoder circuit similar to a 74×138 3:8 decoder which is well-known—it is not an entropy coding decoder.) Note that since each code has a separate bit generator, some bit generators may use codes other than R-codes. Particularly, a code for probabilities near 60% might be used to better tile the probability space between R2(0) and R2(1). For instance, Table 19 depicts such a code.

TABLE 19

| uncoded data | codeword |
|---|---|
| 0 0 0 | 0 0 |
| 0 0 1 | 0 1 |
| 0 1 | 1 0 |
| 1 | 1 1 |

If needed to achieve the desired speed, pre-decoding of one or more bits may be done to guarantee that decoded data is available quickly. In some embodimends, to avoid the need to be able to update a large run count every clock cycle, both codeword decoding and run counting for long codes are partitioned.

The bit generator for R2(0) codes is uncomplicated. A codeword is requested every time a bit is requested. The bit generated is simply the codeword (XORed with the MPS).

Codes for short run length, for example, R2(1), R3(1), R2(2) and R3(2), are handled in the following manner. All of the bits in a codeword are decoded and stored in a state machine that comprises of a small counter (1, 2, or 3 bits respectively) and a LPS present bit. The counter and LPS present bit operate as an R-code decoder.

For longer codes, such as R2(k) and R3(k) for k>2, bit generators are partitioned into two units as shown in FIG. 21. Referring to FIG. 21, a bit generator structure for R2(k) codes for k>2, is shown having a short run unit 2101 and a long run unit 2102. Note that although the structure is for use with R2(k>2) codes, its operation will be similar for R3(k>2) codes (and is apparent to one skilled in the art).

Short run unit 2101 is coupled to receive an enable signal and a codeword[0 .. 2] as inputs into the bit generator and an "all zeros" signal and a "count zero" signal (indicating a count of zero), both from long run unit 2102. In response, to these inputs, short run unit 2101 outputs a decoded bit and a next signal indication, which signals that a new codeword is needed. Short run unit 2101 also generates a count enable signal, a count load signal and a count max signal to long run unit 2102. Long run unit 2102 is also coupled to receive codeword [k . . . 3] as an input to the bit generator.

Short run unit 2101 handles runs of up to length 4 and is similar to a R2(2) bit generator. In one embodiment, short run unit 2101 is the same for all R2(k>2) codes. The purpose of long run count 2102 is to determine when the last 1–4 bits of the run are to be output. Long run unit 2102 has inputs, AND logic and a counter that vary in size with k.

One embodiment of the long run count unit 2102 is shown in FIG. 22. Referring to FIG. 22, the long run unit 2102 comprises AND logic 2201 coupled to receive the codeword[k . . . 3] and outputs an "all ones" signal as a logical 1 if all of the bits in the codeword are 1's, thereby indicating that the current codeword is a 1N codeword and that the run count is less than 4. NOT logic 2202 is also coupled to receive the codeword and inverts it. The output of NOT logic 2202 is coupled to one input of a bit counter 2203. The bit counter 2203 is also coupled to receive the count enable signal, the count load signal and the count max signal. In response to the inputs, the bit counter 2203 generates a count zero signal.

In one embodiment, the counter 2003 is a k-2 bit counter and is used to break long run counts into runs of four MPSs and possibly some remainder. The count enable signal indicates that four MPSs have been output and the counter should be decremented. The count load signal is used when decoding "1N" codewords and causes the counter to be loaded with the complement of codeword bits k through 3. The count max signal is used when decoding "0" codewords and loads the counter with its maximum value. A count zero output signal indicates when the counter is zero.

One embodiment of the short run count unit 2101 is shown in FIG. 23. Referring to FIG. 23, the short run count unit contains a control module 2301, a two-bit counter 2302 and a three-bit counter 2303. The control module 2301 receives the enable signal, the codeword[0 . . . 2], and the all ones and count zero signals from the long run count unit. The two bit counter is used to count four bit runs of MPSs that are part of longer runs. A R2(2) counter and LPS bit (three bits total) 2303 is used to generate the 1–4 bits at the end of a run. The enable input indicates that a bit should be generated on the bit output. The count zero input when not asserted indicates that a run of four MPSs should be output. Whenever the MPS counter 2302 reaches zero, the count enable output is asserted. When the count zero input is asserted, either the R2(2) counter the LPS is used or a new codeword is decoded and the next output is asserted.

When the new codeword is decoded, the actions performed are determined by the codeword input. If the input is "0" codeword, the MPS counter 2302 is used and the count max output is asserted. For "1N" codewords, the first three bits of the codeword are loaded into the R2(2) counter and LPS 2303, and the count load output is asserted. If the all ones input is asserted then the R2(2) counter and LPS 2303 are used to generate bits; otherwise the MPS counter is used until the count zero input is asserted.

From a system perspective, the number of codes must be small for the system to work well, typically 25 or less. The size of the multiplexer needed for bit and next codeword outputs and the decoder for enabling a particular bit generator must be limited for fast operation. Also, the fan-out of the codeword from the shifter must not be too high for high speed operation.

Separate bit generators for each code allow pipelining. If all codewords resulted in at least two bits, processing of codewords could be pipelined in two cycles instead of one. This might double the speed of the decoder if the bit generators were a limiting portion of the system. One way to accomplish this is for the run length zero codeword (the codeword indicates just a LPS) to be followed by one bit which is the next uncoded bit. These might be called RN(k)+1 codes and would always code at least two bits. Note that R2(0) codewords and perhaps some of the other short codewords do not need to be pipelined for speed.

Separate bit generators lends itself for use with implicit signaling. Implicit signaling for encoding with finite memory can be accomplished in the following manner. Each bit generator has a counter that is the size of a queue address, for example, 9 bits when a size 512 queue is used. Every time a new codeword is used by a bit generator, the counter is loaded with the maximum value. Any time any bit generator requests a codeword, the counters for all bit generators are decremented. Anytime a counter reaches zero, the corresponding bit generator's state is cleared (for example, the MPS counter, the R2(2) counter and LPS and the long run count counter are cleared). Because clearing can occur even if a particular bit generator is not enabled, there is no problem with stale counts.

Initialization of Memory for Each Context Bin

In cases where memory for each context bin holds probability estimation information, additional memory bandwidth may be required to initialize the decoder (e.g., the memory) very quickly. Initializing the decoder quickly can be a problem when the decoder has many contexts and they all need to be cleared. When the decoder supports many contexts (1K or more) and the memory cannot be globally cleared, an unacceptably large number of clock cycles would be required to clear the memory.

In order to clear contexts quickly, some embodiments of the present invention use an extra bit, referred to herein as the initialized status bit, that is stored with each context. Thus, an extra bit is stored with the PEM state (e.g., 8 bits) for each context.

The memory for each context bin and the initialization control logic are shown in FIG. 24. Referring to FIG. 24, a context memory 2401 is shown coupled to a register 2402. In one embodiment, the register 2402 comprises a one bit register that indicates the current proper state for the initialized status bin. The register 2402 is coupled to one input of XOR logic 2403. Another input to XOR logic 2403 is coupled to an output of the memory 2401. The output of XOR logic 2403 is the valid signal and is coupled to an input of control logic 2404. Other inputs of control logic 2404 is coupled to the output of counter 2405 and the context bin signal. An output of control logic 2404 is coupled to the select inputs of MUXs 2406–2407 and to an input of counter 2405. Another output of control logic 2404 is coupled to the select input of MUX 2408. The inputs of MUX 2406 are coupled to the output of counter 2405 and the context bin indication. The output of MUX 2406 is coupled to the memory 2401. The inputs of MUX 2407 are coupled to the new PEM state and zero. The output of MUX 2407 is coupled to one input of the memory 2401 output of memory 2401 and the initial PEM state are coupled to input of MUX 2408. The output of MUX 2408 is the PEM state out.

The value in register 2402 is complemented every occurrence of a decode operation (i.e., each data set, not each decoded bit). XOR logic 2403 compares the validity of the accessed memory location with the register value to determine whether the accessed memory location is valid for this decode operation. This is accomplished using XOR logic 2403 to check if the initialized status bit matches the proper state in register 2402. If the data in memory 2401 is not valid, then control logic 2404 causes the data to be ignored by the state to code logic and the initial PEM state to be used instead. This is accomplished using MUX 2408. When a new PEM state is written to memory, the initialized bit is set to the current value of the register so that it will be considered valid when accessed again.

Every context bin memory entry must have its initialized status bit set to the current value of the register before another decode operation can begin. Counter 2405 steps through all memory locations to assure that they are initialized. Whenever a context bin is used, but its PEM state in not updated, the unused write cycle can be used to test or update the memory location pointed to be counter 2405. After a decode operation is complete, if counter 2405 has not reached the maximum value, the remaining contexts are initialized before beginning the next operation. The following logic is used to control operation.

```
write_it = false;
counter = 0;
all_initialized = false;
while (counter < maximum context bin+1)
    read PEM state from context memory
    if ( (counter == context bin read) and (write_it))
        write_it = false
        counter = counter + 1
    if ( (PEM state changed)
        write new PEM state
    else if (write_it)
        write initial PEM state to memory location "counter"
        counter = counter + 1
    else
        read memory location "counter"
        if (initialized bit in read location is in wrong state)
            write_it = true
        else
            counter = counter + 1
all_initialized = true;
while (decoding)
    read PEM state from context memory
    if (PEM state changed)
        write new PEM state
```

PEM with Fast Adaptation

The PEM used in the present invention may include an adaptation scheme to allow faster adaptation regardless of the amount of data available. By doing so, the present invention allow the decoding to adapt more quickly initially, and to adapt more slowly as more data is available, as a means for providing a more accurate estimate. Furthermore, the PEM may be fixed in an field programmable gate array (FPGA) or ASIC implementation of a PEM state table/machine.

Tables 20–25 below describe a number of probability estimation state machines. Some tables use do not use R3 codes or do not use long codes, for reduced hardware cost. All tables except for Table 20 use "fast adapting" special states used to quickly adapt at the start of coding until the first LPS occurs. These fast adaptation states are shown italicized in the tables. For instance, referring to Table 21, when decoding begins, the current state is state 0. If an MPS occurs, then the decoder transitions to state 35. As long as MPSs occur, the decoder transitions upward from state 35, eventually transitioning to state 28. If an LPS occurs at any time, the decoder transitions out of the bolded fast adapting states to a state that represents the correct probability state for the data that has been received thus far.

Note that for each table, after a certain number of MPSs have been received, the decoder transitions out of fast adapting states. In the desired embodiment, once the fast adapting states have been exited, there is no mechanism to return to them, aside from restarting the decoding process. In other embodiments, the state table may be designed to re-enter these fast adapting states by allowing faster adaptation, the present invention allows for the decoder to arrive at the more skewed codes faster, thereby possibly benefiting from improved compression. Note that the fast adaptation can be eliminated for a particular table by changing the table entry for current state 0 such that the table transitions only one state up or down depending on the data input.

For all the tables, the data for each state is the code for that state, the next state on a positive update (up) and the next state on a negative update (down). Asterisks indicate states where the MPS must be changed on a negative update.

TABLE 20

| Current state | Code | Up next state | Down next state | Current state | Code | Up next state | Down next state |
|---|---|---|---|---|---|---|---|
| 0 | r2(0) | 1 | 0* | 18 | r3(3) | 19 | 17 |
| 1 | r2(0) | 2 | 0 | 19 | r2(4) | 20 | 18 |
| 2 | r2(0) | 3 | 1 | 20 | r3(4) | 21 | 19 |
| 3 | r2(0) | 4 | 2 | 21 | r2(5) | 22 | 20 |
| 4 | r2(0) | 5 | 3 | 22 | r3(5) | 23 | 21 |
| 5 | r2(0) | 6 | 4 | 23 | r2(6) | 24 | 22 |
| 6 | r2(1) | 7 | 5 | 24 | r3(6) | 25 | 23 |
| 7 | r2(1) | 8 | 6 | 25 | r2(7) | 26 | 24 |
| 8 | r2(1) | 9 | 7 | 26 | r3(7) | 27 | 25 |
| 9 | r2(1) | 10 | 8 | 27 | r2(8) | 28 | 26 |
| 10 | r2(1) | 11 | 9 | 28 | r3(8) | 29 | 27 |
| 11 | r2(1) | 12 | 10 | 29 | r2(9) | 30 | 28 |
| 12 | r3(1) | 13 | 11 | 30 | r3(9) | 31 | 29 |
| 13 | r3(1) | 14 | 12 | 31 | r2(10) | 32 | 30 |
| 14 | r3(1) | 15 | 13 | 32 | r3(10) | 33 | 31 |
| 15 | r2(2) | 16 | 14 | 33 | r2(11) | 34 | 32 |
| 16 | r3(2) | 17 | 15 | 34 | r3(11) | 34 | 33 |
| 17 | r2(3) | 18 | 16 | | | | |

*Switch to MPS

TABLE 21

| Current State | Code | Up next state | Down next state | Current State | Code | Up next state | Down next state |
|---|---|---|---|---|---|---|---|
| 0 | r2(0) | 35 | 35* | 22 | r3(5) | 23 | 21 |
| 1 | r2(0) | 2 | 1* | 23 | r2(6) | 24 | 22 |
| 2 | r2(0) | 3 | 1 | 24 | r3(6) | 25 | 23 |
| 3 | r2(0) | 4 | 2 | 25 | r2(7) | 26 | 24 |
| 4 | r2(0) | 5 | 3 | 26 | r3(7) | 27 | 25 |
| 5 | r2(0) | 6 | 4 | 27 | r2(8) | 28 | 26 |
| 6 | r2(1) | 7 | 5 | 28 | r3(8) | 29 | 27 |
| 7 | r2(1) | 8 | 6 | 29 | r2(9) | 30 | 28 |
| 8 | r2(1) | 9 | 7 | 30 | r3(9) | 31 | 29 |
| 9 | r2(1) | 10 | 8 | 31 | r2(10) | 32 | 30 |
| 10 | r2(1) | 11 | 9 | 32 | r3(10) | 33 | 31 |
| 11 | r2(1) | 12 | 10 | 33 | r2(11) | 34 | 32 |
| 12 | r3(1) | 13 | 11 | 34 | r3(11) | 34 | 33 |
| 13 | r3(1) | 14 | 12 | 35 | r2(0) | 36 | 1* |
| 14 | r3(1) | 15 | 13 | 36 | r2(1) | 37 | 2 |
| 15 | r2(2) | 16 | 14 | 37 | r2(2) | 38 | 4 |
| 16 | r3(2) | 17 | 15 | 38 | r2(3) | 39 | 6 |
| 17 | r2(3) | 18 | 16 | 39 | r2(4) | 40 | 10 |
| 18 | r3(3) | 19 | 17 | 40 | r2(5) | 41 | 16 |
| 19 | r2(4) | 20 | 18 | 41 | r2(6) | 42 | 19 |
| 20 | r3(4) | 21 | 19 | 42 | r2(7) | 43 | 22 |
| 21 | r2(5) | 22 | 20 | 43 | r2(8) | 28 | 25 |

*Switch to MPS

TABLE 22

| Current State | Code | Up next state | Down next state | Current State | Code | Up next state | Down next state |
|---|---|---|---|---|---|---|---|
| 0 | r2(0) | 35 | 35* | 22 | r2(5) | 23 | 21 |
| 1 | r2(0) | 2 | 1* | 23 | r2(6) | 24 | 22 |
| 2 | r2(0) | 3 | 1 | 24 | r2(6) | 25 | 23 |
| 3 | r2(0) | 4 | 2 | 25 | r2(7) | 26 | 24 |

TABLE 22-continued

| Current State | Code | Up next state | Down next state | Current State | Code | Up next state | Down next state |
|---|---|---|---|---|---|---|---|
| 4 | r2(0) | 5 | 3 | 26 | r2(7) | 27 | 25 |
| 5 | r2(0) | 6 | 4 | 27 | r2(8) | 28 | 26 |
| 6 | r2(1) | 7 | 5 | 28 | r2(8) | 29 | 27 |
| 7 | r2(1) | 8 | 6 | 29 | r2(9) | 30 | 28 |
| 8 | r2(1) | 9 | 7 | 30 | r2(9) | 31 | 29 |
| 9 | r2(1) | 10 | 8 | 31 | r2(10) | 32 | 30 |
| 10 | r2(1) | 11 | 9 | 32 | r2(10) | 33 | 31 |
| 11 | r2(1) | 12 | 10 | 33 | r2(11) | 33 | 32 |
| 12 | r2(1) | 13 | 11 | | | | |
| 13 | r2(2) | 14 | 12 | 35 | r2(0) | 36 | 1* |
| 14 | r2(2) | 15 | 13 | 36 | r2(1) | 37 | 2 |
| 15 | r2(2) | 16 | 14 | 37 | r2(2) | 38 | 4 |
| 16 | r2(2) | 17 | 15 | 38 | r2(3) | 39 | 6 |
| 17 | r2(3) | 18 | 16 | 39 | r2(4) | 40 | 10 |
| 18 | r2(3) | 19 | 17 | 40 | r2(5) | 41 | 16 |
| 19 | r2(4) | 20 | 18 | 41 | r2(6) | 42 | 19 |
| 20 | r2(4) | 21 | 19 | 42 | r2(7) | 43 | 22 |
| 21 | r2(5) | 22 | 20 | 43 | r2(8) | 28 | 25 |

*Switch MPS

TABLE 23

| Current State | Code | Up next state | Down next state | Current State | Code | Up next state | Down next state |
|---|---|---|---|---|---|---|---|
| 0 | r2(0) | 35 | 35* | 22 | r2(5) | 23 | 21 |
| 1 | r2(0) | 2 | 1* | 23 | r2(6) | 24 | 22 |
| 2 | r2(0) | 3 | 1 | 24 | r2(6) | 25 | 23 |
| 3 | r2(0) | 4 | 2 | 25 | r2(7) | 26 | 24 |
| 4 | r2(0) | 5 | 3 | 26 | r2(7) | 27 | 25 |
| 5 | r2(0) | 6 | 4 | 27 | r2(8) | 28 | 26 |
| 6 | r2(1) | 7 | 5 | 28 | r2(8) | 29 | 27 |
| 7 | r2(1) | 8 | 6 | 29 | r2(9) | 30 | 28 |
| 8 | r2(1) | 9 | 7 | 30 | r2(9) | 31 | 29 |
| 9 | r2(1) | 10 | 8 | 31 | r2(10) | 32 | 30 |
| 10 | r2(1) | 11 | 9 | 32 | r2(10) | 33 | 31 |
| 11 | r2(1) | 12 | 10 | 33 | r2(11) | 34 | 32 |
| 12 | r3(1) | 13 | 11 | 34 | r2(11) | 34 | 33 |
| 13 | r3(1) | 14 | 12 | 35 | r2(0) | 36 | 1* |
| 14 | r3(1) | 15 | 13 | 36 | r2(1) | 37 | 2 |
| 15 | r2(2) | 16 | 14 | 37 | r2(2) | 38 | 4 |
| 16 | r3(2) | 17 | 15 | 38 | r2(3) | 39 | 6 |
| 17 | r2(3) | 18 | 16 | 39 | r2(4) | 40 | 10 |
| 18 | r3(3) | 19 | 17 | 40 | r2(5) | 41 | 16 |
| 19 | r2(4) | 20 | 18 | 41 | r2(6) | 42 | 19 |
| 20 | r3(4) | 21 | 19 | 42 | r2(7) | 43 | 22 |
| 21 | r2(5) | 22 | 20 | 43 | r2(8) | 28 | 25 |

*Switch MPS

TABLE 24

| Current State | Code | Up next state | Down next state | Current State | Code | Up next state | Down next state |
|---|---|---|---|---|---|---|---|
| 0 | r2(0) | 35 | 35* | 22 | r3(5) | 23 | 21 |
| 1 | r2(0) | 2 | 1* | 23 | r2(6) | 24 | 22 |
| 2 | r2(0) | 3 | 1 | 24 | r3(6) | 25 | 23 |
| 3 | r2(0) | 4 | 2 | 25 | r2(7) | 26 | 24 |
| 4 | r2(0) | 5 | 3 | 26 | r2(7) | 27 | 25 |
| 5 | r2(0) | 6 | 4 | 27 | r2(7) | 27 | 26 |
| 6 | r2(1) | 7 | 5 | | | | |
| 7 | r2(1) | 8 | 6 | | | | |
| 8 | r2(1) | 9 | 7 | | | | |
| 9 | r2(1) | 10 | 8 | | | | |
| 10 | r2(1) | 11 | 9 | | | | |
| 11 | r2(1) | 12 | 10 | | | | |
| 12 | r3(1) | 13 | 11 | | | | |
| 13 | r3(1) | 14 | 12 | 35 | r2(0) | 36 | 1* |
| 14 | r3(1) | 15 | 13 | 36 | r2(1) | 37 | 2 |
| 15 | r2(2) | 16 | 14 | 37 | r2(2) | 38 | 4 |
| 16 | r3(2) | 17 | 15 | 38 | r2(3) | 39 | 6 |
| 17 | r2(3) | 18 | 16 | 39 | r2(4) | 40 | 10 |
| 18 | r3(3) | 19 | 17 | 40 | r2(5) | 41 | 16 |
| 19 | r2(4) | 20 | 18 | 41 | r2(6) | 42 | 19 |
| 20 | r3(4) | 21 | 19 | 42 | r2(7) | 25 | 22 |
| 21 | r2(5) | 22 | 20 | | | | |

*Switch MPS

TABLE 25

| Current State | Code | Up next state | Down next state | Current State | Code | Up next state | Down next state |
|---|---|---|---|---|---|---|---|
| 0 | r2(0) | 35 | 35 | 22 | r2(5) | 23 | 21 |
| 1 | r2(0) | 2 | 1* | 23 | r2(6) | 24 | 22 |
| 2 | r2(0) | 3 | 1 | 24 | r2(6) | 25 | 23 |
| 3 | r2(0) | 4 | 2 | 25 | r2(7) | 26 | 24 |
| 4 | r2(0) | 5 | 3 | 26 | r2(7) | 27 | 25 |
| 5 | r2(0) | 6 | 4 | 27 | r2(7) | 28 | 26 |
| 6 | r2(1) | 7 | 5 | 28 | r2(7) | 28 | 27 |
| 7 | r2(1) | 8 | 6 | | | | |
| 8 | r2(1) | 9 | 7 | | | | |
| 9 | r2(1) | 10 | 8 | | | | |
| 10 | r2(1) | 11 | 9 | | | | |
| 11 | r2(1) | 12 | 10 | | | | |
| 12 | r2(1) | 13 | 11 | | | | |
| 13 | r2(2) | 14 | 12 | 35 | r2(0) | 36 | 1* |
| 14 | r2(2) | 15 | 13 | 36 | r2(1) | 37 | 2 |
| 15 | r2(2) | 16 | 14 | 37 | r2(2) | 38 | 4 |
| 16 | r2(2) | 17 | 15 | 38 | r2(3) | 39 | 6 |
| 17 | r2(3) | 18 | 16 | 39 | r2(4) | 40 | 10 |
| 18 | r2(3) | 19 | 17 | 40 | r2(5) | 41 | 16 |
| 19 | r2(4) | 20 | 18 | 41 | r2(6) | 42 | 19 |
| 20 | r2(4) | 21 | 19 | 42 | r2(7) | 25 | 22 |
| 21 | r2(5) | 22 | 20 | 43 | r2(8) | 28 | 25 |

*Switch MPS

Adding a fast adaptation to probability estimation only helps at the start of coding. Other methods can be used to improve adaptation during coding when the statistics of a context bin change more rapidly than the previously described PEM state tables can track.

One method of maintaining fast adaptation throughout coding is to add an acceleration term to the PEM state update. This acceleration could be incorporated into a PEM state table by repeating every code a constant number of times (e.g., 8). Then an acceleration term M (e.g., a positive integer) can be added or subtracted from the current state when updating. When M is 1, the system operates the same as one without acceleration and the slowest adaptation occurs. When M is greater than 1, faster adaptation occurs. Initially, M may be set to some value greater than 1 to provide an initial fast adaptation.

One method of the present invention for updating the value of M is based on the number of consecutive codewords. For instance, if a predetermined number of codewords occurred consecutively, then the value of M is increased. For instance, if four consecutive codewords are "0" "0" "0" "0" or "1N" "1N" "1N" "1N", then the value of M is increased. On the other hand, a pattern of switching between "0" and "1N" codewords may be used to decrease the value of M. For instance, if four consecutive codewords are "0" "1N" "0" "1N" or "1N" "0" "1N" "0" then the value of M is decreased.

Another method of acceleration uses state tables in which each code is repeated S times, where S is a positive integer. S is an inverse acceleration parameter. When S is one, adaptation is fast, and when S is larger, adaptation is slower. The value of S can be initially set to 1 to provide initial fast adaptation. Using a similar method to the one described above, the value of S may be updated when four consecutive codewords are "0" "0" "0" "0" or "1N" "1N" "1N" "1N". In such a case, the value of S is decreased. In contrast, if four consecutive codewords are "0" "1N" "0" "1N" or "1N" "0" "1N" "0", then the value of S is increased.

The definition of consecutive codewords can have several meanings. In a "by context" system, consecutive codewords may refer to consecutive codewords in one context bin. In a "by probability" system, consecutive codewords may refer to consecutive codewords in one probability class. Alternatively, in either system consecutive codewords may refer to consecutive codewords globally (without regard to context bin or probability class). For these three examples, the bits of storage required to maintain a history of codewords is 3×number_of_context_bins, 3×number_of_probability_classes and 3 respectively. Maintaining acceleration for each context bin might provide the best adaptation. Since poor tracking is often due to a global change in the uncoded data, determining acceleration globally might also provide good adaptation.

System Applications

One virtue of any compression system is to reduce storage requirements for a set of data. The parallel system of the present invention may be substituted for any application currently fulfilled by a lossless coding system, and may be applied to systems operating on audio, text, databases, computer executable, or other digital data, signals or symbols. Exemplary lossless coding systems include facsimile compression, database compression, compression of bitmap graphic images, and compression of transform coefficients in image compression standards such as JPEG and MPEG. The present invention allows small efficient hardware implementation and relatively fast software implementations making it a good choice even for applications that do not require high speed.

The real virtue that the present invention has over the prior art is the possibility of operation at very high speeds, especially for decoding. In this manner, the present invention can make full use of expensive high speed channels, such as high speed computer networks, satellite and terrestrial broadcast channels. FIG. 28 illustrates such a system, wherein broadcast data or a high speed computer network supplies data to decoding system 2801 which decodes the data in parallel to produce output data. Current hardware entropy (such as the Q-Coder) would slow the throughput of these systems. All of these systems are designed, at great cost, to have high bandwidth. It is counter productive to have a decoder slow the throughput. The parallel system of the present invention not only accommodates these high bandwidths, it actually increases the effective bandwidth because the data can be transmitted in a compressed form.

The parallel system of the present invention is also applicable to obtaining more effective bandwidth out of moderately fast channels like ISDN, CD-ROM, and SCSI. Such a bandwidth matching system is shown in FIG. 29, whereas data from sources, such as a CD-ROM, Ethernet, Small Computer Standard Interface (SCSI), or other similar source, is coupled to decoding system 2901, which receives and decodes to the data to produce an output. These channels are still faster than some current coders. Often these channels are used to service a data source that requires more bandwidth than the channel has, such as real-time video or computer based multimedia. The system of the present invention can perform the role of bandwidth matching.

The system of the present invention is an excellent choice for an entropy coder part of a real-time video system like the High Definition Television (HDTV) and the MPEG video standards. Such a system is shown in FIG. 30. Referring to FIG. 30, the real-time video system includes decoding system 3001 which is coupled to compressed image data. System 3001 decodes the data and outputs it to Iossy decoder 3002. Lossy decoder 3002 could be the transform, color conversion and subsampling portion of an HDTV or MPEG decoder. Monitor 3003 may be a television or video monitor.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

Thus, a method and apparatus for parallel decoding and encoding of data has been described.

-44-

An Altera AHDL Sample Design

One embodiment of the encoder bit generator of the present invention comprises a FPGA. The design handles all R2 and R3 codes up to R2(12). The AHDL (Altera Hardware description language) source code is listed below.

The design comprises multiple parts, as shown in Figure 13. First, "ENCBG" 1301 is the main part of the design which has the logic to handle the start, end and continuation of runs. Second, "KEXPAND" 1302 is used to expand the probability class into the maximum run length, a variable length mask, and the length of the first long codeword for R3 codes. "KEXPAND" 1303 is identical to the decoder function with the same name. Third, the "LPSCW" 1304 part takes a count value and information about the probability class as inputs and generates the proper "1N" codeword.

The design uses two pipeline stages. During the first pipeline stage, the count is incremented, the probability class is expanded, and a subtraction and comparison for long R3 codewords is performed. All of the other operations are performed during the second pipeline stage.

*encbg.tdf*

```
TITLE "Bit Generator for the encoder";

INCLUDE "kexpand.inc";
INCLUDE "lpscw.inc";

SUBDESIGN encbg
(
        k[3..0],
        r3,
        bit,
        count_in[12..0],
        clk
```

-45-

```
                                    : INPUT;
            start_run,
            end_run,
            index[4..0],
5           count_out[12..0],
            codeword[12..0]
                                    : OUTPUT;

)
10  VARIABLE
            k_q[3..0],
            r3_q,
            k_qq[3..0],
            r3qq,
15          bit_q,
            bit_q,
            count_in_q[12..0],
            start_run,
            end_run,
20          start_run_q,
            index[4..0],
            count_out[12..0],
            count_plus[12..0],
            max_rl[12..0],
25          codeword[12..0]
                                    : DFF;
            kexpand_                : kexpand;
            lpscw_                  : lpscw;

30  BEGIN
            lpscw_.clk          = clk;
            k_q[].clk           = clk;
            r3_q.clk            = clk;
            k_qq[].clk          = clk;
35          r3_qq.clk           = clk;
            bit_q.clk           = clk;
            bit_qq.clk          = clk;
            count_in_q[].clk    = clk;
            start_run.clk       = clk;
40          end_run.clk         = clk;
            start_run_q.clk     = clk;
            index[].clk         = clk;
            count_out[].clk     = clk;
            count_plus[].clk    = clk;
45          max_rl[].clk        = clk;
            codeword[].clk      = clk;
```

```
        k_q[]              = k[];
        r3_q               = r3;
        k_qq[]             = k_q[]
        r3_qq              = r3_q;
5       bit_q              = bit;
        bit_qq             = bit_q;
        count_in_q[]       = count_in[];
        count_plus[]       = count_in_q[] + 1;
        start_run          = start_run_q;
10
        stat_run_q         = (count_in_q[] == 0);
        index[0]           = r3_qq;
        index[4..1]        = k_qq[];

15      kexpand_.k_reg[]   = k_q[];
        kexpand_.r3_reg    = r3_q;
        lpscw_.r3          = r3_q;
        lpscw_.k_q[]       = k_q[] ;
        lpscw_.r3_q        = r3_qq;
20      lpscw_.count[]     = count_in_q[];
        lpscw_.mask[]      = kexpand_.mask[] ;
        lpscw_.r3_split[]  = kexpand_.r3split[] ;
        lpscw_.maxrl_q[]   = max_rl[] ;
        max_rl[]           = kexpand_.maxrl[] ;
25
    IF  (bit_qq) THEN                              % LPS %
        end_run            = VCC;
        count_out[]        = 0;
        codeword[]         = lpscw_.cw[];
30
    ELSIF (count_plus[]    == max_rl[]) THEN
        end_run            = VCC;
        count_out[]        = 0;
        codeword[]         = 0;
35  ELSE
        end_run            = GND;
        count_out[]        = count_plus[];
        codeword[]         = 0;
    END IF;
40  END;

lpscw.tdf
45
    SUBDESIGN lpscw
    (
```

```
            r3,
            k_q[3..0],
            r3_q,
            count[12..0],
 5          mask[11..0],
            r3_split[10..0],
            maxrl_q[12..0],
            clk
                              : input;
10          cw[12..0]
                              : output;
    )
    VARIABLE
            temp[12..0]       : NODE;
15          temp_rev[12..0]   : NODE;
            temp_sh[12..0]    : NODE;
            split[11..0]      : NODE;
            r3_long           : DFF;
            count_minus[11..0] : DFF;
20          mask_q[11..0]     : DFF;
            count_q[12..0]    : DFF;
    BEGIN
            r3_long.clk       = clk;
            count_minus[].clk = clk;
25          mask_q[].clk      = clk;
            count_q[].clk     = clk;
            split[10..0]      = r3_split[];
            split[11]         = GND;
            r3_long = (r3) AND (count[11..0] .= split[]);
30          count_minus[]     = count[11..0] - split[];
            mask_q[]          = mask[] ;
            count_q[]         = count[] ;

% ----------- pipeline stage ----------- %
35
            IF (r3_long) THEN
                    temp[11..0] = (count_minus[]) XOR mask_q[];
            ELSE
                    temp[11..0] = count_q[11..0] XOR mask_q[] ;
40          END IF;
            temp[12] = GND;

temp_rev[0] = temp[12] ;
            temp_rev[1] = temp[11] ;
45          temp_rev[2] = temp[10] ;
            temp_rev[3] = temp[9] ;
            temp_rev[4] = temp [8] ;
```

```
            temp_rev[5] = temp[7] ;
            temp_rev[6] = temp[6] ;
            temp_rev[7] = temp[5] ;
            temp_rev[8] = temp[4] ;
            temp_rev[9] = temp[3] ;
            temp_rev[10] = temp[2] ;
            temp_rev[11] = temp[1] ;
            temp_rev[12] = temp [0] ;

CASE k_q[] IS
                WHEN 0  =>    temp_sh[] = 0;
                WHEN 1  =>    temp_sh[0] = temp_rev[12] ;
                              temp_sh[12..1] = 0;
                WHEN 2  =>    temp_sh[1..0] = temp_rev[12..11] ;
                              temp_sh[12..2] = 0;
                WHEN 3  =>    temp_sh[2..0] = temp_rev[12..10] ;
                              temp_sh[12..3] = 0;
                WHEN 4  =>    temp_sh[3..0] = temp_rev[12..9] ;
                              temp_sh[12..4] = 0;
                WHEN 5  =>    temp_sh[4..0] = temp_rev[12..8] ;
                              temp_sh[12..5] = 0;
                WHEN 6  =>    temp_sh[5..0] = temp_rev[12..7] ;
                              temp_sh[12..6] = 0;
                WHEN 7  =>    temp_sh[6..0] = temp_rev[12..6] ;
                              temp_sh[12..77] = 0;
                WHEN 8  =>    temp_sh[7..0] = temp_rev[12..5] ;
                              temp_sh[12..8] = 0;
                WHEN 9  =>    temp_sh[8..0] = temp_rev[12..4] ;
                              temp_sh[12..9] = 0;
                WHEN 10 =>    temp_sh[12..10] = 0;
                              temp_sh[12..10] = 0;
                WHEN 11 =>    temp_sh[10..0] = temp_rev[12..2] ;
                              temp_sh[12..11] = 0;
                WHEN 12 =>    temp_sh[11..0] = temp_rev[12..1} ;
                              temp_sh[12] = GND;
        END CASE;

IF  (NOT r3_q) THEN                        % R2 %
                cw[] = temp_sh[] OR maxrl_q[] ;
        ELSIF (NOT r3_long) THEN       % R3 SHORT %
                cw[11..0] = temp_sh[12..1] OR maxrl_q[11..0] ;
                cw[12]         = GND;
        ELSE                                       % R3 LONG %
                cw[12..1] = temp_sh[12..1] OR
                            (maxrl_q[11..0] AND NOT mask_q[11..0]) ;
```

```
                cw[0] = temp_sh[0] ;
        END IF;
END;

kexpand.tdf

TITLE "decoder, k expand logic" ;

SUBDESIGN kexpand
(
        k_reg[3..0] ,
        r3_reg                          : input;
        maxrl[12..0] ,
        mask[11..0] ,
        r3split[10..0]                  : output;
)
        BEGIN
        TABLE
                k_reg[],r3_reg  => maxrl[],   mask[], r3split[] ;

0,      0       =>  1,          0,    X;
                1,      0       =>  2,          1,    X;
                1,      1       =>  3,          1,    1;
                2,      0       =>  4,          3,    X;
                2,      1       =>  6,          3,    2;
                3,      0       =>  8,          7,    X;
                3,      1       =>  12,         7,    4;
                4,      0       =>  16,         15,   X;
                4,      1       =>  24,         15,   8;
                5,      0       =>  32,         31,   X;
                5,      1       =>  48,         31,   16;
                6,      0       =>  64,         63,   X;
                6,      1       =>  96,         63,   32;
                7,      0       =>  128,        127,  X;
                7,      1       =>  192,        127,  64;
                8,      0       =>  256,        255,  X;
                8,      1       =>  384,        255,  128;
                9,      0       =>  512,        511,  X;
                9,      1       =>  768,        511,  256;
                10,     0       =>  1024,       1023, X;
                10,     1       =>  1536,       1023, 512;
                11,     0       =>  2048,       2047, X;
```

```
        11,  1    = > 3072,      2047, 1024;
        12,  0    = > 4096,      4095, X;
    END TABLE;

END;
```

The Reorder Unit of the Present Invention

Figure 8 is a block diagram of one embodiment of the reorder unit. Referring to Figure 8, reorder unit 606 comprises a run count reorder unit 801 and a bit packing unit 802. Run count reorder unit 801 moves codewords from the end of runs as created by the encoder to the beginning of runs as needed by the decoder, while bit packing unit 802 combines variable length codewords into fixed length interleaved words and outputs them in the proper order required by the decoder.

A "snooper" decoder can be used to reorder for any decoder, in which a decoder is included in the encoder and provides requests for data in an order in which the codewords will be needed by the real decoder. To support a snooper decoder, reordering of run counts might have to be done independently for each stream. For decoders that can be modeled easily, multiple time stamped queues or a single merged queue may be used to allow reordering. In one embodiment, reordering each codeword can be accomplished using a queue-like data structure and is independent of the use of multiple coded data streams. A description of how the reordering may be performed is given below.

The first reordering operation that is performed in the encoder is to reorder each of the run counts so that the run count is specified at the beginning of the run (as the decoder requires for decoding). This reordering

We claim:

1. A method for encoding a data stream comprising the steps of:
    generating codeword information representative of the data stream in response to the data stream, wherein the codeword information comprises a plurality of codewords, and further wherein multiple codewords are generated from data of the data stream being processed in parallel;
    generating coded data in response to the codeword information, wherein the step of generating coded data comprises outputting each of said plurality of codewords in the codeword information as fixed length data structures ordered in an order based on data at the beginning of each if the fixed length data structures.

2. The method defined in claim 1 wherein each of the plurality of codewords are output at the beginning of each run.

3. The method defined in claim 1 wherein the step of generating coded data further comprises combining variable length codewords into fixed length data structures.

4. The method defined in claim 3 wherein each of the fixed length data structures comprises an interleaved word.

5. The method defined in claim 1 further comprising outputting coded data such that codewords are ordered in a decoding order.

6. The method defined in claim 1 further comprising the step of ordering codewords.

7. The method defined in claim 1 wherein the step of generating codeword information comprises the steps of:
    generating a probability state of a codeword;
    selecting a bit generation code based on the probability state; and
    accessing memory to obtain a run count associated with the bit generation code.

8. The encoding system defined in claim 7 wherein the reorder unit stores the codewords in such a manner as to indicate codeword size.

9. The encoding system defined in claim 8 wherein 1N codewords are reordered such that the the most significant "1" bit indicates the length of each codeword.

10. An encoding system for encoding a data stream, said encoding system comprising:
    an encoder coupled to receive the data stream for generating codeword information including codewords, and further wherein multiple codewords are generated by the encoder from data being processed in parallel; and
    a reorder unit coupled to the encoder to generate coded data as a code stream in response to the codeword information, wherein the reorder unit reorders codewords generated by the encoder in a decoder order based on data at the beginning of a portion of the data stream represented by each codeword.

11. The encoding system defined in claim 10 wherein the reorder unit comprises:
    at least one run count reorder unit to generate each of said plurality of codewords in the codeword information at the beginning of each run; and
    at least one bit pack unit to combine variable length codewords into fixed length data structures.

12. The encoding system defined in claim 11 wherein each of the fixed length data structures comprises an interleaved word.

13. The encoding system defined in claim 11 wherein said at least one bit pack unit orders interleaved words to generate the coded data stream as interleaved streams ordered according to a Nth previous codeword in each interleaved word of each stream.

14. The encoding system defined in claim 11 wherein the reorder unit comprises a snooper decoder for selecting interleaved words output into the code stream.

15. The encoding system defined in claim 14 wherein the reorder unit comprises a plurality of run count reorder units coupled to a plurality of bit pack units, wherein each of the plurality of bit pack units generates interleaved words and the snooper decoder selects an interleaved word from the plurality of interleaved words as an output into the code stream.

16. The encoding system defined in claim 11 wherein a single queue supplies codewords to a plurality of bit pack units, and wherein the plurality of bit pack units generate interleaved words for output as part of the code stream.

17. The encoding system defined in claim 16 wherein the single queue includes a single run count reorder unit, and wherein logic determines the next interleaved word for output as part of the code stream.

18. The encoding system defined in claim 11 wherein a single queue supplies codewords to a single bit pack unit.

19. The encoding system defined in claim 10 further comprising a memory coupled to the reorder unit to store codewords in an order.

20. The encoding system defined in claim 10 wherein the encoder comprises:
    a context model;
    a probability estimation machine coupled to the context model; and
    a bit generator structure coupled to the probability estimation machine to generate codewords in response to the data stream.

21. The encoding system defined in claim 20 wherein the encoder further comprises a memory storing a plurality of run counts, and wherein the memory is accessed using a probability class from the probability estimation machine to provide one of the plurality of run counts to the bit generator for output as part of the codeword information.

22. The encoding system defined in claim 20 wherein the bit generator structure comprises:
    a bit generator to provide codeword information in response to an index and an MPS/LPS indication; and
    a memory coupled to the bit generator for providing a run count to the bit generator, wherein the bit generator reads the memory based on the index and performs bit generation based on data obtained from reading the memory.

23. The encoding system defined in claim 22 wherein the codeword information comprises a first signal indicating whether the MPS/LPS indication comprises the start of a run, a second signal indicating whether the MPS/LPS indication comprises the end of a run, and a codeword output.

24. The encoding system defined in claim 22 wherein a bit generator state of the bit generator is updated after performing bit generation, and further wherein the bit generator is reused prior to completion of updating the bit generation state being written to the memory.

25. The encoding system defined in claim 24 wherein the bit generator is reused during the modify stage of a read-modify-write cycle.

26. The encoding system defined in claim 22 wherein the bit generator generates a non-minimal length run count when reused prior to writing an updated state to the memory.

27. The system defined in claim 26 wherein at least one of the plurality of decoders performs variable length shifting based on decoded data that is available after a delay.

28. The encoding system defined in claim 22 wherein the bit generator codes data using R-codes defined such that each run length is followed by at least one uncoded bit, thereby preventing two codewords of the same run length from being decoded in a row.

29. The encoding system defined in claim 10 wherein the codeword information includes a time stamp and wherein the reorder unit further comprises logic to output interleaved words based on associated time stamps.

30. The encoding system defined in claim 29 wherein the reorder unit comprises a plurality of run count reorder units coupled to a plurality of bit pack units, and further wherein the logic causes interleaved words to be output based on the associated time stamps.

31. The encoding system defined in claim 30 wherein interleaved words are output based on the oldest time stamp.

32. An encoding system for use in a compression system, said encoding comprising:
   an encoder for producing codeword information in response to data;
   a reorder unit coupled to the coder, wherein the reorder unit generates a coded data stream in response to the codeword information, wherein the reorder unit comprises a run count reorder unit for reordering run counts by placing each codeword at the beginning of a run and a bit pack unit coupled to receive codewords from the run count reorder unit to combine variable length codewords into a plurality of fixed length interleaved words and to output the plurality of fixed length interleaved words in an order required by a decoder.

33. The encoding system defined in claim 32 wherein the reorder unit further comprises a memory to store codewords during reordering.

34. The encoding system defined in claim 32 wherein the encoder further comprises a context model, a probability estimation mechanism coupled to the context model and a bit stream generator coupled to the probability estimation mechanism.

35. The encoding system defined in claim 34 wherein the run count reorder unit further comprises:
   a first memory to store codewords;
   a first indicator and a second indicator for addressing the first memory as a queue, wherein the first indicator points to a first entry designated as an output of the first memory and the second indicator points to a second entry designated as a next available and unassigned storage location in the first memory.

36. The encoding system defined in claim 35 further comprising a pointer memory for storing address information corresponding to locations in the first memory currently designated for storage of codewords for each index.

37. The encoding system defined in claim 36 wherein each index indicates a probability class.

38. The encoding system defined in claim 36 wherein each index indicates at least one context.

39. The encoding system defined in claim 32 wherein the reorder unit further comprises a codeword memory queue for storing codewords, a head pointer coupled to the codeword memory queue to indicate at least one memory location of at least one codeword for output from the codeword memory queue, and a tail pointer to indicate at least memory location for inserting codewords into the codeword memory queue.

40. The encoding system defined in claim 39 wherein each codeword entry in the codeword memory queue includes a validity indication, and further wherein a codeword is output from the codeword memory queue when the head pointer specifies the address of the codeword and the validity indication for the codeword indicates its validity.

41. The encoder defined in claim 32 wherein the bit pack unit comprises bit packing logic to receive codewords from the reorder unit and merge codewords into interleaved words for a plurality of streams.

42. The encoder defined in claim 41 wherein the bit packing logic further comprises a plurality of accumulators and a plurality of registers, wherein each of the plurality of registers is associated with one of the plurality of accumulators and one of the plurality of streams, each register for storing an interleaved word for its associated stream and each accumulator indicating the next location in the associated register for storing a current codeword for the stream, such that each codeword for one of the plurality of streams is appended to the contents of the register associated with said one of the plurality of streams based on the value in the associated accumulator.

43. The encoding system defined in claim 42 further comprising a shifter coupled to the plurality of accumulators for shifting codewords in response to at least one signal from the plurality of accumulators, wherein codewords are shifted for appending to contents in one of the plurality of registers based on an accumulator value to pack portions of at least two codewords into each interleaved word.

44. The encoding system defined in claim 41 further comprising a reorder memory for storing interleaved words in an order designated by the decoder.

45. The encoding system defined in claim 44 further comprising a plurality of pointers corresponding to a plurality of interleaved data streams, wherein each of the plurality of pointers designates a location in the reorder memory for the next interleaved word for each of the plurality of streams.

46. The encoding system defined in claim 32 further comprising:
   a plurality of run count reorder units, wherein each of the run count reorder units is associated with one of the coded data streams,
   a plurality of bit pack units, when each of plurality of bit pack units is coupled to an individual one of the plurality of run count reorder units and generates interleaved words for each coded data stream; and
   a decoder for selecting the interleaved words from the plurality of bit pack units as encoded output.

47. The encoding system defined in claim 32 further comprising:
   a plurality of run count reorder units, wherein each of the run count reorder units is associated with one of the coded data streams and generates a plurality of codewords and a timestamp associated with each of the plurality of codewords;
   a plurality of bit pack units for generating interleaved words for each coded data stream; and
   logic for selecting each of the interleaved words based on timestamps of codewords in each of the interleaved words.

48. The encoding system defined in claim 47 wherein the logic selects an interleaved word containing a codeword having the oldest timestamp from among a plurality of interleaved words for each output of the encoder.

49. The encoding system defined in claim 32 wherein the bit pack unit comprises a plurality of bit packing units coupled to receive codewords from one of a plurality of streams, and further comprising logic to select interleaved words for output from each of the plurality of bit packing units based on the next stream.

50. The encoding system defined in claim 32 wherein the reorder unit further comprises a finite memory.

51. A coding system for processing data comprising:

an index generator for generating indices based on the data; and a state table coupled to provide a probability estimate based on the indices, wherein the state table includes a first plurality of states and a second plurality of states, wherein each of the states corresponds to a code, and further wherein transitions between different codes corresponding to the first plurality of states occurs faster when transitioning between states in the first plurality of states than transitions between different codes corresponding to the second plurality of states when transitioning in the second plurality of states.

52. The coding system defined in claim 51 wherein the first plurality of states are used only for a predetermined number of indices.

53. The coding system defined in claim 52 wherein the first plurality of states includes at least one transition to the second plurality of states, such that the state table transitions to the second plurality of states from the first plurality of states after the predetermined number of indices.

54. The coding system defined in claim 51 wherein the first plurality of states are used only for a predetermined number of indices that initially index the state table.

55. The coding system defined in claim 51 wherein each of the first plurality of states are associated with an R2 code.

56. The coding system defined in claim 51 wherein each of the first plurality of states is associated with a different code.

57. The coding system defined in claim 51 wherein the state table transitions from one of the first plurality of states to one of the second plurality of states in response to a least probable symbol.

58. The coding system defined in claim 51 wherein the state machine increases state in response to a most probable symbol.

59. A coding system for processing data comprising:

an index generator for generating indices based on the data; and a state table coupled to provide a probability estimate based on the indices, wherein the state table includes a plurality of states, wherein each of the states corresponds to a code, and every code in the state table is repeated a predetermined number of times;

wherein transitioning between states of the state table occurs based on an acceleration term that is modifiable, such that transitioning between states occurs at a first rate during a first time period is different than a second rate of transitioning during a second time period.

60. The coding system defined in claim 59 wherein the state table is updated by modifying the PEM state by incrementing or decrementing the acceleration term.

61. The coding system defined in claim 60 wherein no adaptive acceleration occurs when the acceleration term comprises a predetermined number.

62. The coding system defined in claim 60 wherein the acceleration term is updated based on the number of consecutive codewords.

63. The coding system defined in claim 62 wherein consecutive codewords comprises consecutive codewords in a context.

64. The coding system defined in claim 62 wherein consecutive codewords comprises consecutive codewords in a probability class.

65. The coding system defined in claim 60 wherein the acceleration term is updated based on the number of alternating codewords.

66. An entropy decoder for decoding a data stream of a plurality of codewords comprising:

a plurality of bit stream generators for receiving the data stream; and a state table coupled to the plurality of bit stream generators to provide a probability estimate to the plurality of bit stream generators, wherein the plurality of bit stream generators generates a decoded result for each codeword in the data stream in response to the probability estimate using a Rn(k) code for multiple values of n, and further wherein the state table includes a first plurality of states and a second plurality of states, wherein transitions between different codes in the first plurality of states occurs faster than transitions between codes in the second plurality of states.

67. The entropy decoder defined in claim 66 wherein the first plurality of states each contain an R2(k) code.

68. The entropy decoder defined in claim 66 wherein the first plurality of states am only used during initialization.

69. The coding system defined in claim 66 wherein every code in the state table is repeated a constant number of times.

70. The coding system defined in claim 69 wherein the state table is updated by modifying the PEM state by an acceleration term.

71. The coding system defined in claim 70 wherein no adaptive acceleration occurs when the acceleration term comprises a predetermined number.

72. The coding system defined in claim 70 wherein the acceleration term is updated based on the number of consecutive codewords.

73. The coding system defined in claim 70 wherein the acceleration term is updated based on the number of alternating codewords.

74. An entropy decoder for decoding a data stream of a plurality of codewords comprising:

a plurality of bit stream generators for receiving data from the data stream; and a state table coupled to provide probability estimates based on the indices, wherein the state table includes a plurality of states, wherein each of the states corresponds to a code, and every code in the state table is repeated a predetermined number of times;

wherein transitioning between states of the state table occurs based on an acceleration term that is modifiable, such that a first rate of transitioning between states during a first time period is different than a second rate of transitioning during a second time period.

75. A decoder for decoding a plurality of interleaved words, said decoder comprising:

a variable length shifter for receiving the data stream and for shifting codewords to output properly aligned coded data, wherein the variable length shifter comprises a plurality of registers;

a run length decoder coupled to the variable length shifter to receive the properly aligned coded data as codewords for determining the codeword type;

a probability estimation machine coupled to the run length decoder to determine the code for the run length decoder, such that the run length decoder generates a run length and an indication of whether the LPS occurred in response to each codeword.

76. The decoder defined in claim 75 wherein a portion of the plurality of registers are coupled to receive data from another of the plurality of registers or from the data stream.

77. The decoder defined in claim 75 wherein the variable length shifter includes a barrel shifter to shift data into the plurality of registers.

78. The decoder defined in claim 75 wherein the variable length shifter comprises a FIFO having a plurality of registers, wherein each of the registers receives data as an input from the interleaved coded data and at least one of the plurality of registers is coupled to receive codewords from another of said plurality of registers.

79. The decoder defined in claim 75 wherein the shifter comprises:

a first plurality of registers coupled to receive codeword data, wherein each of the first plurality of registers is coupled to a distinct one of the plurality of streams;

a multiplexer coupled to receive codeword data from each of the first plurality of registers as an input and output codewords from one of the plurality of streams at a time;

a barrel shifter coupled to the output of the multiplexer to shift codeword data from the multiplexer for output as aligned coded data;

logic coupled to the barrel shifter to indicate a number of bits to shift the codeword; and a FIFO having a plurality of registers coupled to receive codewords from said multiplexer, wherein the FIFO includes a plurality of registers, wherein each of the plurality of registers receives data as an input from the interleaved coded data and at least one of the plurality of registers is coupled to receive codewords from another of said plurality of registers.

80. A decoding system comprising:

a FIFO structure coupled to receive data;

a context model for providing contexts;

a memory coupled to the context model for storing state information and providing state information in response to each context provided by the context model;

a plurality of decoders coupled to receive coded data from the FIFO structure and coupled to the memory for decoding codewords supplied by the FIFO structure using state information from the memory, wherein the plurality of decoders provide run counts may be generated for a plurality of codes.

81. The decoding system defined in claim 80 wherein the FIFO structure supplies coded data to the plurality of decoders independent of context and probability class.

82. The decoding system defined in claim 80 wherein the decoder comprises a run count memory for storing run counts which are assessible based on probability class.

83. The decoding system defined in claim 80 wherein the FIFO structure provides data for two of the plurality of decoders.

84. The decoding system defined in claim 80 wherein the FIFO structure comprises a plurality of outputs, one for each of the plurality of decoders.

85. The decoding system defined in claim 84 wherein the FIFO structure comprises a pair of multiplexers and control logic for selecting the pair of multiplexers to ensure that a codeword is provided to each decoder.

86. The decoding system defined in claim 85 wherein the pair of multiplexers are selected by the control logic based on requests received from one of the plurality of decoders.

87. An encoding system for encoding input data comprising:

an encoding unit coupled to receive the input data to generate coded data in the form of a plurality of streams, wherein coded data is assigned to one of the plurality of streams based on a set of criteria;

a fixed size memory coupled to the encoding unit for storing the plurality of streams of coded data, wherein coded data of greater importance is stored and coded data of less importance is discarded if the fixed size memory is full.

88. The encoding system defined in claim 87 wherein the memory comprises a plurality of storage areas, and coded data stored in each of the plurality of storage areas comprises coded data of a distinct importance level.

89. The encoding system defined in claim 87 wherein the memory comprises a plurality of storage areas, and further wherein coded data of one importance level is stored in at least one of the plurality of storage areas storing coded data of another importance level.

90. The encoding system defined in claim 89 wherein the coded data of said one importance level overwrites coded data of said another importance level in said at least one of the plurality of storage areas.

91. A method for initializing a plurality of contexts in a system while coding data, said method comprising:

specifying an initial PEM state;

obtaining a PEM state of a current context, wherein the step of obtaining comprises the steps of accessing a memory location for the current context to obtain a currently assigned PEM state;

determining whether the memory location is valid by comparing a current context number for the current context to a counter value incremented as each context is accessed, wherein the currently assigned PEM state is determined valid is if the counter value indicates that the memory location has already been initialized;

using the initial PEM state for the current context and ignoring currently assigned PEM state for the current context when PEM data of the accessed memory location is not valid; and using the currently assigned PEM state for the current context if the PEM data is valid.

92. The method defined in claim 91 further comprising the step of writing a new PEM state if the PEM state has changed.

93. A decoder comprising:

a context model to provide context bins;

a memory coupled to the context model to provide probability states based on the context bins;

a logic coupled to the memory to generate probability classes based on the probability states;

a decoder coupled the logic to generate a plurality of enable signals based on the probability classes;

a plurality of bit generators coupled to the decoder and coupled to receive the coded data, wherein each of the plurality of bit generators is dedicated to at least one distinct code and operates in response to a distinct one of the plurality of enable signals, wherein the decoder enables one of the plurality of bit generators based on a current probability class to cause one of the plurality of bit stream generators to decode coded data associated with the current probability class.

94. The decoder defined in claim 93 wherein at least one of the plurality of bit generators decodes data using an R-code and at least one of the plurality of bit generators decodes data using a non-R-code.

95. The decoder defined in claim 93 wherein at least one of the plurality of bit generators handles short run lengths and operates as an R-code decoder.

96. The decoder defined in claim 93 wherein at least one of the plurality of bit generators handles long run lengths and comprises a short run unit and a long run unit, wherein the short run unit handles codes of a first predetermined length and the long run unit handles any remaining bits and determines which, if any, of the remaining bits are to be output.

97. A method for decoding comprising the steps of:
providing a context bin;
accessing a memory using the context bin to obtain a probability state;
generating a probability class based on the probability state;
enabling one of a plurality of bit generators, wherein each of the plurality of bit generators is dedicated to at least one distinct code, such that only said at least one distinct code is used for decoding; and
said one of the plurality of bit stream generators decoding coded data.

98. An encoder system comprising:
a context model to provide context bins
a memory coupled to the context model to provide probability states based on the context bins;
a logic coupled to the memory to generate probability classes based on the probability states;
an encoder coupled the logic to generate a plurality of enable signals based on the probability class;
a plurality of bit generators coupled to the encoder and coupled to receive the input data, wherein each of the plurality of bit generators is dedicated to at least one distinct code, wherein the encoder enables one of the plurality of bit generators based on a current probability class, such that said one of the plurality of bit stream generators encodes input data associated with the current probability class.

99. The encoder defined in claim 98 wherein at least one of the plurality of bit generators encodes data using an R-code and at least one of the plurality of bit generators encodes data using a non-R-code.

100. The encoder defined in claim 98 wherein at least one of the plurality of bit generators handles short run lengths and operates as an R-code encoder.

101. The decoder defined in claim 98 wherein at least one of the plurality of bit generators handles long run lengths and comprises a short run unit and a long run unit, wherein the short run unit handles codes of a first predetermined length and the long run unit handles any remaining bits and determines which, if any, of the remaining bits are to be output.

102. A method for encoding comprising the steps of:
providing a context bin;
accessing a memory using the context bin to obtain a probability state;
generating a probability class based on the probability state;
enabling one of a plurality of bit generators that are dedicated to at least one distinct code, such that only said one distinct code is used for encoding; and
said one of the plurality of bit stream generators encoding the input data.

103. A method for decoding coded data comprising a plurality of codewords, said method comprising the steps of:
loading a count value into a counter associated with each run counter, wherein the count value corresponds to the size of a codeword memory used during encoding when a new run is started, said count value being loaded when a new codeword for said each run counter is fetched;
decrementing the count value each time any codeword is fetched; and
clearing a bit generator state associated with said new codeword when the counter decrements to zero.

104. The method defined in claim 103 wherein each run counter is associated with a PEM state.

105. The method defined in claim 103 wherein each run counter is associated with a context bin.

106. A method for decoding coded data comprising a plurality of codewords, said method comprising the steps of:
incrementing a counter value each time a codeword is requested, wherein the counter value comprises a current time indication;
storing the counter value as a stored time indication when a codeword is started;
comparing the stored time indication plus the size of an encoder memory to the current time indication; and
clearing a bit generator state for the first codeword and requesting a new codeword when the current time indication is greater than the stored time indication plus the size of an encoder memory.

107. The method defined in claim 106 wherein the stored time indication comprises a time stamp.

108. The method defined in claim 106 further comprising the step of reusing the stored time indication for a subsequent codeword.

109. A method for decoding coded data comprising a plurality of codewords, said method comprising the steps of:
storing an index corresponding to a codeword, wherein the index is stored in a queue when the codeword is requested;
marking an entry of the index in the queue as invalid;
storing the codeword in the entry and marking the entry as valid if the codeword completes; and
outputting data from the queue comprising the steps of outputting data from the queue entry and indicating the data is invalid to the decoder if the queue entry is marked invalid and the codeword prematurely completes and the decoder clearing bit generator state information in response to receiving data from the queue marked invalid.

110. A decoder for decoding coded data, said decoder comprising:
a context modelling mechanism for providing contexts, wherein the context modelling mechanism comprises a plurality of integrated circuits;
a memory coupled to the context modeling mechanism for storing state information, wherein the memory provides state information in response to each context provided by the context modeling mechanism; and
a plurality of decoders coupled the memory for decoding codewords using the state information from the memory, wherein the plurality of decoders decode codewords using a plurality of R-codes, wherein the plurality of R-codes are operable to code at least one non-maximum length run of most probable symbols that is not followed by a least probable symbol.

111. The decoder defined in claim 110 wherein said at least one non-maximum length run counts have a uniquely decodeable prefix.

112. A system for decoding a code stream having a plurality of codewords, said system comprising:

a context modelling mechanism for providing contexts, wherein the context modelling mechanism comprises a plurality of integrated circuits;

a memory coupled to the context modeling mechanism for storing state information, wherein the memory provides state information in response to each context provided by the context modeling mechanism; and a plurality of decoders coupled the memory for decoding codewords using the state information from the memory.

113. The system defined in claim 112 wherein the context modeling mechanism comprises at least one context model providing contexts from one of the plurality of integrated circuits and at least one context model providing contexts from a second of the plurality of integrated circuits.

114. The system defined in claim 113 wherein said at least one context model on said one of the plurality of integrated circuits comprises a zero order context model.

115. The system defined in claim 112 wherein the contexts from the plurality of integrated circuits are provided directly to the memory.

116. The system defined in claim 112 wherein a first portion of a first context is provided by one of the plurality of integrated circuits and a second portion of the first context is provided by a second of the plurality of integrated circuits.

117. A system for decoding a code stream having a plurality of codewords, said system comprising:

a context modelling mechanism for providing contexts;

a memory coupled to the context modeling mechanism for storing state information, wherein the memory provides state information in response to each context provided by the context modeling mechanism; and a plurality of decoders coupled to the memory for decoding codewords using the state information from the memory, wherein at least one of the plurality of decoders comprises a delay tolerant decoder.

118. The system defined in claim 117 wherein each of the plurality of decoders receive variable length data.

119. The system defined in claim 118 wherein the plurality of decoders decode variable length input data in parallel.

120. The system defined in claim 117 wherein output of the plurality of decoders is divided into fixed length interleaved words.

* * * * *